(12) United States Patent
Barraud et al.

(10) Patent No.: US 11,889,704 B2
(45) Date of Patent: Jan. 30, 2024

(54) DEVICE COMPRISING WRAP-GATE TRANSISTORS AND METHOD OF MANUFACTURING SUCH A DEVICE

(71) Applicant: COMMISSARIAT A L'ENERGIE ATOMIQUE ET AUX ENERGIES ALTERNATIVES, Paris (FR)

(72) Inventors: Sylvain Barraud, Grenoble (FR); François Andrieu, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/132,127

(22) Filed: Dec. 23, 2020

(65) Prior Publication Data
US 2021/0296398 A1    Sep. 23, 2021

(30) Foreign Application Priority Data
Dec. 23, 2019  (FR) ..................... 19 15474

(51) Int. Cl.
| H10B 63/00 | (2023.01) |
| H01L 29/06 | (2006.01) |
| H01L 29/423 | (2006.01) |
| H10N 70/20 | (2023.01) |
| H01L 21/02 | (2006.01) |
| H01L 29/66 | (2006.01) |

(Continued)

(52) U.S. Cl.
CPC ....... *H10B 63/30* (2023.02); *H01L 21/02532* (2013.01); *H01L 21/02603* (2013.01); *H01L 29/0673* (2013.01); *H01L 29/42392* (2013.01); *H01L 29/66439* (2013.01); *H01L 29/66545* (2013.01); *H01L 29/66742* (2013.01); *H01L 29/775* (2013.01); *H01L 29/78696* (2013.01); *H10N 70/011* (2023.02); *H10N 70/24* (2023.02)

(58) Field of Classification Search
CPC .......... H01L 29/66545; H01L 29/0665; H01L 29/42392; H01L 29/785; H01L 29/66795; H01L 29/66439; H01L 29/66553; H01L 29/6656; H01L 29/78696; H10B 63/30; H10N 70/24; H10N 70/011
See application file for complete search history.

(56) References Cited

U.S. PATENT DOCUMENTS

| 8,026,521 B1 | 9/2011 | Or-Bach et al. |
| 10,236,217 B1 | 3/2019 | Ando et al. |

(Continued)

OTHER PUBLICATIONS

French Preliminary Search Report dated Sep. 11, 2020 in French Application 19 15474 filed on Dec. 23, 2019 (with English Translation of Categories of Cited Documents & Written Opinion), 10 pages.

*Primary Examiner* — Brian Turner
(74) *Attorney, Agent, or Firm* — Oblon, McClelland, Maier & Neustadt, L.L.P.

(57) ABSTRACT

A device includes gate-all-around transistors and method for manufacturing such a device. A method for manufacturing a microelectronic device includes at least two transistors each comprising a channel in the shape of a wire extending in a first direction x, a gate surrounding said channel, a source and a drain, said transistors being stacked in a third direction z and each occupying a level nz (z=1 ... 4) of given altitude in the third direction z.

7 Claims, 53 Drawing Sheets

(51) Int. Cl.
*H01L 29/775* (2006.01)
*H01L 29/786* (2006.01)
*H10N 70/00* (2023.01)

(56) References Cited

U.S. PATENT DOCUMENTS

| | | |
|---|---|---|
| 2009/0218558 A1 | 9/2009 | Park et al. |
| 2010/0295021 A1 | 11/2010 | Chang et al. |
| 2012/0086067 A1 | 4/2012 | Sekar et al. |
| 2012/0088355 A1 | 4/2012 | Sekar et al. |
| 2012/0138888 A1 | 6/2012 | Chang et al. |
| 2013/0070506 A1 | 3/2013 | Kajigaya |
| 2013/0153851 A1 | 6/2013 | Park |
| 2013/0175490 A1* | 7/2013 | Kusai .................... G11C 16/04 |
| | | 438/514 |
| 2014/0054538 A1* | 2/2014 | Park .................... H10N 70/881 |
| | | 257/5 |
| 2015/0123072 A1 | 5/2015 | Sekar et al. |
| 2017/0053906 A1* | 2/2017 | Or-Bach ........... H01L 27/11575 |
| 2017/0092541 A1 | 3/2017 | Or-Bach et al. |
| 2017/0271402 A1 | 9/2017 | Chen et al. |
| 2018/0151438 A1* | 5/2018 | Chiang ............... H01L 29/4966 |
| 2019/0088553 A1 | 3/2019 | Van Dal et al. |
| 2019/0131184 A1 | 5/2019 | Ando et al. |
| 2019/0148243 A1 | 5/2019 | Van Dal et al. |
| 2019/0165135 A1* | 5/2019 | Cheng ................ H01L 29/66772 |
| 2019/0189769 A1* | 6/2019 | Basker .................. H01L 29/167 |
| 2019/0229021 A1 | 7/2019 | Ando et al. |
| 2019/0326288 A1* | 10/2019 | Hashemi ......... H01L 21/823821 |
| 2020/0127119 A1* | 4/2020 | Lin .................... H01L 29/66545 |
| 2020/0286893 A1* | 9/2020 | Simsek-Ege ...... H01L 21/28568 |

* cited by examiner

DEVICE COMPRISING WRAP-GATE TRANSISTORS AND METHOD OF MANUFACTURING SUCH A DEVICE

TECHNICAL FIELD OF THE INVENTION

The present invention relates to the field of microelectronics. It relates more particularly to the production of devices based on 3D integration transistors. A non-limiting application of the invention relates to non-volatile resistive memories RRAM or ReRAM (for "Resistive random-access memory").

PRIOR ART

The constant increase in the performance of transistors was first enabled by the reduction in the dimensions of the transistors called planar transistors. FIG. 58A shows an example of such a planar transistor conventionally comprising a source 1002, a gate 250 deposited on the surface of a channel (not visible) and a drain 1006.

This planar architecture then gave way to other types of architectures better adapted to the performance specified in technology nodes below 12 nm. The architecture called "finFET" architecture presented in FIG. 58B allows, for example, to meet the performance levels set by the 7 nm technological node. This finFET architecture typically comprises a source 1002, a gate 250 partially encasing the channel (not visible) and a drain 1006. The confinement of the gate is here improved.

For the next technological nodes, in particular from 3 nm, this finFET architecture will have to give way to other architectures providing even improved gate confinement.

An architecture considered to respond to the problems of these next technological nodes is shown in FIG. 58C. This architecture comprises gate-all-around transistors called GAA (acronym for Gate-all-around) transistors stacked on top of each other. The GAA transistors illustrated in FIG. 58C are in the shape of horizontal nanowires, the central parts of which are embedded within a gate 250. These central parts correspond to the channels of the transistors. The nanowires comprise peripheral parts extending on either side of the central parts. These peripheral parts are connected to the sources 1002 and drains 1006 of the GAA transistors. These GAA transistors can be stacked along z and are based for example on a buried oxide or BOX.

To supplant the performance of an architecture based on finFET transistors, such an architecture based on GAA transistors must comprise at least two stacked GAA transistors, or even four transistors stacked on top of each other along z.

To produce such a stack of GAA transistors, a method consists in transferring a first layer of transistors produced on a first wafer, on a second wafer comprising a second layer of transistors. Molecular bonding can then be carried out so as to secure the layers together. Several successive transfer steps can be carried out so as to construct a stack of several GAA transistors. Such a method is nevertheless complex to implement. The management of the thermal budget associated with the bonding of the layers is an important problem with this method.

Another solution allowing to limit the thermal budget of the transistors of the stack consists in transferring, from a first SOI (acronym for Silicon On Insulator) type wafer, an unstructured thin layer onto a second wafer comprising a first layer of transistors. The "Smart Cut"™ reference technology well known to the person skilled in the art then allows to separate the thin layer from the first wafer. This can then be structured so as to form a second layer of transistors while limiting the thermal budget of the transistors of the first layer. This method also requires several complex successive transfer steps to construct a stack of several GAA transistors as illustrated in FIG. 58C.

According to one possibility, these GAA transistors can form integrated memory cell selection transistors according to a 3D architecture. A memory cell typically comprises a switchable memory element 102 associated with a selection transistor 101, as illustrated in FIG. 1. Therefore, the method for manufacturing stacked GAA transistors can be continued so as to form these memory elements. The complexity and cost of this method for manufacturing monolithic 3D architectures are further increasing.

There is therefore a need to provide a method for manufacturing a 3D electronic device based on GAA transistors limiting the complexity and/or the cost of manufacture. The present invention aims at responding at least in part to this need.

In particular, an object of the present invention is a method for manufacturing a 3D architecture of a microelectronic device, reducing the manufacturing cost.

Another object of the invention is a microelectronic device based on GAA transistors.

A particular purpose common to the method and to the device is to densify the GAA transistors.

The other objects, features and advantages of the present invention will become apparent upon examining the following description and the accompanying drawings. It is understood that other advantages can be incorporated.

SUMMARY OF THE INVENTION

To achieve these purposes, the present invention provides according to a first aspect a method for manufacturing a microelectronic device comprising at least two transistors each comprising a channel preferably in the shape of a wire extending in a first direction x, a gate surrounding said channel, a source and a drain, said transistors being stacked in a third direction z and each occupying a level $n_z$ (z=1 . . . 4) of given altitude in the third direction z.

The method comprises the following steps:
Forming on a substrate a stack in the third direction z comprising at least two layers made of a first semiconductor material separated by at least one sacrificial layer made of a second semiconductor material, each layer made of a first semiconductor material corresponding to a given altitude level in the third direction z, Forming from this stack openings defining transistor patterns, the transistor patterns each comprising a central part extending in particular and preferably mainly in the first direction x and first and second peripheral parts extending on either side of the central part, said central part being intended to form the channels of the transistors and said first and second peripheral parts being intended to form respectively the sources and the drains of the transistors, Forming sacrificial gates partly in the openings, straddling the central parts of the transistor patterns and extending mainly in a second direction y normal to the first direction x, Removing, from the openings, the second semiconductor material of the at least one sacrificial layer of the transistor patterns, Filling a first space left by the removal of the at least one sacrificial layer, with a second dielectric material, at the first and second peripheral parts of the transistor patterns, Removing the sacrificial gates, and Filling a second space left by the removal of the at least one sacrificial layer, with a gate material at the central parts of the transistor patterns, so as to form gates called gates-all-around completely surrounding the channels of at least one level $n_z$ among the given altitude levels.

This method allows to produce a stack of GAA (acronym for "Gate-all-around") type transistors, that is to say comprising a gate completely surrounding the channel, on several levels $n_z$. These transistors are electrically insulated from each other.

In the methods of the prior art, the stack of insulated transistors is directly formed by transfer of semiconductor layers onto insulating layers, in alternation. Such a transfer method is expensive and complex.

On the contrary, in the present invention the transistors are not insulated from each other from the start of the method. They are insulated a posteriori, during the removal of the second material carried out for example via selective etching. The method proposed by the present invention allows to considerably reduce the complexity and the cost of producing this type of transistor.

The second material is preferably a semiconductor material. It can advantageously be used as a seed layer for the epitaxy of the first material. Thus, the different layers can be formed by epitaxial growth of the first and second materials, without transfer of layers.

The formation of such a stack of layers of the first and second materials, followed by a removal of the second material and a filling with a dielectric material aiming at replacing the second material, therefore ultimately allows to obtain a stacking of semiconductor and insulating layers at a reduced cost.

The sacrificial gates advantageously allow to maintain the future channels of the transistors when the second material is removed. This prevents collapse of the transistor channels on top of each other.

Such a method is also advantageously compatible with a dense 3D integration.

In the method according to the invention and unlike the known methods, the sources and drains are advantageously formed directly by parts of the stack, before deposition or formation of the sacrificial gates in particular. This allows saving subsequent steps of forming sources and drains, for example steps of epitaxy or solid phase regrowth of sources and drains.

A second aspect of the invention relates to a microelectronic device comprising at least two transistors each comprising a channel in the shape of a wire extending mainly in a first direction x, a gate surrounding said channel, a source and a drain connected or associated with the channel, said transistors being stacked in a third direction z so that the channels of said transistors each occupy a level $n_z$ ($z=1 \ldots 4$) of given altitude in the third direction z.

Advantageously, according to one example for each channel of level $n_z$ of given altitude, the source and the drain connected or associated with said channel are located only at said level $n_z$.

According to one example, the sources of the transistors are separated from each other in the third direction z by at least one spacer, called horizontal spacer, and/or the drains of the transistors are separated from each other in the third direction z by at least one other horizontal spacer.

This allows to insulate the sources and/or the drains between each level $n_z$. This allows for example to independently connect the sources and/or the drains of each level $n_z$.

Another aspect of the invention relates to a plurality of microelectronic devices as described above.

Some features and advantages of the manufacturing method can be applied mutatis mutandis to the microelectronic device, and vice versa.

BRIEF DESCRIPTION OF THE FIGURES

The purposes, objects, as well as the features and advantages of the invention will become more apparent from the detailed description of embodiments of the latter which are illustrated by the following accompanying drawings wherein.

Figure 1:
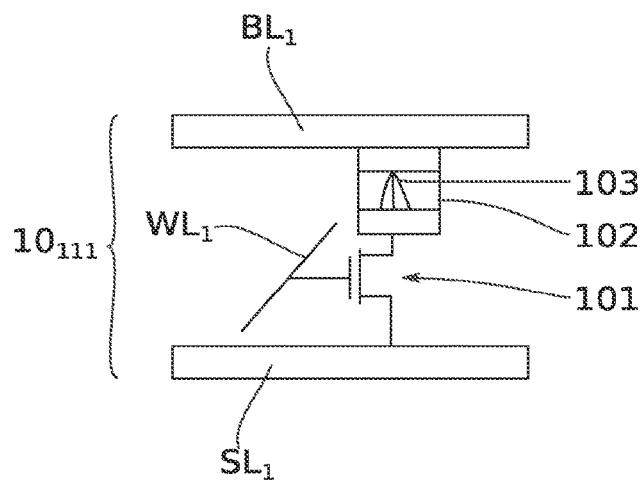
FIG. 1 schematically illustrates an OxRAM type resistive memory cell.

The drawings are given by way of examples and are not limiting of the invention. They constitute schematic principle representations intended to facilitate the understanding of the invention and are not necessarily on the scale of practical applications. In particular, the dimensions of the various structures (layers, patterns) or areas are not representative of reality. Some elements of the microelectronic devices, such as the gate and/or the horizontal spacers, have been removed in some figures, in particular in FIGS. 59A, 59B, 60, 61A, 62A, 63, 64, in order to improve clarity. The person skilled in the art will be able to reintroduce these elements which appear in particular in FIGS. 59C, 61B, 62B.

DETAILED DESCRIPTION OF THE INVENTION

Before starting a detailed review of embodiments of the invention, it is recalled that, optionally, the invention comprises at least any one of the following optional features which can be used in combination or alternatively.

According to one example, the removal of the at least one sacrificial layer comprises:
  a first removal configured to form the first space at the first and second peripheral parts before the removal of the sacrificial gates, and
  a second removal configured to form the second space at the central parts after the removal of the sacrificial gates.

According to one example, for each of the transistors, at least one of the source and the drain extends mainly in the second direction y.

According to one example, the openings are formed so that two adjacent openings define therebetween and in the first semiconductor material a transistor pattern.

According to one example, the sacrificial gates are formed directly at the border of at least one of the first and second peripheral parts.

According to one example, the method further comprises stepped etchings in a source line area, so as to reach the sources of the different levels $n_z$, and a formation of stepped contacts on the sources of the different levels $n_z$.

According to one example, the first semiconductor material is silicon and the second semiconductor material is a silicon-germanium alloy.

According to one example, the substrate is a semiconductor-on-insulator type substrate comprising a thin semiconductor layer.

According to one example, the stack comprises said thin semiconductor layer.

According to one example, said thin semiconductor layer is one of the sacrificial layer and the at least two layers made of a first semiconductor material.

According to one example, each layer of the stack has a thickness comprised between 5 nm and 50 nm, for example of the order of 15 nm.

According to one example, the removal of the at least one sacrificial layer is done by selective etching of the second semiconductor material relative to the first semiconductor material with an etching selectivity between the second semiconductor material and the first semiconductor material greater than or equal to 5:1.

According to one example, each central part of each pattern of transistors comprises a stack of at least X channels, each first peripheral part of each pattern of transistors comprises a stack of at least X sources, and each second peripheral part of each pattern of transistors comprises a stack of at least X drains, with X≥3 and preferably X≥4 and preferably X≥10. Thus, each pattern of transistors is intended to form at least X stacked transistors. It will be recalled that in the context of the present invention, two elements called stacked elements are not necessarily in contact with one another. This is the case with the channels of each central part, which are separated from each other successively by at least one sacrificial layer, a second space, a gate material. This is the case with the sources and the drains of each first and second peripheral part, which are separated from each other successively by at least one sacrificial layer, a first space, a dielectric layer.

According to one example, the gates of the transistors are electrically connected to each other and the sources of the transistors are electrically insulated from each other. Independent sources allow the transistors to be powered independently. This allows for example to execute logical operations on each level independently.

According to one example, the gates of the transistors are electrically connected to one another in a wordline area of a microelectronic system of the RAM (acronym for Random Access Memory) memory type.

According to one example, the sources occupying different levels $n_z$ are connected in a stepped manner, independently of each other, in a source line area of a microelectronic system of the RAM memory type. This allows the transistors and/or memory points to be powered independently on each level of the memory cell array.

According to one example, the method comprises the following steps:
forming on a substrate extending in first and second directions a stack in a third direction comprising at least two layers made of a first semiconductor material separated by at least one sacrificial layer made of a second semiconductor material, each layer made of a first semiconductor material defining a given altitude level in the third direction,
forming transistor patterns by anisotropic etching along the third direction of stacking areas, said patterns comprising at least two transistors stacked in the third direction z, each of these transistors comprising a channel in the shape of a wire extending along the first direction x, a source extending in the second direction y, and a drain,
filling said areas with a sacrificial gate material,
forming sacrificial gates by anisotropic etching in the third direction of only part of said sacrificial gate material, said sacrificial gates straddling over the channels of the transistors,
forming longitudinal spacers on either side of the sacrificial gates, said longitudinal spacers extending mainly in the second direction y and being intended to cover the sources and drains of the transistors in projection in the third direction z in a plane xy,
forming first and second openings on either side of said longitudinal spacers and at the border of the longitudinal spacers in the first direction x, the first openings exposing the transistor drains and the second openings exposing the sources,
partially etching the at least one sacrificial layer selectively relative to the layers made of a first semiconductor material, from said first and second openings,
filling a space left by the partial etching of the at least one sacrificial layer with a dielectric material, so as to insulate the sources from each other and the drains from each other,
removing the sacrificial gates so as to expose the channels of the transistors,
etching at least one sacrificial layer selectively relative to the layers made of a first semiconductor material, from the locations of the removed sacrificial gates, so as to free the channels of the transistors, and
depositing a dielectric gate material then a metal gate material around the channels of the transistors, so as to form gates-all-around the channels of the transistors.

Unless specifically indicated to the contrary, the technical features described in detail for a given embodiment may be combined with the technical features described in the context of other embodiments described by way of example and without limitation. In particular, the number of levels of the stack may be greater than 4, or even greater than 10. The number and/or the shape of the openings in the stack, the transistor patterns illustrated in the figures may vary and be combined so as to form another embodiment which is not necessarily illustrated or described. Such an embodiment is obviously not excluded from the invention.

The preferred field of application of the present invention is the 3D integration of microelectronic systems performing logic and memory functions.

The present invention in particular provides for producing a 3D architecture comprising a high density of nano-wires superimposed on different levels. This 3D architecture is in particular configured to electrically connect each nanowire independently. Each nanowire is preferably surrounded by a gate-all-around so as to obtain a GAA transistor. This gate is preferably bordered by longitudinal spacers. These spacers can cover the sources and the drains of the different transistors. In the examples described below and illustrated by the accompanying figures, in particular in FIGS. 10A, 10B, 13F, 35, 48, 49, 59A, 59C, and 61B, thus it clearly appears that the gate is bordered by longitudinal spacers extending on either side of the gate mainly along y, said longitudinal spacers covering the source and the drain of each transistor. The sources and the drains of the transistors superimposed along z are therefore located under the longitudinal gate spacers. This allows increasing the density of transistors in the 3D architecture.

According to one example, for each channel of level $n_z$ of given altitude, the source and the drain connected to said channel extend only in said level $n_z$.

According to one example, the sources of the transistors are separated from each other in the third direction z by at least one horizontal spacer.

According to one example, the drains of the transistors are separated from each other in the third direction z by at least one horizontal spacer.

According to one example, the at least one horizontal spacer is made of a dielectric material.

According to one example, the sources and/or the drains are at least partly directly in contact with the gate, at least at one side of the gate. This allows to increase the compactness of the device. This allows to densify the integration of devices into a system.

According to one example, the sources and/or the drains of different levels $n_z$ are electrically contacted with each other by at least one common contact extending in the third direction z, at the border of said sources and/or drains.

According to one example, the sources and/or the drains of different levels $n_z$ are electrically contacted independently of each other by stepped contacts.

According to one example, a plurality of microelectronic devices which are adjacent in a direction of a plane normal to the third direction z, form a microelectronic system wherein the sources and/or the drains of a level $n_z$ of given altitude of two adjacent devices are common to said two adjacent devices. This allows to increase the compactness of the system. This allows to densify the integration of devices into the system.

According to one example, a plurality of microelectronic devices which are adjacent along a plane comprising the third direction z, form a microelectronic system wherein the sources and/or the drains of a level $n_z$ of given altitude of two adjacent devices are common to said two adjacent devices. This allows to increase the compactness of the system. This allows to densify the integration of devices into the system.

According to one example, the sources and/or the drains of a level $n_z$ of given altitude are separated from the sources and/or drains of a level $n_{z-1}$ and/or a level $n_{z+1}$ by at least one horizontal spacer.

According to one example, the sources and/or the drains of a level $n_z$ of given altitude extend mainly in a second direction y normal to the first and third directions x, z, and are electrically contacted to the sources and/or to the drains of another level $n_z$ by a common contact located at one end along said second direction y.

Unless incompatible, it is understood that the microelectronic device, the manufacturing method, and the system can comprise, mutatis mutandis, all of the optional features above.

It is specified that in the context of the present invention, the term "on", "surmounts", "covers" or "underlying" or their equivalents do not mean "in contact with". Thus, for example, the presence of a spacer or of a layer on or which covers a structural element, does not necessarily mean that the spacer or that the layer are directly in contact with the structural element, but it means that the spacer or that the layer at least partially covers the structural element by being either directly in contact therewith, or by being separated therefrom by at least one other layer, channel, or any other element. Likewise, two stacked elements are located at least partially in line with each other without necessarily being in contact with each other.

A structural element, a layer "based" on a material A, means a structural element, a layer comprising this material A only or this material A and possibly other materials, for example doping elements or alloy elements. Thus, a spacer based on silicon nitride SiN can for example comprise non-stoichiometric silicon nitride (SiN), or stoichiometric silicon nitride (Si3N4), or else a silicon oxy-nitride (SiON).

The word "dielectric" describes a material whose electrical conductivity is low enough in the given application to be used as an insulator. In the present invention, a dielectric material preferably has a dielectric constant of less than 7.

The term "step" does not necessarily mean that the actions carried out during a step are simultaneous or immediately successive. In particular, some actions of a first step can be followed by actions linked to a different step, and other actions of the first step can be repeated later. Thus, the term step does not necessarily mean actions which are unitary and inseparable over time and in the sequence of phases of the method.

The term "transistor pattern" refers to the element from which the stacked transistors are formed. The structure of this element is intended in particular to change during the steps of the method. Thus, the transistor patterns comprise the layers made of a first semiconductor material and may comprise sacrificial layers and/or dielectric layers, which are continuous or discontinuous.

In the present patent application, preferably a thickness for a layer, a height for a device (transistor or gate for example) and depth for a cavity or an etching will be considered. The thickness is taken in a direction normal to the main plane of extension of the layer, the height and depth are taken in a direction normal to the base plane of the substrate.

Unless otherwise indicated, in the figures, the height and depth are taken along the axis z of the orthonormal coordinate system xyz.

An element located in line with or in vertical alignment with another element means that these two elements are both located on the same line normal to the base plane of the substrate, that is to say on the same line oriented vertically along z on the figures.

An element "bordering" another element means that this element partially or totally surrounds the other element. Unless explicitly stated, this term is understood to mean partial overlapping.

The terms "substantially", "approximately", "of" the order of mean "within 10%" or, when it is an angular orientation, "within 10°" and preferably "Within 5°". Thus, a direction substantially normal to a plane means a direction having an angle of 90±10° relative to the plane.

To determine the geometry and the arrangement of the various elements constituting a device (such as a transistor or a memory cell) or of a microelectronic system (such as an OxRAM type resistive memory), electron microscopy analyses can be carried out, in particular Scanning Electron Microscopy (SEM) or Transmission Electron Microscopy (TEM).

The chemical compositions of the various elements or layers can be determined using the well-known EDX or X-EDS method, acronym for "energy dispersive x-ray spectroscopy" which stands for "energy dispersive analysis of X photons".

This method is well adapted for analysing the composition of layers or elements of small dimensions. It can be implemented on metallurgical sections within a SEM or a TEM.

These techniques allow to follow the various steps implemented by a method for manufacturing transistors or memory cells in 3D integration, for example through analyses on samples from devices during manufacture. The use of sacrificial layers and sacrificial gates can in particular be an indication of the implementation of the method according to the invention.

The present invention allows to manufacture a microelectronic device comprising at least two superimposed GAA type transistors. These superimposed transistors can thus be integrated into logic systems having 3D architectures. These transistors can in particular be associated with other structural or functional elements in order to design complex systems.

The following description presents a non-limiting example of the implementation of the invention in the context of the development of a complex 3D system. The scope of this description is obviously not limiting of the invention. More specifically, the present invention is not limited to the methods for producing microelectronic devices including memory cells.

All the features, steps and technical effects mentioned in the detailed description with reference to a memory device are applicable and combinable with an embodiment of a microelectronic device not comprising or forming a memory cell.

The proposed method allows to manufacture in a simple, reproducible and inexpensive manner a microelectronic device comprising at least two transistors and preferably at least four transistors. Each transistor comprises a channel in the shape of a wire extending in a first direction x, a gate surrounding said channel, a source and a drain. The transistors are stacked in a third direction z and each occupy a level $n_z$ (z=1 . . . 4) of given altitude in the third direction z.

For this purpose, the proposed method can provide for the following steps which are briefly mentioned below and which will be described in detail in the remainder of the description:

Forming on a substrate a stack of alternating layers made of a first semiconductor material and of a second semiconductor material. This step illustrated in FIGS. 4A, 19 and 20 for example, will be described in detail below.

Forming from this stack openings defining transistor patterns. This step illustrated in FIGS. 4B, 21 and 22 for example, will be described in detail below.

Forming sacrificial gates straddling the central parts of the transistor patterns. This step illustrated in FIGS. 4C-4F, and 29-33 for example, will be described in detail below.

Removing the second semiconductor material of the at least one sacrificial layer from the openings so as to leave a first space at the peripheral parts of the transistor patterns. This step illustrated in FIGS. 8A and 37 for example, will be described in detail below.

Filling said first space with a second dielectric material. This step illustrated in FIGS. 8B and 38 for example, will be described in detail below.

Removing the sacrificial gates so as to completely free the channels of the transistors. This step illustrated in FIGS. 13C-13E and 46-48 for example, will be described in detail below.

Forming gates called gates-all-around completely surrounding the channels of the transistors of at least one level $n_z$. This step illustrated in FIGS. 13F and 49 for example, will be described in detail below.

The invention will now be described through two exemplary embodiments of an OxRAM type resistive memory. These two examples are organised in two sections respectively called "Example 1" and "Example 2". The steps of manufacturing a memory according to these examples are subdivided into subsections respectively called "formation of sacrificial gates", "insulation of the sources", "structuring of the sourceline area", "structuring of the wordline area", "structuring of the bitline area", "formation of the contacts". These subsections are defined for the sake of clarity and are not necessarily strictly successive.

Figure 2:
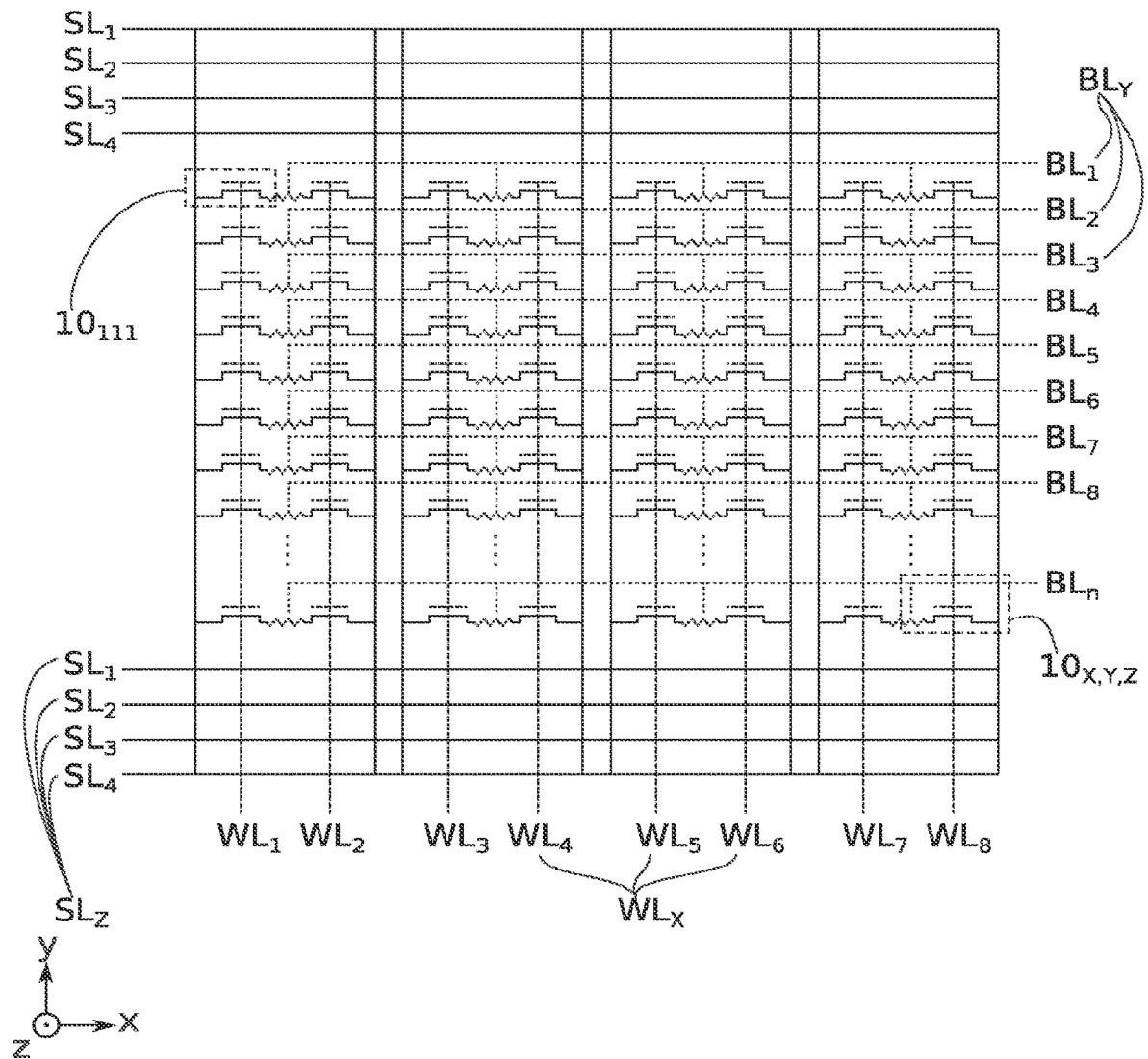
FIG. 2 shows a design of a memory cell array according to one embodiment of the present invention.

FIG. 2 shows a functional diagram of such an OxRAM resistive memory, formed from a plurality of memory cells $10_{x, y, z}$ each comprising a resistive element and a transistor. These memory cells $10_{x, y, z}$ are also called cells 1T1R.

The memory cells $10_{x, y, z}$ are typically organised as an array on different integration levels. An integration level is located at a given altitude z along the axis Z. The memory cells $10_{x, y, z}$ are thus identified by their coordinates x and y for a given level z.

In order to independently address each memory cell $10_{x, y, z}$ of this 3D array, connection lines are drawn. Each memory cell $10_{x, y, z}$ is thus connected to a power supply or write line called sourceline $SL_z$, a control or word line called wordline $WL_x$, and a read or data line called bitline $BL_y$.

In these examples, the sourcelines are carried by the levels z, the wordlines extend along Y and the bitlines extend along X. For each memory cell, the resistive element is connected to a bitline $BL_y$, the source of the transistor is connected to a sourceline $SL_z$, and the gate of the transistor is connected to a wordline $WL_x$. The wordlines $WL_1$, $WL_2$, $WL_3$, $WL_4$, $WL_6$, $WL_6$, $WL_7$, $WL_8$ are for example 8 in number (x=[1 . . . 8]), so as to encode information on 8 bits. The levels carrying the sources $SL_1$, $SL_2$, $SL_3$, $SL_4$ are for example 4 in number (z=[1 . . . 4]) and named in the following n1, n2, n3, n4 or, by contraction, levels $SL_1$, $SL_2$, $SL_3$, $SL_4$. The bitlines $BL_1$, $BL_2$, $BL_3$, $BL_4$, $BL_5$, $BL_6$, $BL_7$, $BL_8$ are for example 8 in number (y=[1 . . . 8]), or more (y=[1 . . . n]), depending on the logic format required for the memory. The limited number of memory cells $10_{x, y, z}$ in these examples allows to illustrate the main features of the invention in a clear and concise manner. These examples do not exclude other possibilities for organising the 3D array.

Figure 3:
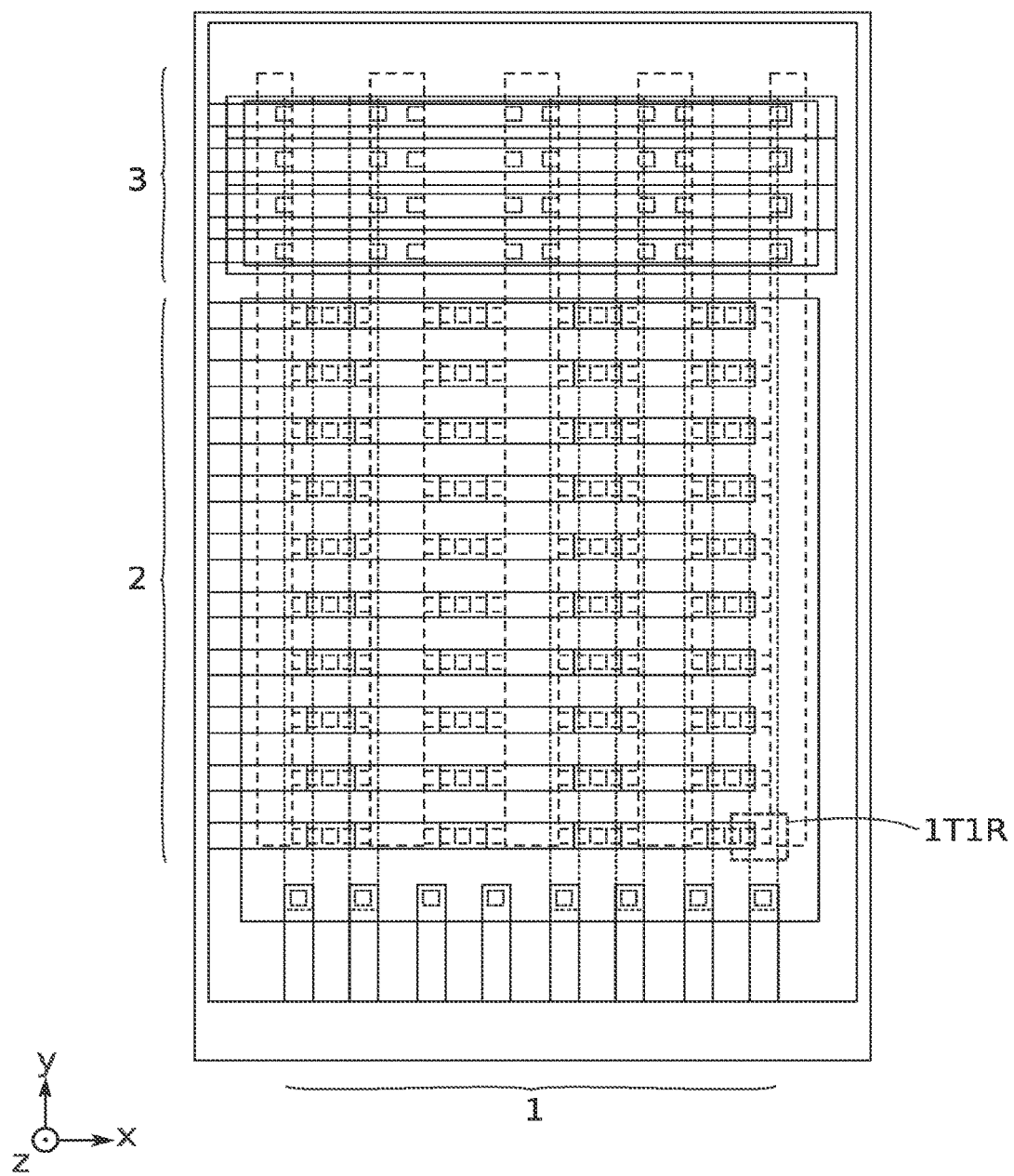
FIG. 3 shows a plan of a microelectronic system comprising a memory cell array according to one embodiment of the present invention.

FIG. 3 shows an example of the arrangement of the structural elements of the OxRAM resistive memory. The memory cells 1T1R form an array in the plane XY at the intersection of the wordline area 1 and the bitline area 2. This arrangement may comprise a remote sourceline area 3, adjacent to the array, so as to facilitate the connection of the sourcelines.

The structural elements of this resistive memory are mainly the transistors or selection transistors, the memory elements or memory points, and the connection lines wordlines, bitlines, sourcelines.

According to the invention, the transistors 101 are stacked on several integration levels (along the axis z). These levels $n_1$, $n_2$, $n_3$, $n_4$ comprise in particular the sources 1002 of the transistors. They are electrically insulated from each other by means of a step of forming sacrificial gates 150. These sacrificial gates 150 are then replaced by functional gates-all-around. This general principle allows to obtain a dense 3D array of GAA transistors. In the examples illustrated and described below, wordline 1, bitline 2 and sourceline 3 areas are also defined and resistive memory elements 102 are formed so as to obtain a dense OxRAM memory in 3D integration.

A first exemplary embodiment of an OxRAM type resistive memory will now be described with reference to FIGS. 4A to 18 in the following section:

Example 1

Formation of Sacrificial Gates

Figure 4A:
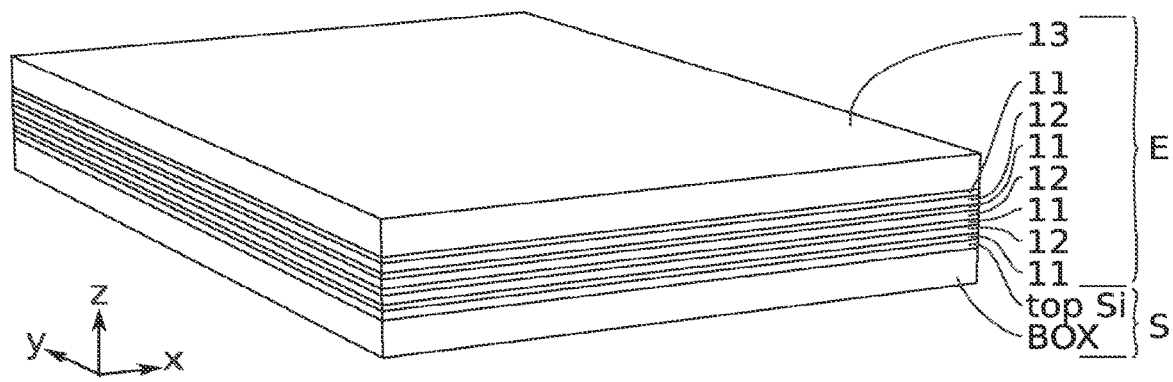
FIGS. 4A to 4G schematically illustrate in three-quarter view steps of manufacturing sacrificial gates of a microelectronic system according to a first embodiment of the present invention.
Figure 4B:
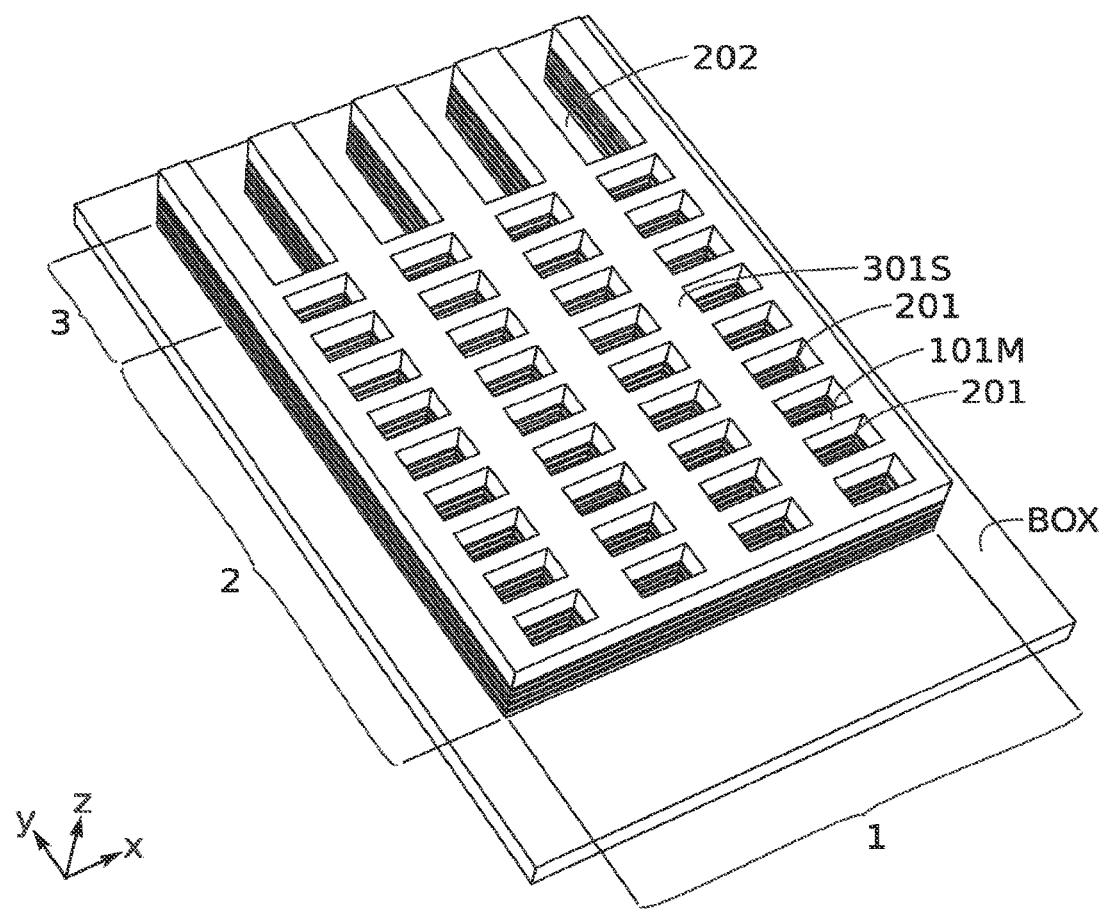

FIGS. 4A and 4B illustrate the formation of the stack and the definition of the transistor patterns. FIGS. 4C to 4G illustrate steps of forming sacrificial gates at the transistor patterns.

As illustrated in FIG. 4A, a first step consists in producing a stack E of semiconductor layers 11, 12 on a substrate S. The substrate S can be an SOI (Silicon On Insulator) type substrate comprising, according to common terminology for the person skilled in the art, a thick layer of silicon called "Si bulk" (not shown in FIG. 4A), a layer of silicon oxide called "BOX" (Buried Oxide) and a thin layer of silicon called "top Si". The thickness of the top Si can typically be on the order of 12 nm. The thickness of the BOX can typically be comprised between 25 nm and 145 nm. Alternatively, the substrate S can be a massive substrate "Si bulk". Alternatively, the substrate is of the GeOI or SGOI (respectively Germanium On Insulator or Silicon-Germanium On Insulator) type known to the person skilled in the art. In the latter case, the layer in contact with the BOX is a sacrificial SiGe layer. This ultimately allows to form transistors all having a GAA configuration, on each level.

The stack E typically comprises an alternation of layers 11 made of silicon-germanium (SiGe) and layers 12 made of silicon (Si).

The concentration of Ge in the SiGe alloy can be 20%, 30% or 45% for example. This germanium concentration is selected so as to allow good selectivity of the etching of SiGe relative to Si, during the selective etching steps. The greater the concentration of Ge, the greater the selectivity to Si will be during the subsequent removal of the SiGe. This stack E is advantageously formed by epitaxy of the layers of SiGe 11 and of Si 12. This step of forming the stack E is inexpensive and well known to the person skilled in the art. The thicknesses of the Si and SiGe layers can typically be of the order of 15 nm, and more generally comprised between 5 nm and 50 nm for example. In a known manner in order to avoid the formation of structural defects, the maximum thicknesses allowed for the SiGe layers 11 depend in particular on the selected Ge concentration.

In the example illustrated in FIG. 4A, four layers of Si (the topSi layer of the substrate and three epitaxial Si layers 12) are alternated with four epitaxial Ge layers 11. A Si/SiGe super lattice is thus obtained. The number of Si and SiGe layers can naturally be increased. This ultimately allows increasing the number of transistors and memory cells.

A hard mask layer 13, preferably made of silicon nitride SiN, is then deposited on the Si/SiGe super lattice.

As illustrated in FIG. 4B, a conventional lithography/etching step is carried out in order to define transistor patterns 101M, source patterns 301S and openings 201, 202. The etching is anisotropic. It is configured to etch the Si/SiGe super lattice over its entire height, stopping at the BOX. It can be carried out by plasma using HBr/O2 etching chemistry. The transistor patterns 101M can have a length $l_T$ along X comprised between 100 nm and 500 nm. They preferably have a width $L_T$ along Y comprised between 10 nm and 80 nm, for example of the order of 40 nm. This allows to obtain a plurality of superimposed Si nanowires intended to form the channels of the transistors.

The openings 202 in the sourceline area 3 are significantly larger than the openings 201 of the array defined by the wordline 1 and bitline 2 areas. This allows to reserve sufficiently large locations for the subsequent formation of the sourceline contacts, in particular for stepped sourceline contacts.

Figure 4C:
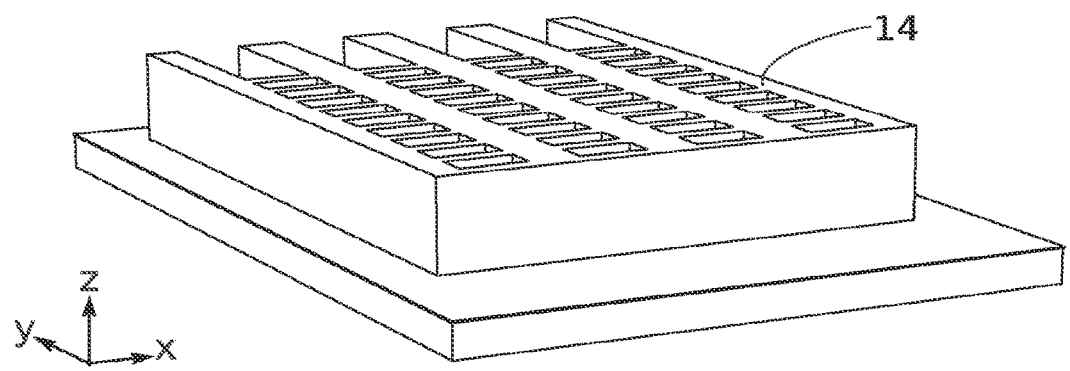
Figure 4D:
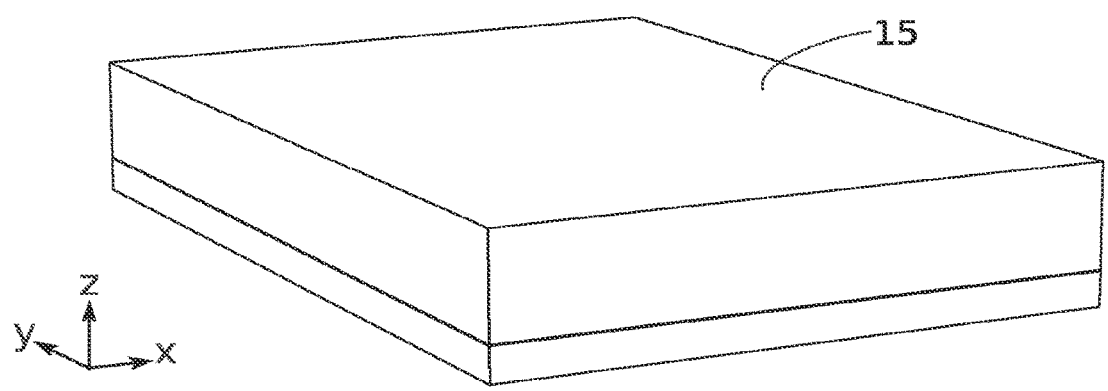

FIGS. 4C and 4D respectively illustrate steps of depositing a layer 14 of silicon oxide SiO2 and a layer 15 of polycrystalline silicon (polySi). The SiO2 is preferably a stoichiometric oxide deposited by CVD, called TEOS from the name of the silicon precursor (TetraEthyl OrthoSilicate) generally used. This deposition is conformal. The thickness of SiO2 deposited can typically be a few nanometres, for example 7 nm. The polySi is deposited so as to fill the openings 201, 202. The thickness of the polySi deposited can typically be a few hundred nanometres, for example 380 nm. These successive depositions form a SiO2/polySi stack similar to a conventional gate stack. The structuring of this stack allows forming pseudo-gates called sacrificial gates in this application. These sacrificial gates are indeed kept during intermediate steps of the manufacture of the devices, and then removed to be finally replaced by functional gates. According to an alternative possibility, the polySi can be replaced by amorphous silicon.

Figure 4E:
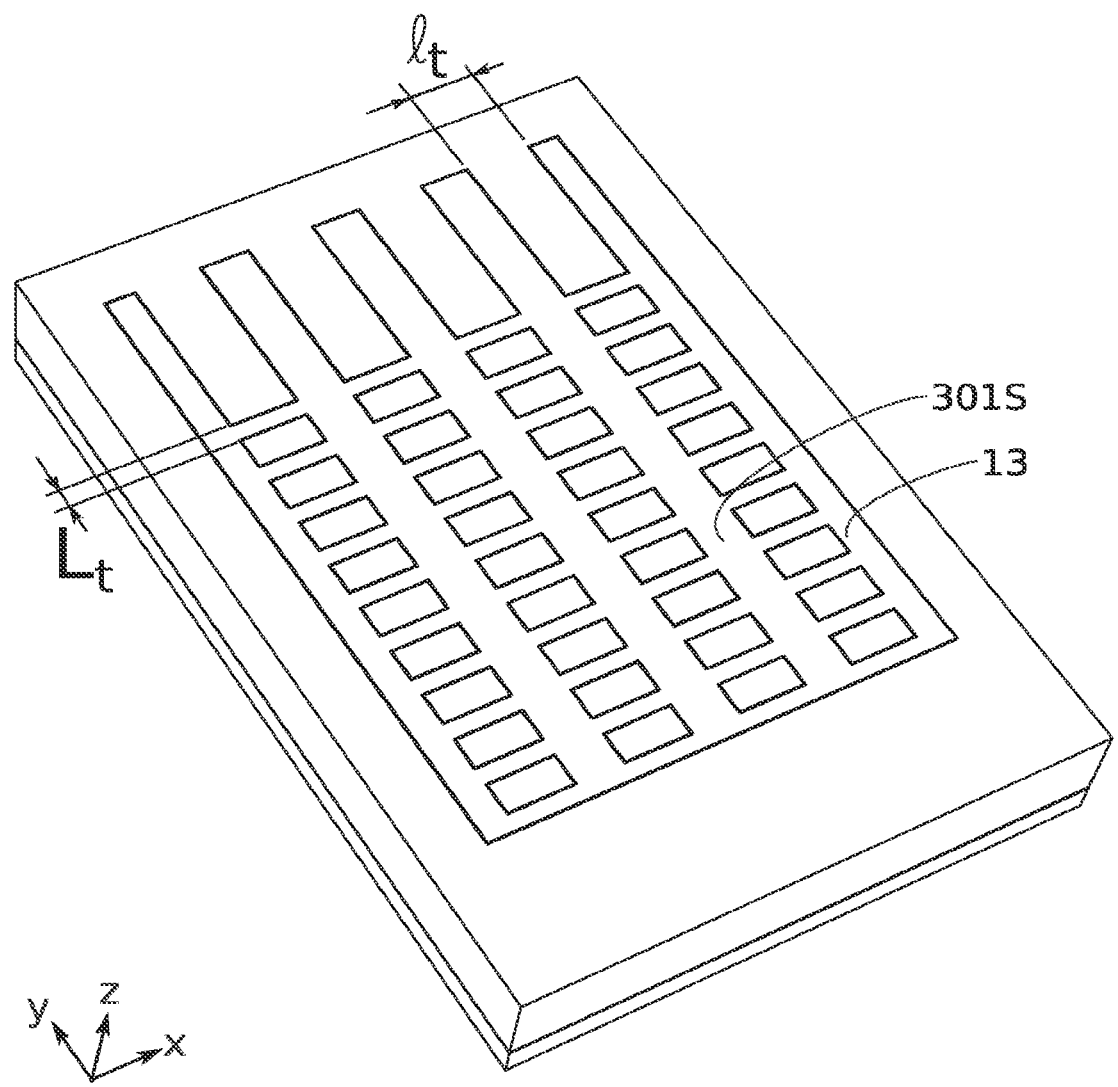

FIG. 4E illustrates a planarisation step, typically by mechanical-chemical polishing CMP, configured to be stopped on the hard mask 13.

Figure 4F:
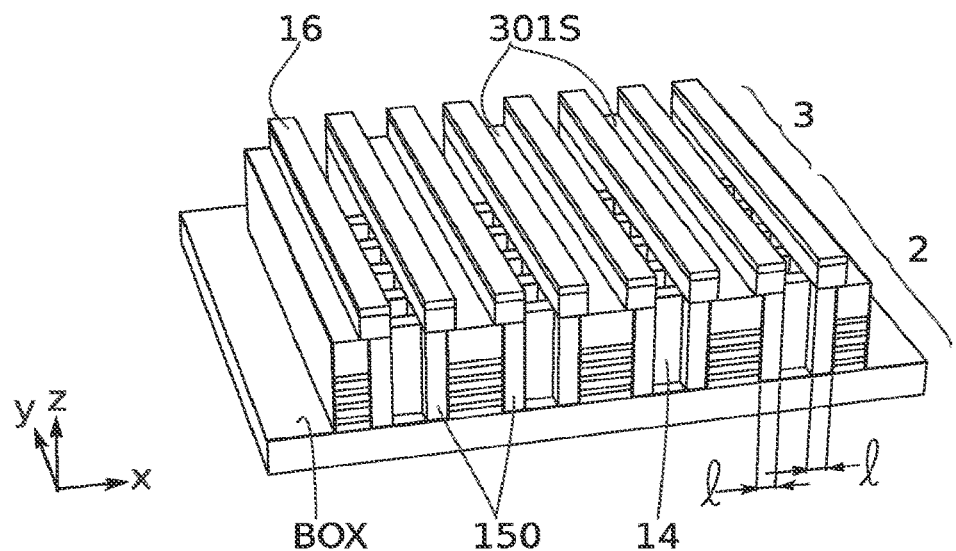

Another hard mask 16 can then be deposited over the entire surface of the plate, covering the hard mask 13 and the polySi exposed after planarisation (not illustrated). This hard mask 16 comprises for example a layer of silicon nitride SiN approximately 90 nm thick surmounted by a layer of silicon oxide approximately 36 nm thick. The hard mask 16 is structured by lithography/etching so as to define the sacrificial gates. The hard mask 16 thus covers transistor pattern portions 101M which are directly linked to the source patterns 301S (FIG. 4F). These transistor pattern portions 101M are said to be peripheral. They preferably have a dimension l along X comprised between 10 nm and 150 nm, for example 50 nm. This dimension l can be proportional to the length $l_T$ of the transistor patterns 101M, for example $l=k.l_T$ with 0.1≤k 0.4.

The sacrificial gates 150 are formed between the peripheral portions, by anisotropic etching of the polySi outside the areas covered by the hard mask 16, as illustrated in FIG. 4F.

The anisotropic etching of the polySi along Z can be carried out by CH2F2/SF6/N2/He and/or HBr/O2/He chemistry plasma. The TEOS layer 14 and the buried oxide (BOX) are advantageously used as a stop layer during this etching of the Poly-Si. The sacrificial gates 150 of dimension l along X are thus formed in the "bitline" 2 and "sourceline" 3 areas. In the bitline area 2, the sacrificial gates 150 extend between the transistor patterns. They border on either side, along Y, the peripheral portions located at each end of the transistor patterns. In the sourceline area 3, the sacrificial gates 150 extend continuously along Y.

Figure 4G:
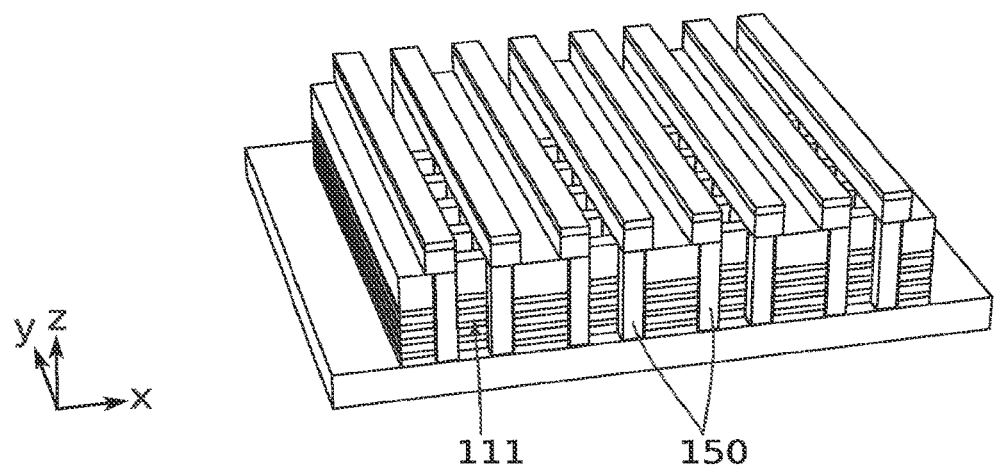

FIG. 4G illustrates the removal of the TEOS oxide layer 14, after etching the polySi. This removal allows to expose a central portion 111 of the transistor patterns, between the peripheral portions 112.

Figure 5:
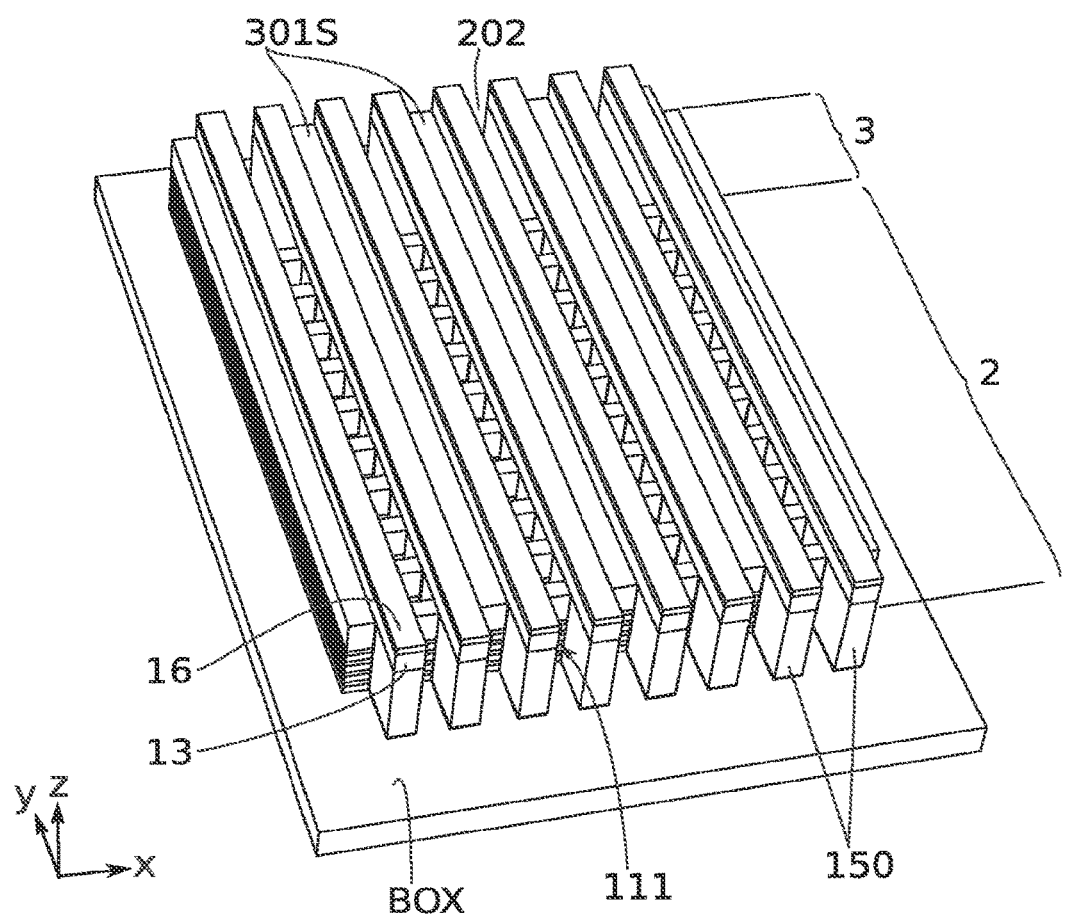
FIG. 5 schematically illustrates in three-quarter view a step of manufacturing a microelectronic system according to a first embodiment of the present invention.

FIG. 5 illustrates the bitline area 2 wherein the central portions 111 of the exposed transistor patterns are located, and the sourceline area 3 wherein the openings 202 are bordered by the sacrificial gates 150.

Figure 6A:
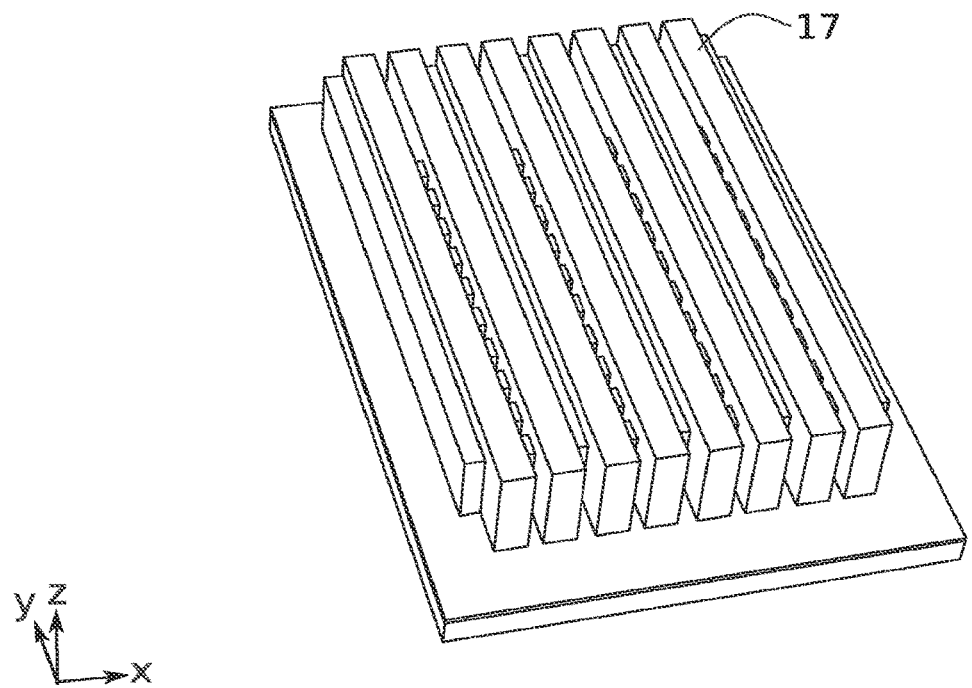
FIGS. 6A to 6C schematically illustrate in three-quarter view steps of manufacturing a microelectronic system according to a first embodiment of the present invention.
Figure 6B:
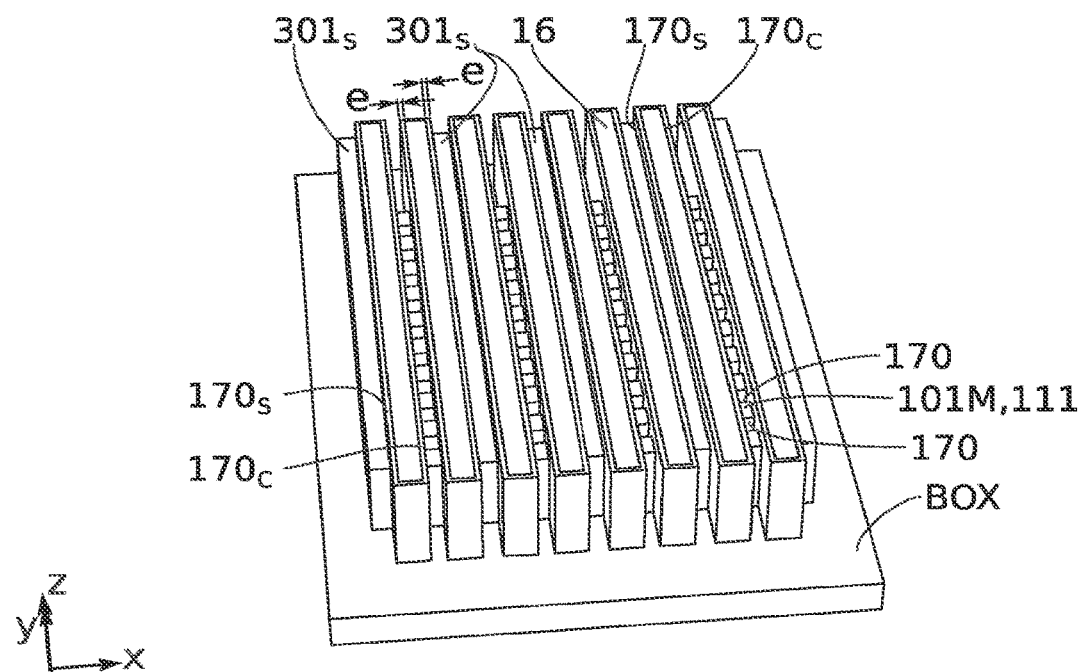

FIGS. 6A and 6B illustrate the formation of spacers 170, $170_C$, $170_S$. The spacers $170_C$, $170_S$ extend mainly along y on either side of the sacrificial gates 150. These spacers $170_C$, $170_S$ are called longitudinal spacers. The spacers 170 mainly extend along x on either side of the transistor patterns 101M. These spacers 170 are called transverse spacers. The spacers 170, $170_C$, $170_S$ are typically formed from a deposition of a conformal SiN layer 17 (FIG. 6A) followed by an anisotropic etching of this SiN layer 17 (FIG. 6B). The thickness e of the SiN layer can be comprised between 10 nm and 50 nm, for example of the order of 20 nm. After etching the spacers, the hard mask 16 and the BOX are exposed. The spacers $170_C$, $170_S$ have a width along X equal to e and cover the sidewalls of the hard mask 16. The source patterns 301S are thus partly covered by these spacers $170_S$ on their sides bordering the hard masks 16. The spacers $170_S$ form on the sides of the source patterns 301S an extra thickness of SiN aiming at protecting the Si/SiGe stack during a subsequent etching. The spacers $170_C$ cover the peripheral portions 112 of transistor patterns 101M. The spacers 170 cover the sidewalls of the central portions 111 of transistor patterns 101M.

The parts of the SiN layer extending in planes parallel to the base plane XY, between the transverse spacers, are then opened by a first anisotropic etching, for example by plasma using a fluorocarbon chemistry, for example based on CH2F2/O2 or CH3F/O2 and CHF3. Such a first anisotropic etching is known to the person skilled in the art. The Si/SiGe stack underlying the open parts is then etched over its entire height, with stopping on the buried oxide layer (BOX), by a second anisotropic etching, for example by plasma using a HBr/O2 chemistry.

Figure 6C:
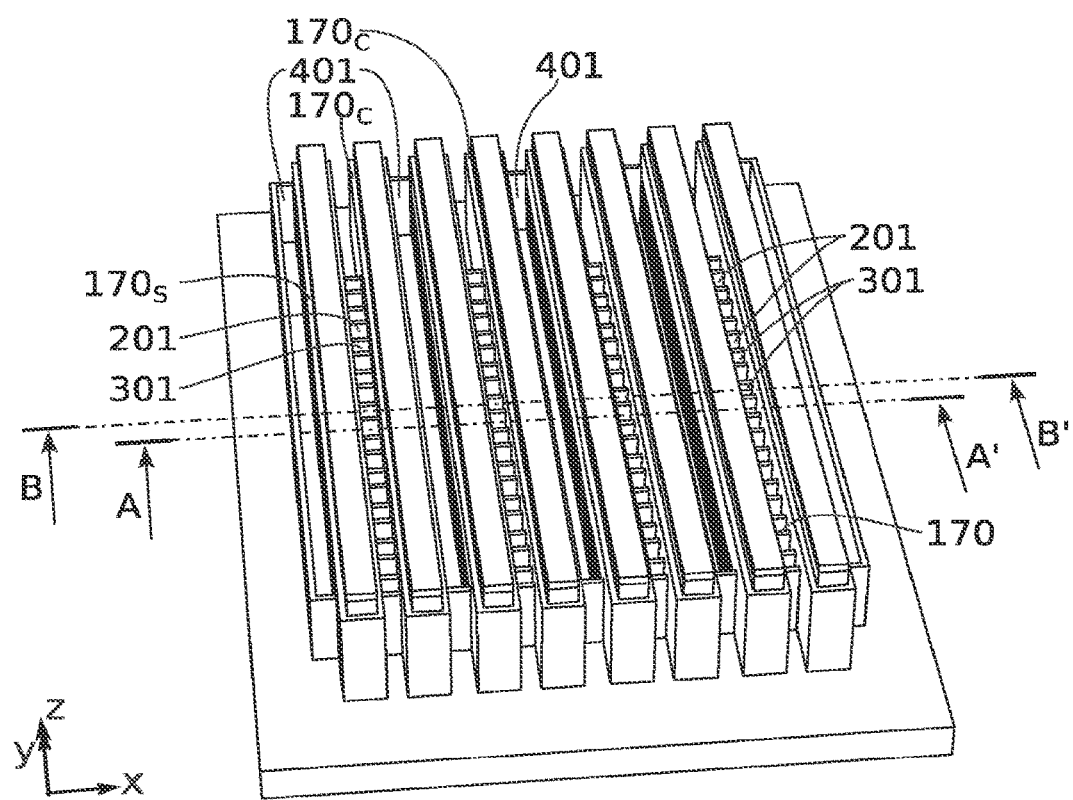

FIG. 6C illustrates the structure obtained after these first and second anisotropic etchings. In particular, the source patterns 301S have been partially etched and leave room for openings 401 bordered by the Si/SiGe stacks surmounted by the spacers $170_S$. The central portions 111 of the transistor patterns 101M have been etched and leave room for openings 301 bordered by the spacers 170, $170_C$. These openings 301 opening onto the peripheral portions of the transistor patterns are advantageously delimited by the spacers 170, 170$_C$. This allows to relieve stresses of resolution in lithography to subsequently fill these openings 301.

Figure 7A:
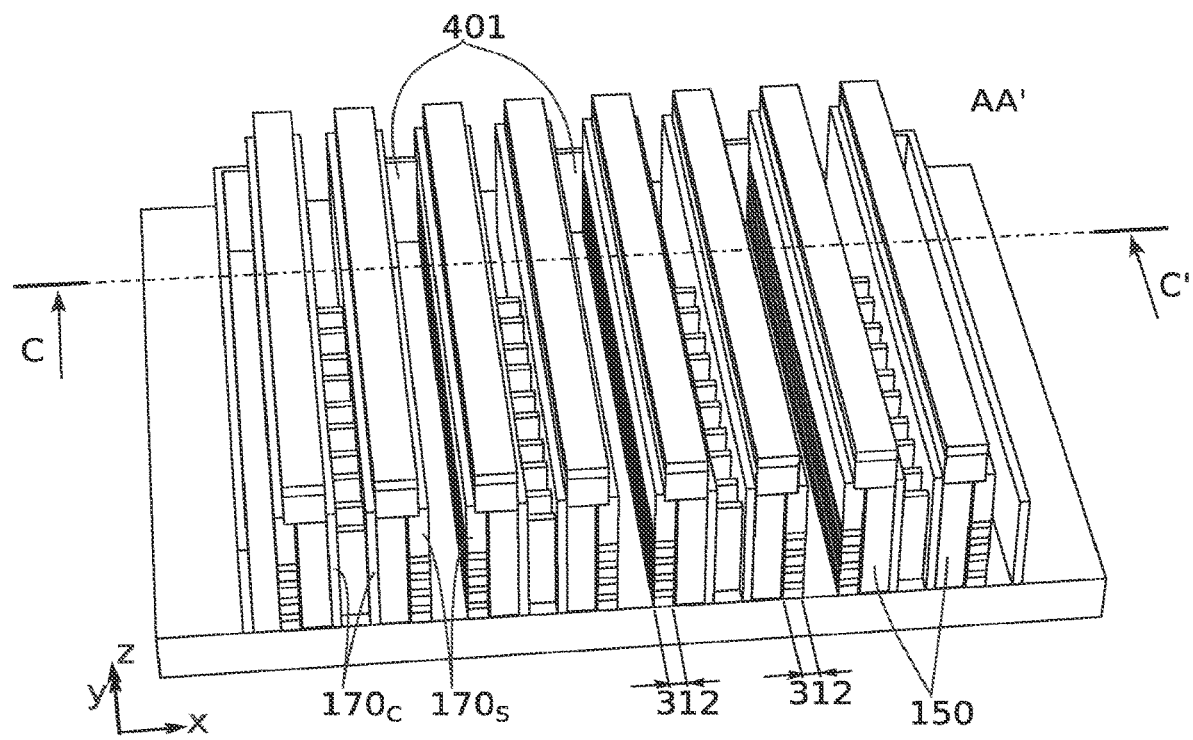
FIGS. 7A and 7B respectively illustrate cross sections along the axes AA' and BB' shown in FIG. 6C FIGS. 8A to 8D schematically illustrate in three-quarter view steps of manufacturing a microelectronic system aiming at insulating sources of transistors from each other, according to a first embodiment of the present invention.
Figure 7B:
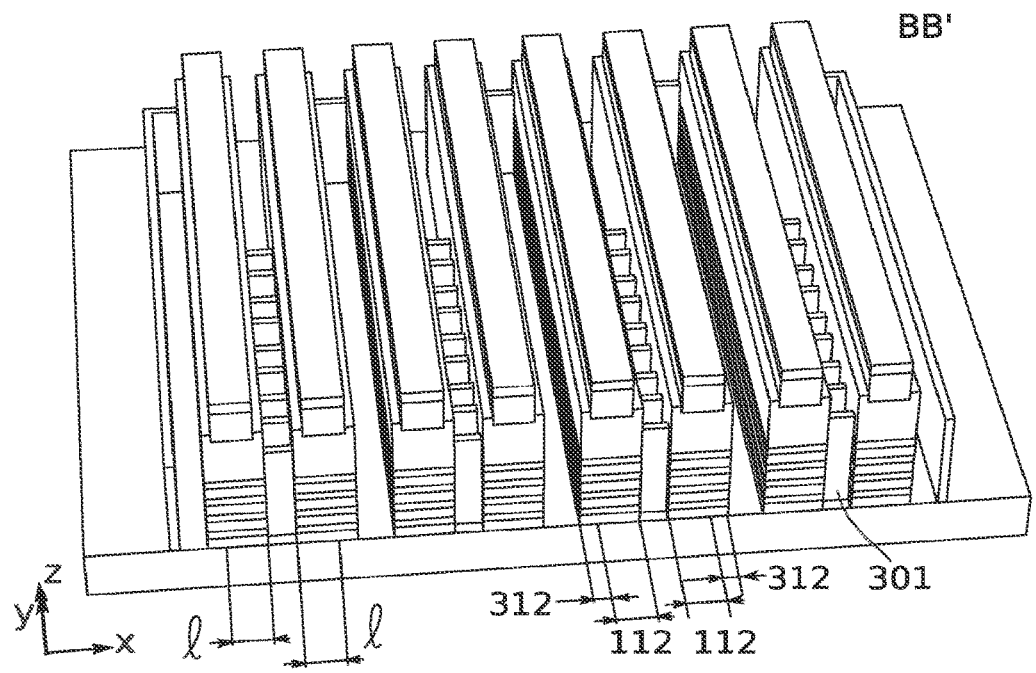

Two cross sections in the structure illustrated in FIG. 6C are shown in FIGS. 7A and 7B.

FIG. 7A shows a cross section passing through openings 201, along the line AA' shown in FIG. 6C. This cross section is similar to a cross section passing through openings 401 (not illustrated). It appears that the sacrificial gates 150 form a series of pillars allowing lateral anchoring of the Si/SiGe multilayers thus structured in a "comb" shape. The peripheral portions 312 of the source patterns 301S are continuous along the axis Y. A first side of these peripheral portions 312 opens onto the openings 401. A second side of these peripheral portions 312 is attached to the sacrificial gates 150. Preferably, the Si layers of these peripheral portions 312 will subsequently form the sources of the transistors.

FIG. 7B shows a cross section passing through openings 301, along the line BB' shown in FIG. 6C. The teeth of the "comb" correspond to the peripheral portions 112 of the transistor patterns 101M, of length l along X. Preferably, the Si layers of these peripheral portions 112 will subsequently form the channels and the drains of the transistors.

Insulation of the Sources

In order to be able to independently address each of the transistors of the 3D array, it is necessary to at least partially insulate the transistors from each other. These transistors are formed from the Si layers of the Si/SiGe stack. The SiGe layers are therefore preferably removed and replaced by electrically insulating layers. The SiGe layers are called sacrificial layers. They are used to form the stack and then removed to insulate the transistors, and in particular the sources of these transistors.

Advantageously, a step of insulating the sources power supplying the channels of the transistors is carried out. These sources are formed from the Si layers of the peripheral portions 312 of the source patterns 301S illustrated in FIGS. 7A, 7B.

Figure 8A:
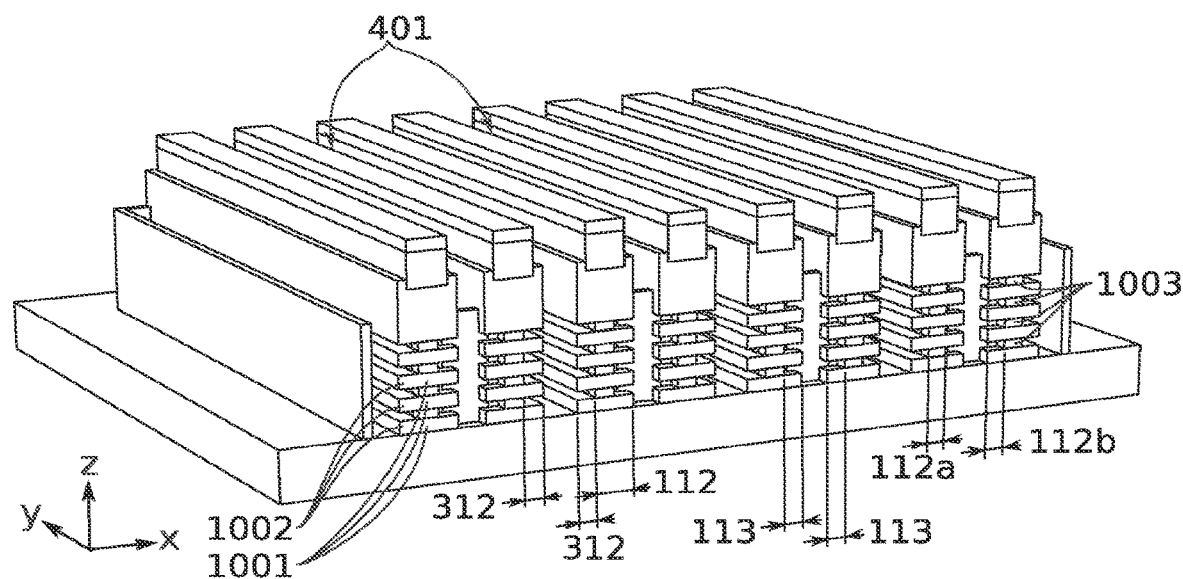

As illustrated in FIG. 8A, portions of the SiGe layers of the stack are etched from the openings 301, 401. This etching is selective relative to silicon, and preferably isotropic. An etching solution based on acetic acid, hydrofluoric acid HF and hydrogen peroxide H2O2 can be used.

The etching is configured so that the SiGe layers of the peripheral portions 312 are etched through the openings 401. The etch front from the openings 401 thus stops substantially in vertical alignment with the sacrificial gates 150. The sources 1002 are therefore suspended.

Etching the SiGe layers is preferably also carried out through the openings 301. The selective etching of the SiGe layers is thus carried out on either side of the stack, at the transistor patterns, as illustrated in FIG. 8A. Parts 113 of SiGe layers of the peripheral portions 112 are thus etched. These parts 113 form a first space which will subsequently be filled with a dielectric material. The etching is preferably stopped at the time before the SiGe layers are completely removed. SiGe portions 1003 are thus preserved. The peripheral portions 112 are thus subdivided into parts 112a, 112b. The parts 112a comprise the future Si channels 1001 alternated with the SiGe portions 1003. The parts 112b comprise the suspended future Si drains 1006. The definition of the drains 1006 and of the channels 1001 can thus be done during this step of partial etching of the SiGe. This partial etching also allows to avoid a risk of collapse of the channels 1001 of the transistors.

Poly-Si sacrificial gates allow in particular to maintain the Si layers during SiGe etching. They form a structure of anchor pillars for the Si layers.

Figure 8B:
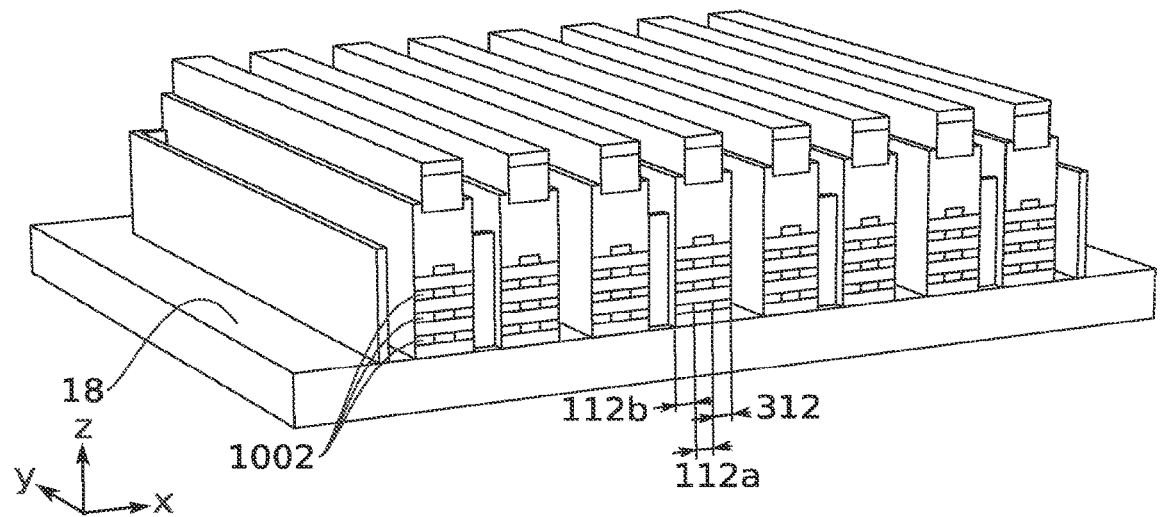

FIG. 8B illustrates the deposition of a dielectric layer 18, for example SiN, intended to fill the cavities formed by the removal of the SiGe. The sources 1002 are thus electrically insulated from each other.

Figure 8C:
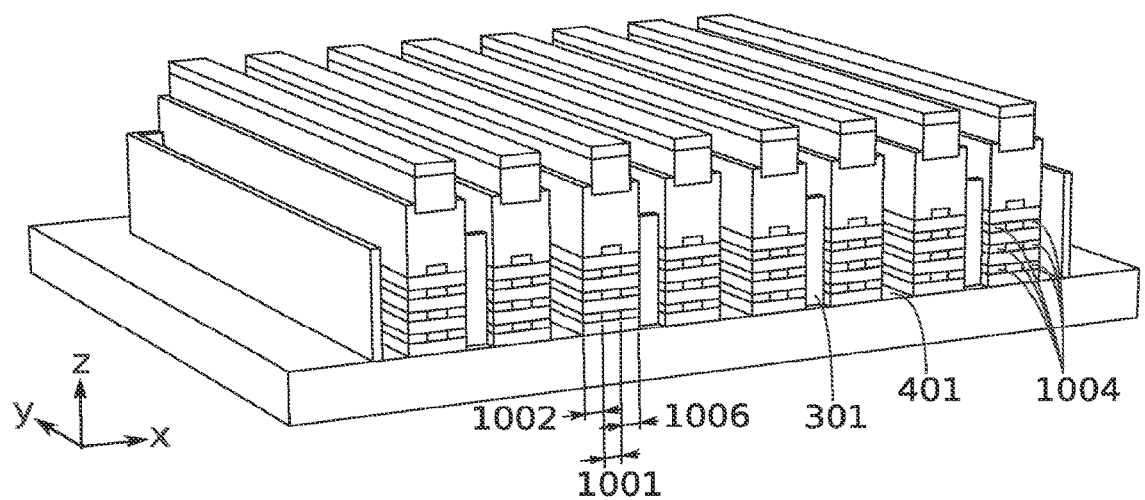

The layer 18 is then partially etched, for example using a solution of dilute phosphoric acid H3PO4 or acetic acid or hydrogen peroxide H2O2, so as to expose the sidewalls which are substantially parallel to the plane YZ of the Si layers, on the side of the openings 401 and on the side of the openings 301. The BOX is preferably also exposed during this etching of the layer 18, as illustrated in FIG. 8C. FIGS. 8A to 8C illustrate these steps of removing the SiGe and insulating the sources in cross section passing through the openings 301.

Figure 8D:
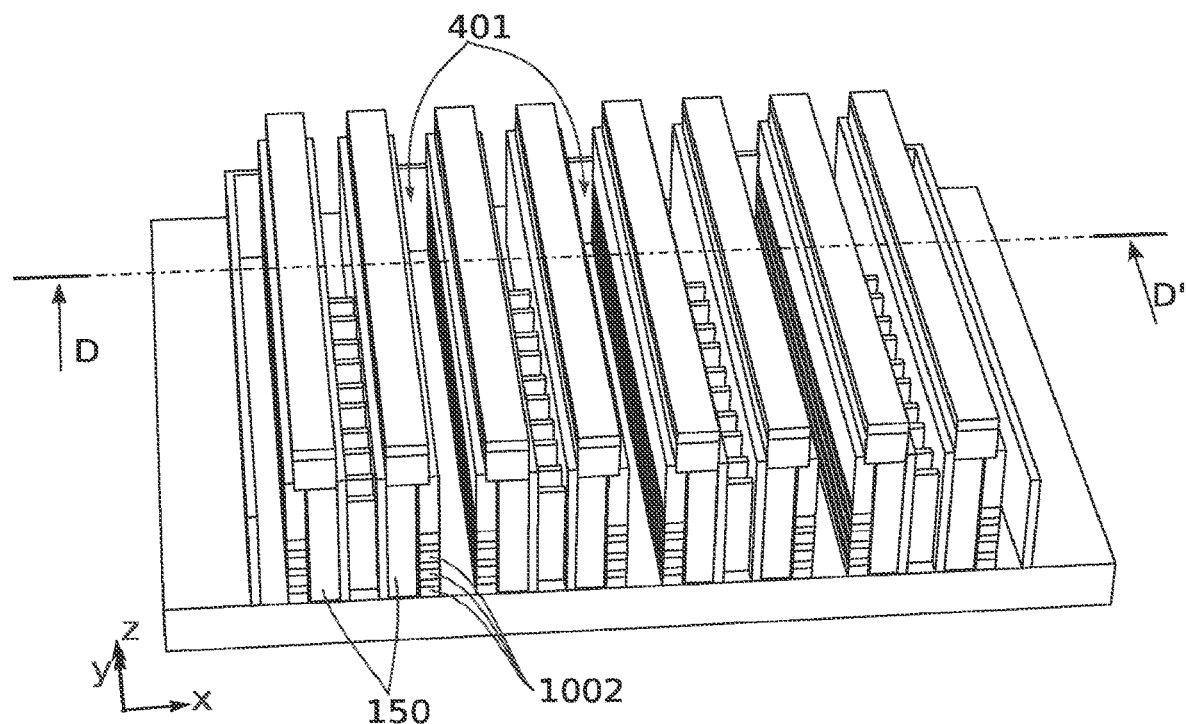

FIG. 8D illustrates the state of the structure after these steps of removing the SiGe and insulating the sources in a cross section passing through the openings 201. It is clear that the sacrificial gates 150 are used as a support for the sources 1002.

Figure 9:
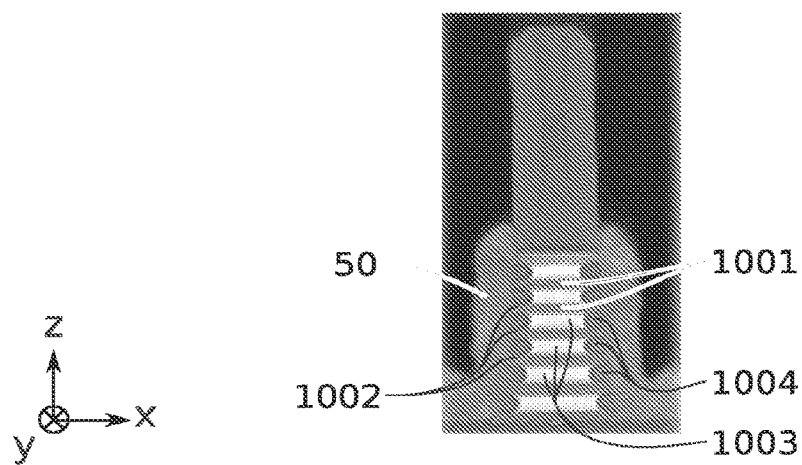
FIG. 9 shows a STEM HAADF image of a part of a microelectronic system according to a first embodiment of the present invention, during manufacture.

FIG. 9 is a scanning transmission electron microscopy (STEM) image illustrating a device obtained after insulation of the sources 1002, as shown schematically in FIG. 8C.

The remaining SiGe portions 1003 are visible between the channels 1001 of the transistors. The plugs 1004 formed by the deposition of the SiN layer 18 are also visible on either side of the SiGe portions 1003. The protective layer 50 is an epitaxy performed for other purposes.

Figure 10A:
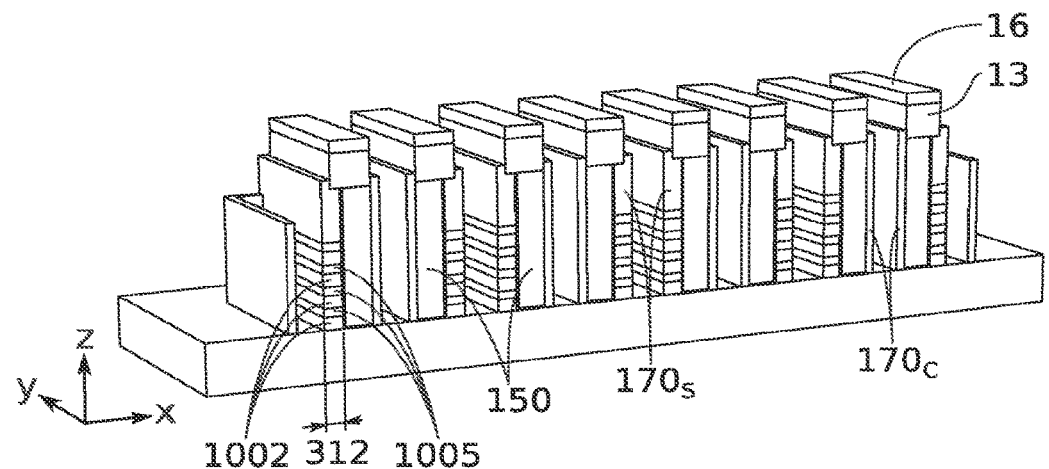
FIGS. 10A and 10B illustrate part of a microelectronic system according to a first embodiment of the present invention, respectively before and after insulation of the sources from each other.
Figure 10B:
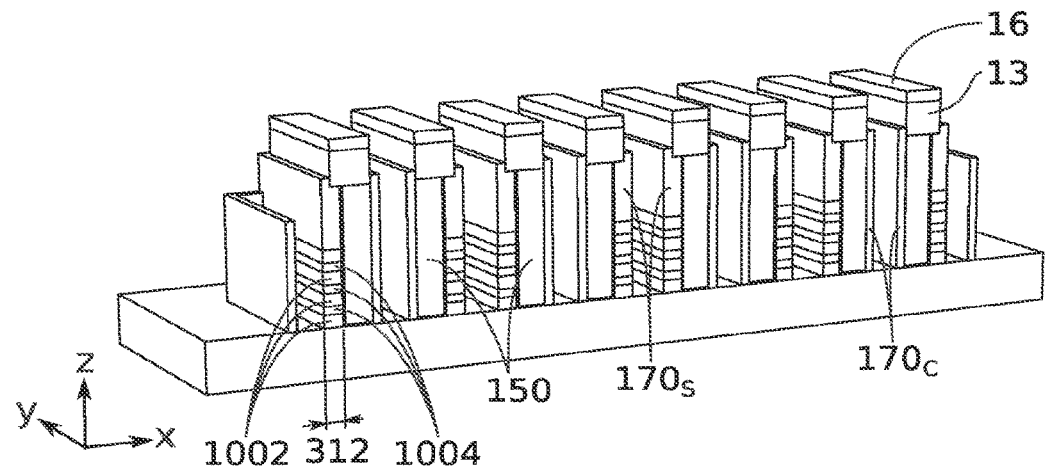

FIGS. 10A and 10B show enlargements of the structure obtained respectively before and after insulation. Thus, FIG. 10A illustrates in an enlarged fashion a cross section along the line CC' shown in FIG. 7A, passing through the openings 401 of the sourceline area. FIG. 10B illustrates in an enlarged fashion a cross section along the line DD' shown in FIG. 8D, passing through the openings 401 of the sourceline area.

The sacrificial gates 150, the spacers 170$_C$, 170$_S$, the hard masks 13 and 16, and the sources 1002 are visible in the two FIGS. 10A, 10B. The SiGe portions 1005 of the peripheral portions 312 of the source patterns 301S present before insulation (FIG. 10A) are replaced by the SiN plugs 1004 in the peripheral portions 312 of the source patterns 301S after insulation (FIG. 10B).

Structuring of the Sourceline Area

After insulating the sources 1002, the openings 401, 301, 201 between the hard mask lines 16 are preferably filled with a TEOS oxide 180. The structure is then planarised by CMP until removal of the hard mask 16, so as to expose the hard mask 13.

Figure 11A:
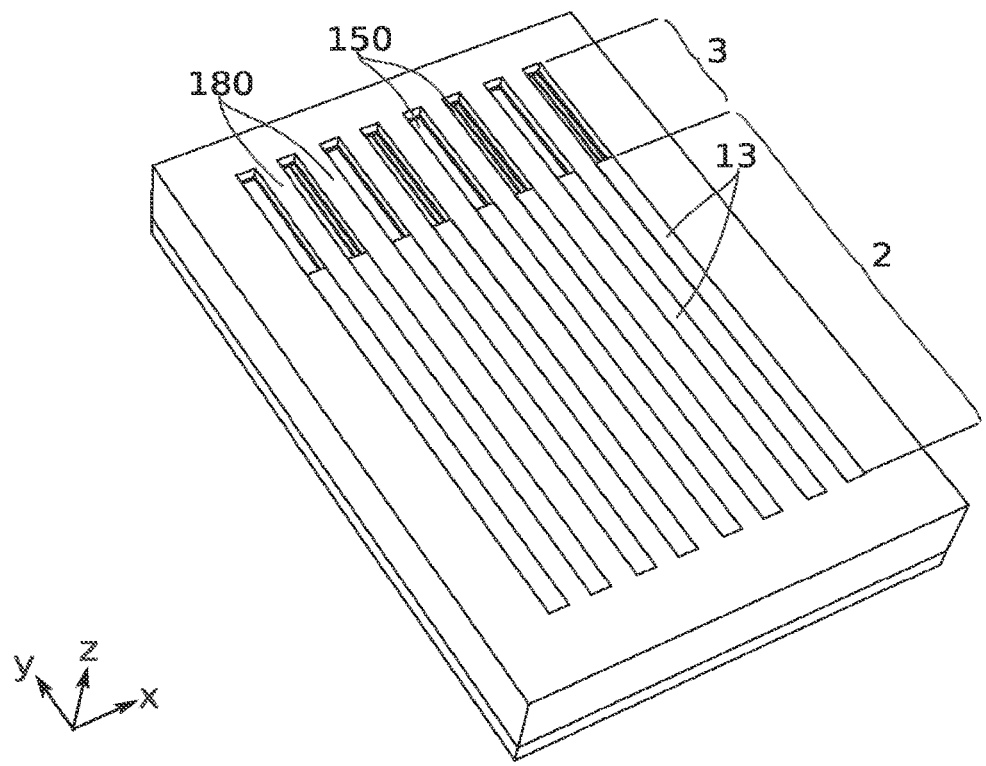
FIGS. 11A to 11D schematically illustrate in three-quarter view steps of manufacturing the source line area of a microelectronic system according to a first embodiment of the present invention.

This hard mask 13 can then be removed in the sourceline area 3, so as to expose the polySi of the sacrificial gates 150 by a conventional lithography/etching step, as illustrated in FIG. 11A. The SiN hard mask 13 can be etched using a dilute phosphoric acid H3PO4 solution, or by dry plasma etching based on fluorocarbon species (for example CH2F2/O2).

Figure 11B:
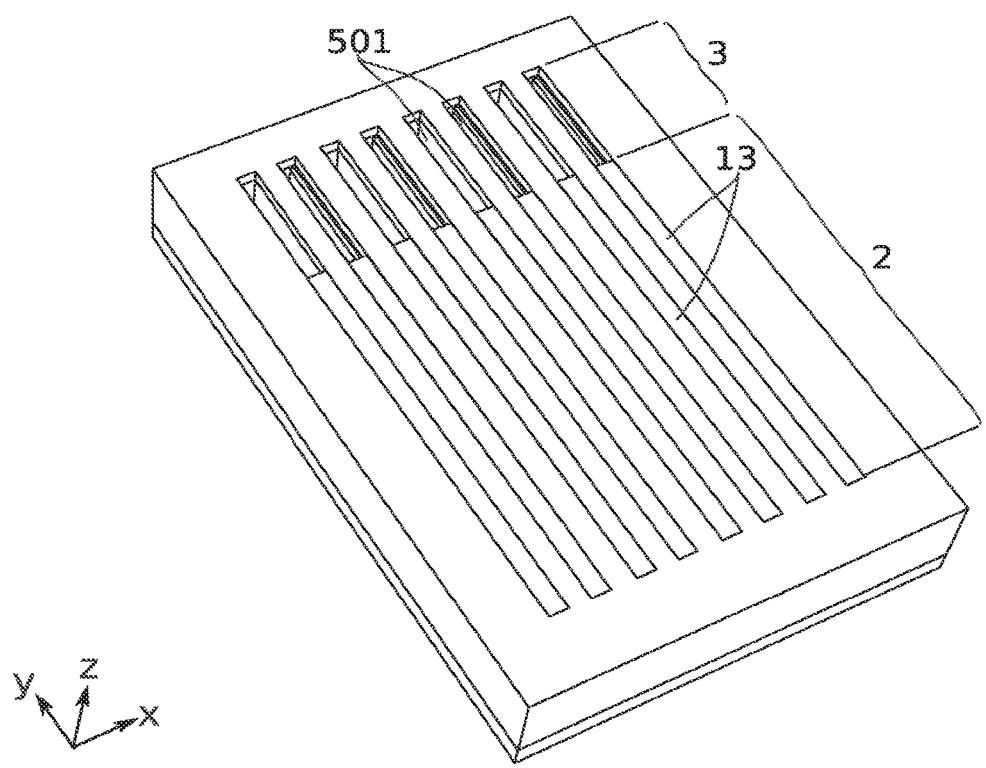

The sacrificial gates 150 of the sourceline area 3 are then removed, as illustrated in FIG. 11B. The polySi of the sacrificial gates can be etched using a solution of tetramethylammonium hydroxide (TMAH) or tetraethylammonium hydroxide (TEAH). The TEOS oxide of the sacrificial gates can be etched using a fluorocarbon chemistry plasma, for example a CF4/CH2F2/He chemistry plasma.

Figure 11C:
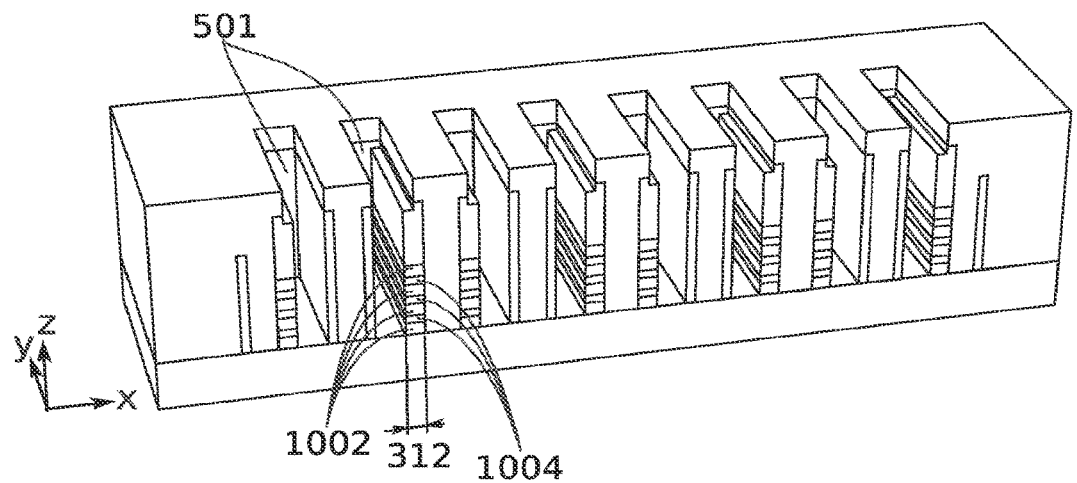

In the example illustrated in FIG. 11C, the removal of the sacrificial gates 150 forms openings 501. These openings 501 expose the second side of the peripheral portions 312 comprising the stack of sources 1002 insulated from each other by the SiN plugs 1004. The sacrificial gates thus allowed to form a support for the sources 1002 during the replacement of the SiGe portions 1005 by the SiN plugs 1004 in the peripheral portions 312. For SiGe portions 1005 having a width along X less than or equal to 100 nm, this replacement can be done in a single step as illustrated above by FIGS. 7A to 8D.

On the other hand, if the SiGe portions 1005 have a width along X greater than 100 nm, for example 150 nm or 200 nm, the complete removal of these portions 1005 can induce collapse or sticking of the sources 1002 on each other. In this case, a partial removal of the portions 1005 over a width along X less than 100 nm can first be performed from the openings 401 opening onto the first side of the peripheral portions 312 (not illustrated). Then, after removal of the sacrificial gates, additional removal of the portions 1005 over a remaining width along X can be performed from the openings 501 opening onto the second side of the peripheral portions 312. In this case, the sacrificial gates first form a support during the first partial removal of the SiGe interposed between the sources, then, by removing them, these sacrificial gates allow access for the second additional removal of the SiGe interposed between the sources. This two-step replacement via the sacrificial gates allows, for example, to dimension the sources so that they have a width comprised between 1 time and 2 times the critical collapse width of the sources, that is to say the width beyond which the sources are likely to collapse.

Figure 11D:
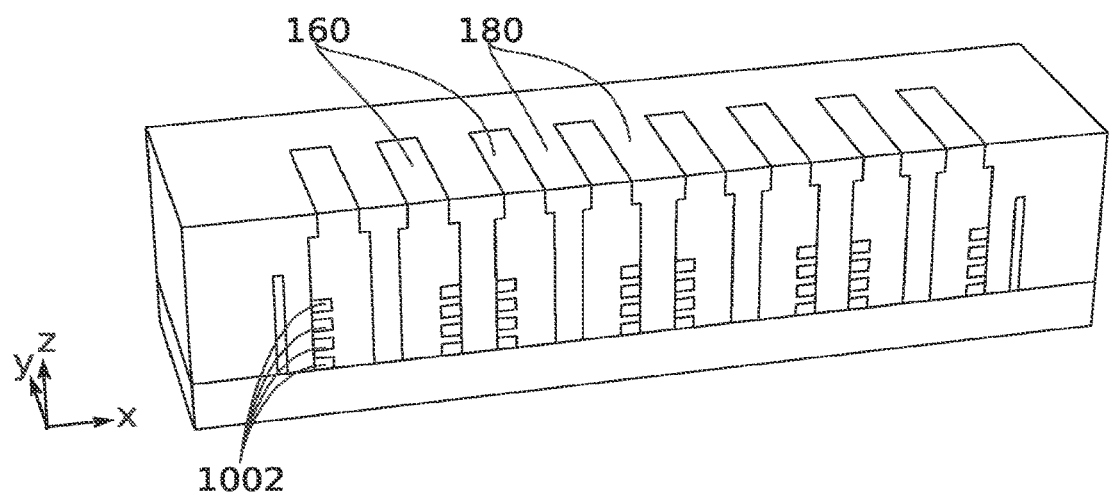

After removing the sacrificial gates in the sourceline area 3, the openings 501 are preferably filled with a SiN deposition 160. This deposition is followed by planarisation by CMP with stopping on the layer of TEOS oxide 180, as shown in FIG. 11D.

The sources 1002 are thus completely insulated from each other in the sourceline areas 3.

Figure 12:
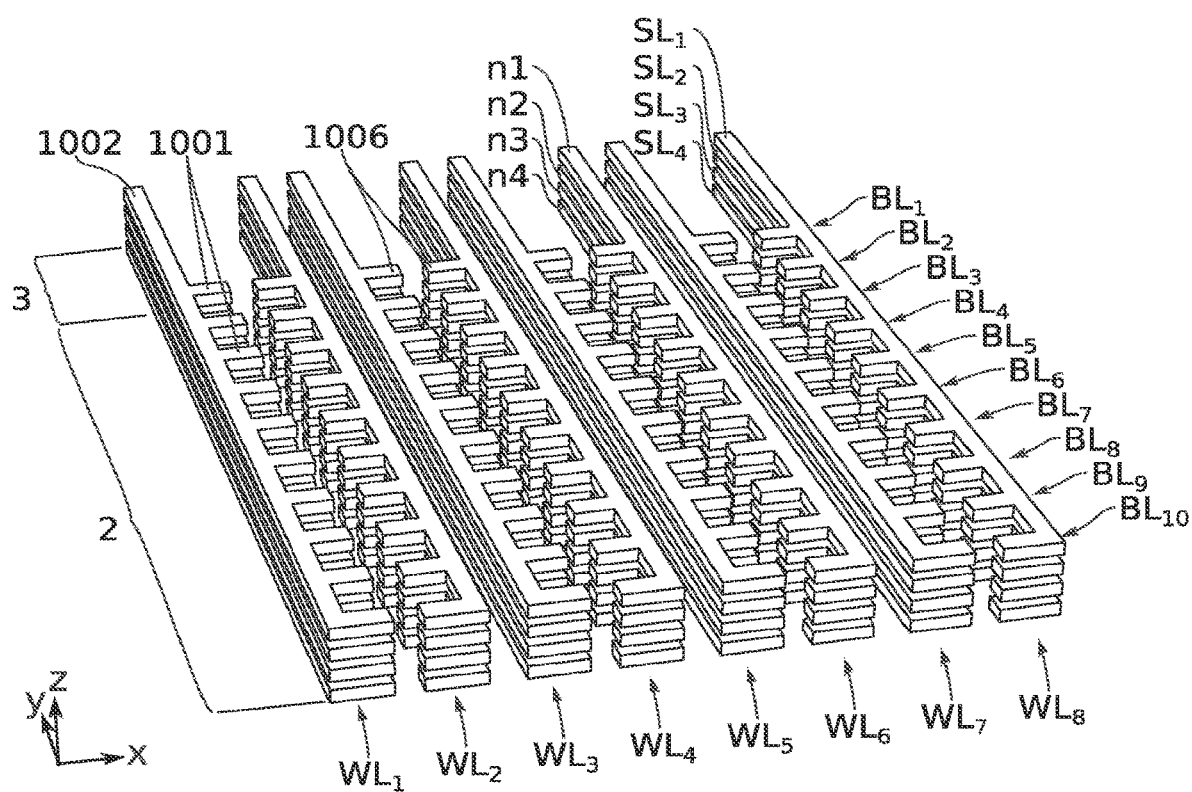
FIG. 12 is a schematic view of the silicon sources and channels of a microelectronic system according to a first embodiment of the present invention.

FIG. 12 shows only the Si-based elements of the structure. The sources 1002 serving the transistor channels 1001 in the bitline area 2, in the shape of combs, are thus clearly visible. This silicon "skeleton" can in particular allow to form a 3D array comprising 8 wordlines $WL_1$, $WL_2$, $WL_3$, $WL_4$, $WL_6$, $WL_6$, $WL_7$, $WL_8$, 4 levels n1, n2, n3, n4 of sourcelines $SL_1$, $SL_2$, $SL_3$, $SL_4$ and 10 bitlines $BL_1$, $BL_2$, $BL_3$, $BL_4$, $BL_6$, $BL_6$, $BL_7$, $BL_8$, $BL_9$, $BL_{10}$).

Structuring of the Wordline Area

Figure 13A:
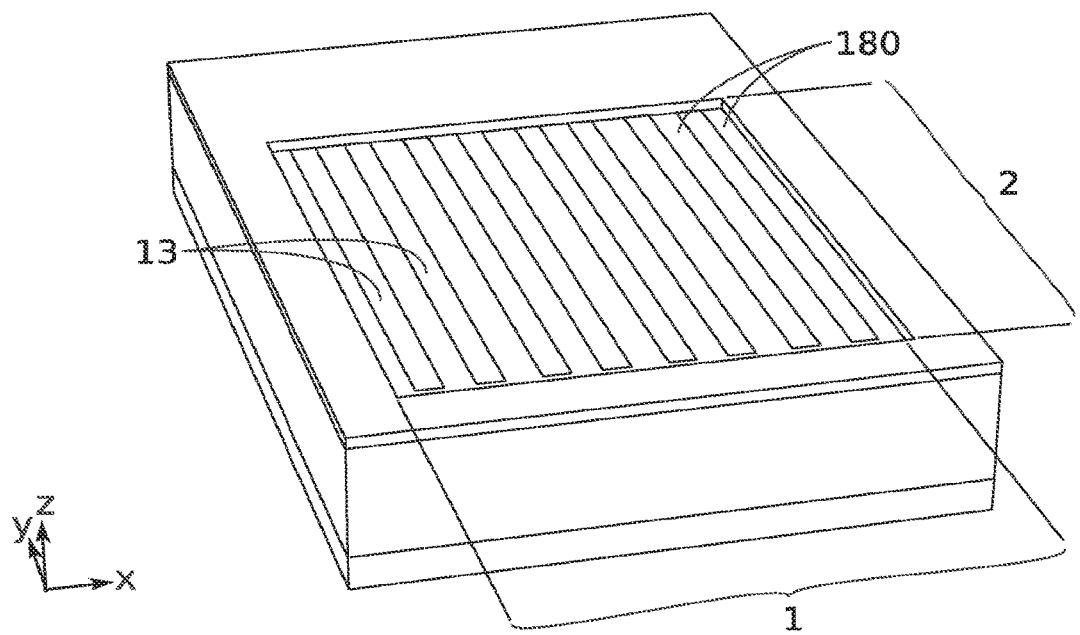
FIGS. 13A to 13F schematically illustrate in three-quarter view steps of manufacturing the wordline area of a microelectronic system according to a first embodiment of the present invention.

FIG. 13A illustrates a masking, for example by lithography, allowing to protect the sourceline area 3 while exposing the wordline area 1. In the following, the WL are carried out at the hard mask lines 13.

Figure 13B:
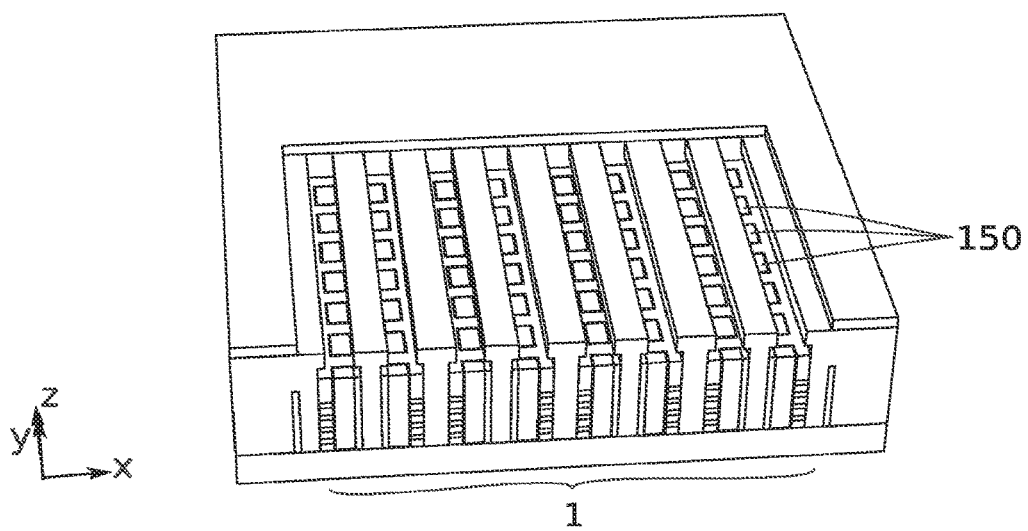

As illustrated in FIG. 13B, an etching of the hard mask 13 is carried out so as to expose the polySi of the sacrificial gates 150 of the wordline area 1. This etching of the SiN hard mask 13 can be done by plasma, for example using CH2F2/O2, or CHF3/He and CH3F/O2/He/CH4 plasma chemistry.

Figure 13C:
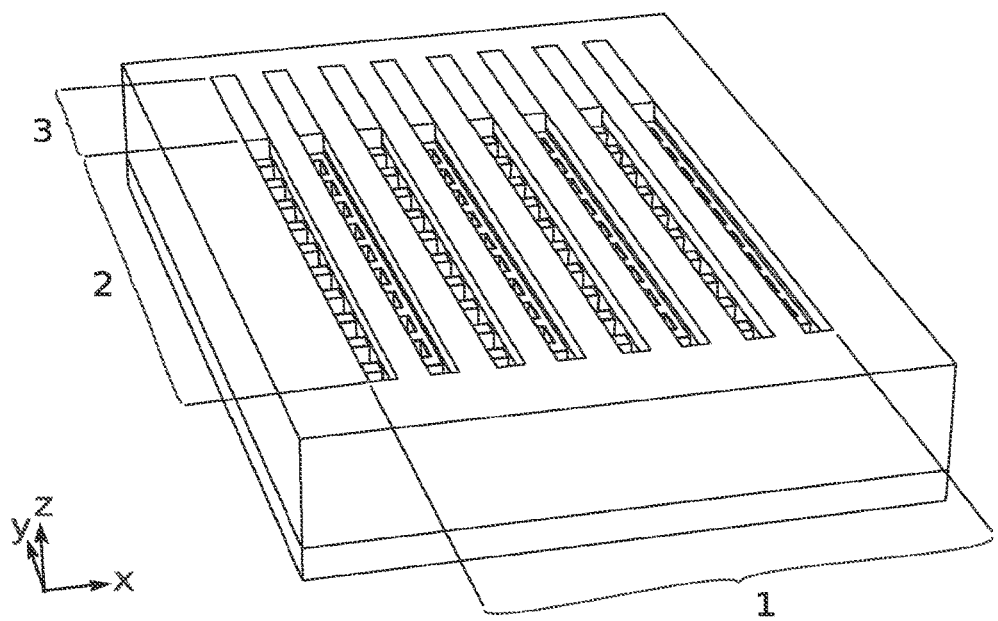
Figure 13D:
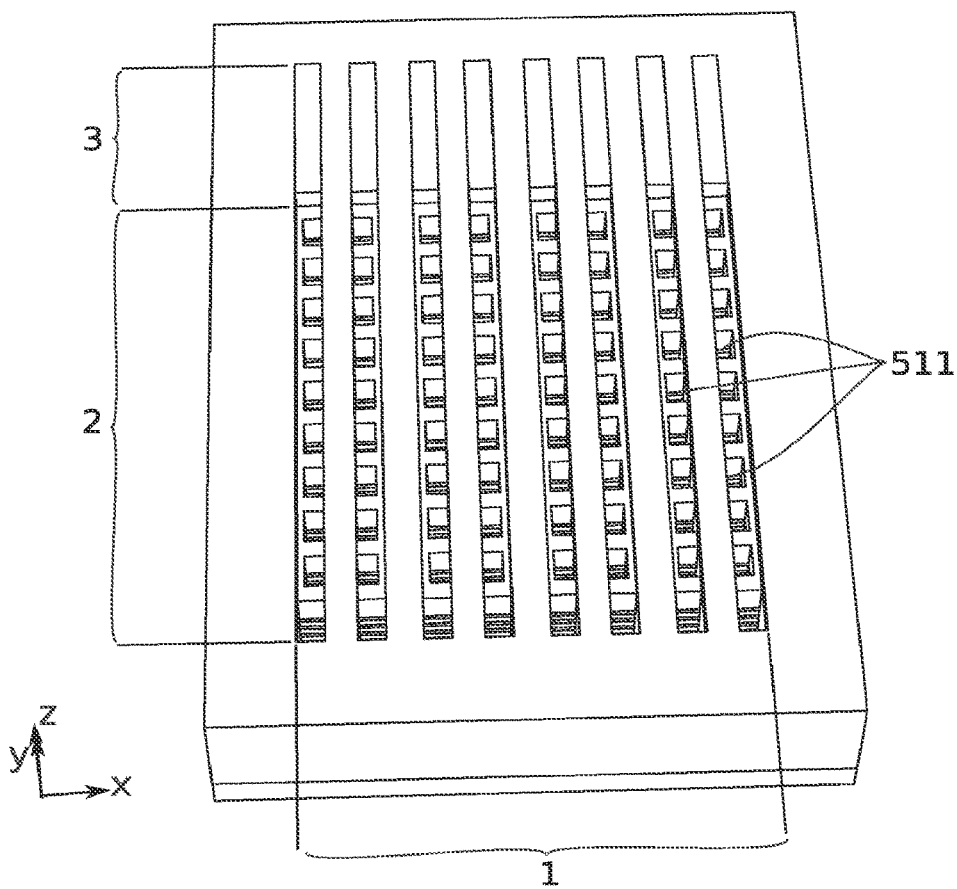

The sacrificial gates 150 of the wordline area 1 are then removed, as illustrated in FIGS. 13C, 13D. The polySi of the sacrificial gates can be etched using a solution of tetramethylammonium hydroxide (TMAH) or tetraethylammonium hydroxide (TEAH) (FIG. 13C). The TEOS oxide of the sacrificial gates can be etched using a fluorocarbon chemistry plasma, for example CF4/CH2F2/He chemistry plasma (FIG. 13D).

In the example illustrated in FIG. 13D, the removal of the sacrificial gates 150 forms openings 511. These openings 511 are bordered by two peripheral portions 112 of transistor patterns 101M, a first side of peripheral portions 312 comprising the stack of sources 1002 insulated from each other, and a spacer $170_C$ (not visible).

The peripheral portions 112 of transistor patterns 101M here each comprise a part 112a formed of a stack of Si nanowires between which are located SiGe portions 1003, and a part 112b formed of a stack of Si nanowires between which are located SiN plugs 1004.

Figure 13E:
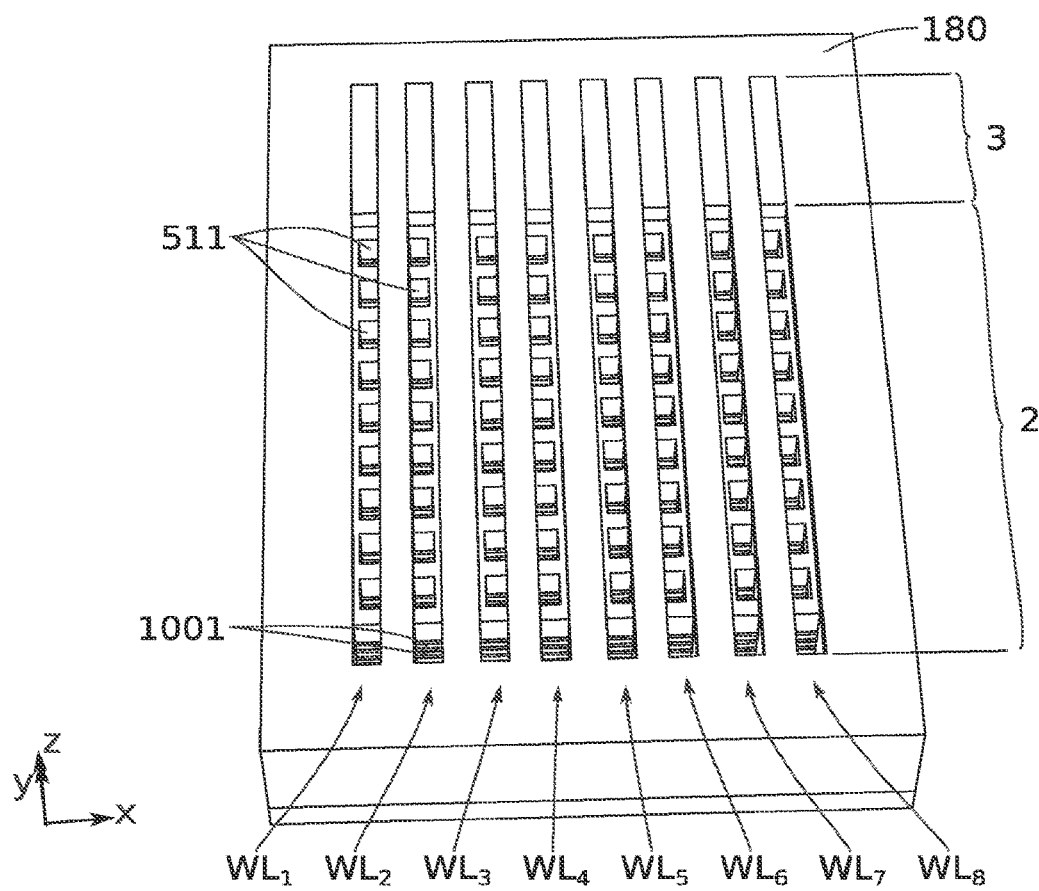

FIG. 13E illustrates the selective etching of the SiGe portions 1003. This allows to form a second space which will then be filled so as to form a functional gate. This etching has good selectivity $S_{SiGe:Si}$ relative to Si, preferably $S_{SiGe:Si}>5:1$. This allows to etch the SiGe while preserving the Si nanowires and the parts of the sources 1002 exposed at the first side of the peripheral portions 312. This etching also has good selectivity $S_{SiGe:SiN}$ relative to SiN, preferably $S_{SiGe:SiN}>5:1$. This allows to etch the SiGe while preserving the SiN spacers $170_C$ and the plugs 1004. The etching is thus confined along the WL, being stopped laterally by the SiN spacers $170_C$ and the first side of the peripheral portions 312.

At the end of the etching, the channels 1001 of the Si transistors are suspended between the openings 511 of the same wordline $WL_x$ (x=1 . . . 8) (FIG. 13E).

Figure 13F:
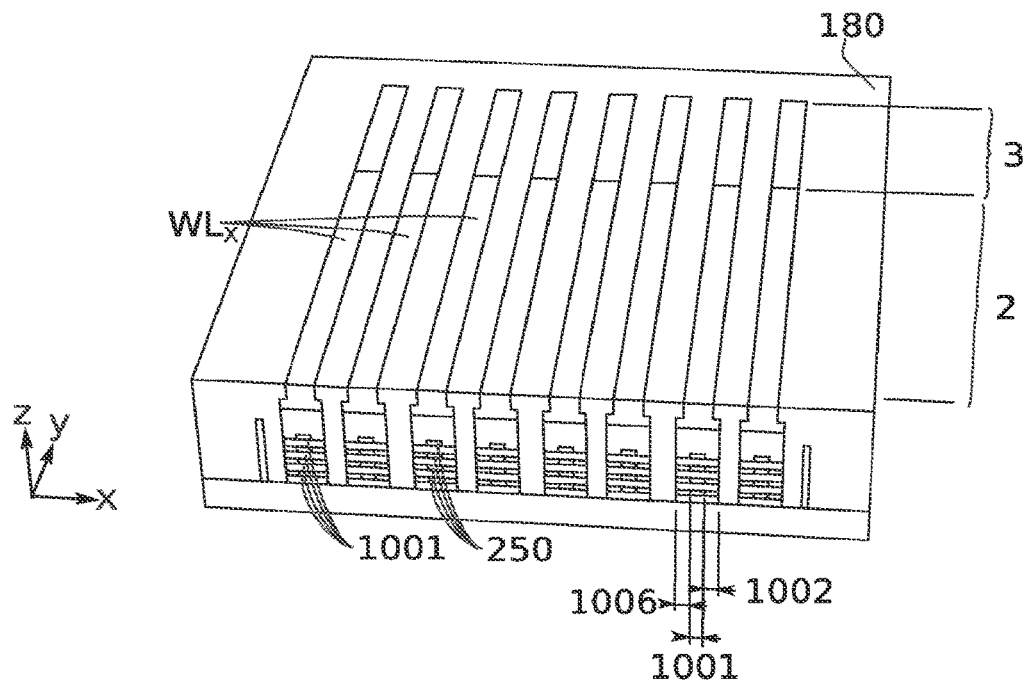

FIG. 13F illustrates the formation of the functional gates in the place of the sacrificial gates. Successive depositions of materials used for the formation of functional gates allow to form the functional gates 250 around each channel 1001. These functional gates can be formed from a deposition of material with a high dielectric constant called high-k, for example HfO2 over a thickness of 2 nm, followed by a deposition of TiN over a thickness of 3 nm, followed by a deposition of tungsten W aiming at filling the openings 511 and the wordlines WLx delimited by the TEOS oxide 180. A planarisation by CMP with stopping on the TEOS oxide 180 allows to remove the excess metal layers if necessary. The wordlines WLx (x=1 . . . 8) are thus defined. The transistors of the 3D array are therefore MOS transistors with a gate-all-around (Gate-All-Around) based on stacked Si nanowires.

FIG. 13F allows to distinguish in section the sources 1002 of the transistors, the channels 1001 surrounded by the gates-all-around 250, and nanowire parts forming the drains 1006 of the transistors. The sources 1002 extend along Y to the sourceline area 3. The drains 1006 extend along X to the opening areas 301 filled with oxide 180.

Structuring of the Bitline Area

The next step is to remove the oxide 180 from the opening areas 301, so as to access the drains 1006 of the transistors.

Figure 14A:
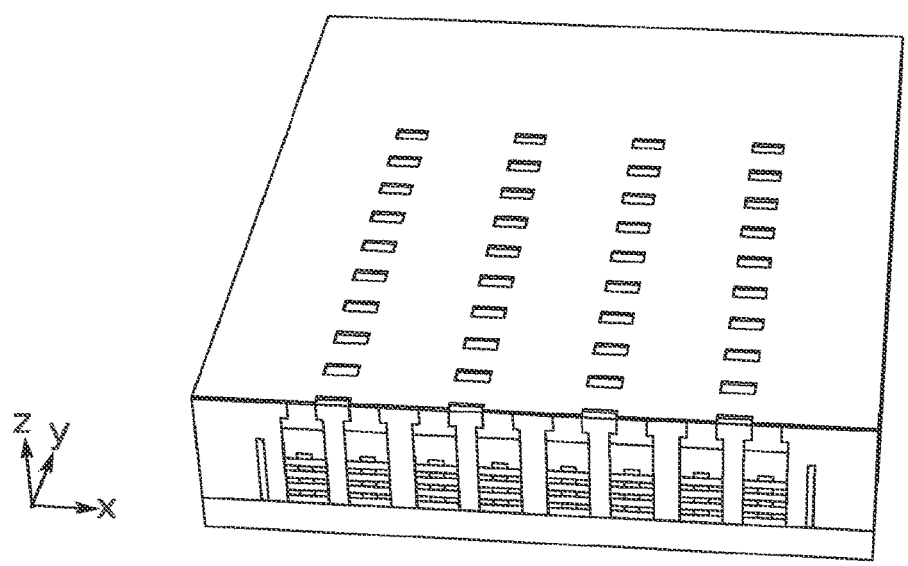
FIGS. 14A to 14C schematically illustrate steps of a method for manufacturing the data line area of a microelectronic system according to a first embodiment of the present invention.
Figure 14B:
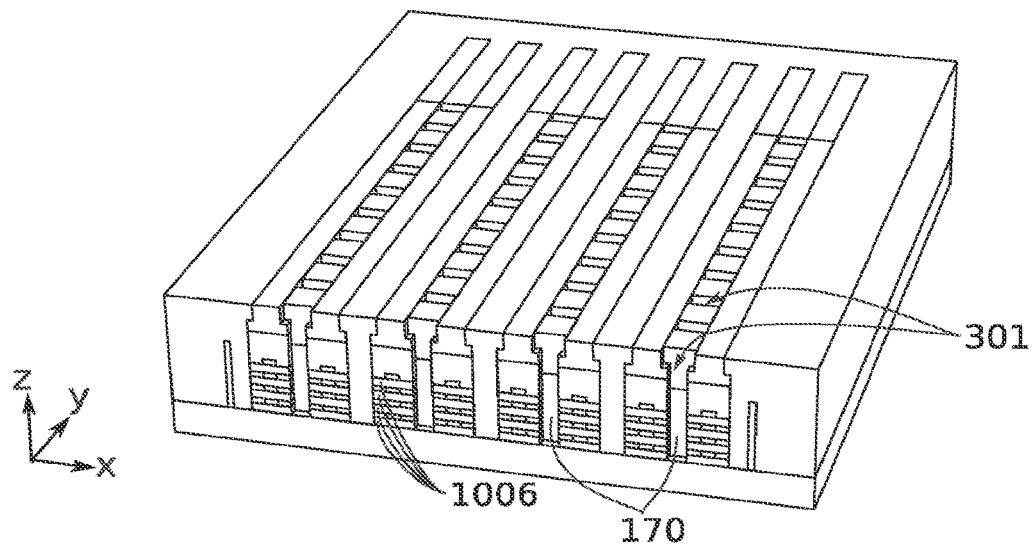

FIG. 14A illustrates a lithography step prior to the etching of the oxide 180 at the openings 301. Advantageously, the alignment constraints linked to this lithography step are reduced thanks to the presence of the spacers 170 embedded in the oxide 180. A selective etching of the oxide 180 relative to the nitride SiN of the spacers 170 therefore allows to "automatically" expose the openings 301 opening onto the drains 1006, as illustrated at FIG. 14B. The subsequent formation of the resistive elements of the memory points precisely at the openings 301 is thus advantageously assisted by the presence of the spacers 170 defining the openings 301. This step of lithography/etching of the oxide 180 intended to open the areas of memory points is said to be "self-aligned", due to the presence of spacers 170 guiding the etching of the oxide 180.

Figure 14C:
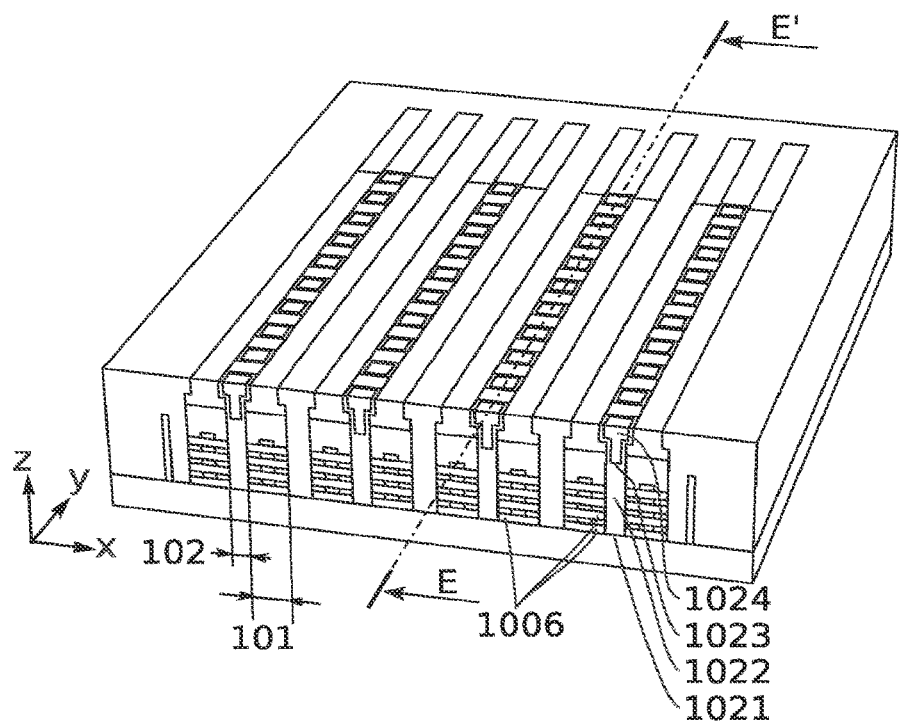
Figure 15:
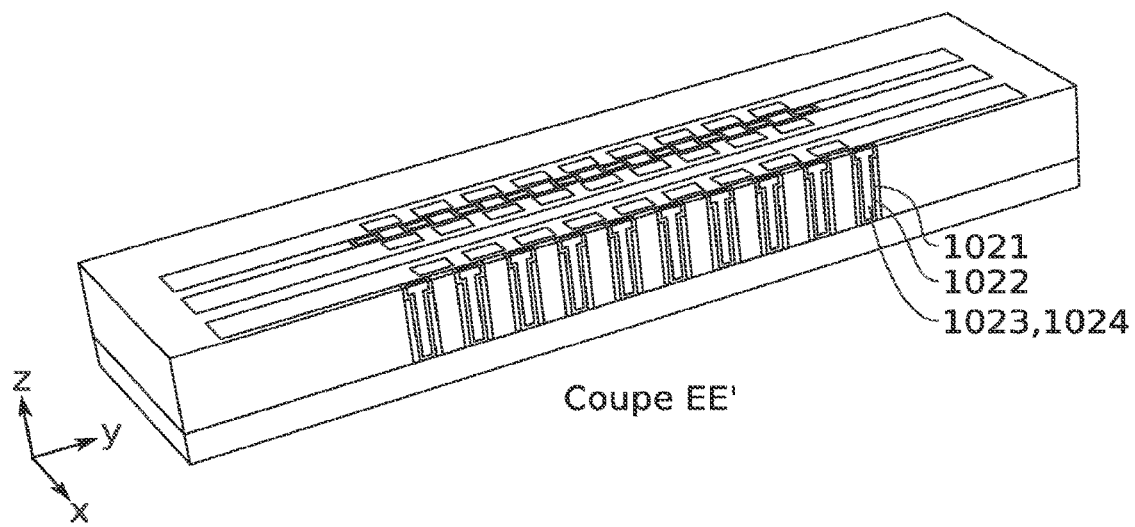
FIG. 15 schematically illustrates the step of the manufacturing method illustrated in FIG. 14C in a longitudinal section EE shown in FIG. 14C.

After etching the oxide 180, the openings 301 are filled by successive depositions so as to form the memory elements or memory points 102, as illustrated in FIGS. 14C and 15, respectively in a cross section and a longitudinal section. In the case of an OxRAM type resistive memory, these memory points can be based on HfO2. For example, these memory points can be produced by a deposition of an HfO2 layer 1021, for example with a thickness of 5 nm, followed by a deposition of a Ti layer 1022, for example with a thickness of 5 nm, followed by a deposition a TiN layer 1023, for example with a thickness greater than 5 nm, followed by a deposition of a W layer 1024, for example with a thickness of 300 nm. The W layer 1024 can typically extend outside the openings 301. It is then planarised by CMP with stopping on the oxide layer 180.

The memory points 102 thus formed are directly in contact with the drains 1006 of the selection transistors. According to one possibility, the drains 1006 can be silicided beforehand before the deposition of the layers forming the memory elements 102. The self-alignment of the memory points with the drains 1006 of the selection transistors allows in particular to bring these two elements forming a resistive memory cell together. This allows to increase the density of resistive memory cells within the 3D array.

In particular, each memory element 102 has an edge or sidewall in contact with an edge or sidewall of a spacer $170_C$ surmounting the stack forming the drains of the transistors. These edges or sidewalls extend mainly in planes parallel to the plane yz.

Formation of the Contacts

Figure 16A:
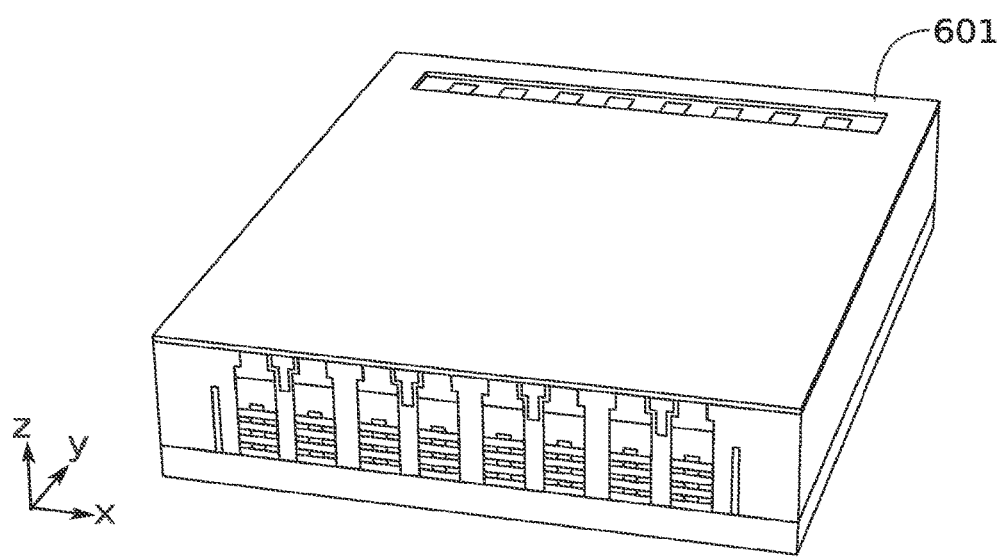
FIGS. 16A to 16D schematically illustrate steps of a method for manufacturing the source line area of a microelectronic system according to a first embodiment of the present invention, for producing stepped contacts.

FIG. 16A illustrates a lithography step aiming at forming contacts in the sourceline area 3 of the 3D array. The contacts to be formed in the sourceline area 3 are preferably stepped contacts. A sequence of lithography/etching steps then allows, in a known manner, to form such stepped contacts, on each of the source levels. Typically, a first line 601 of contact patterns is defined by lithography (FIG. 16A).

Figure 16B:
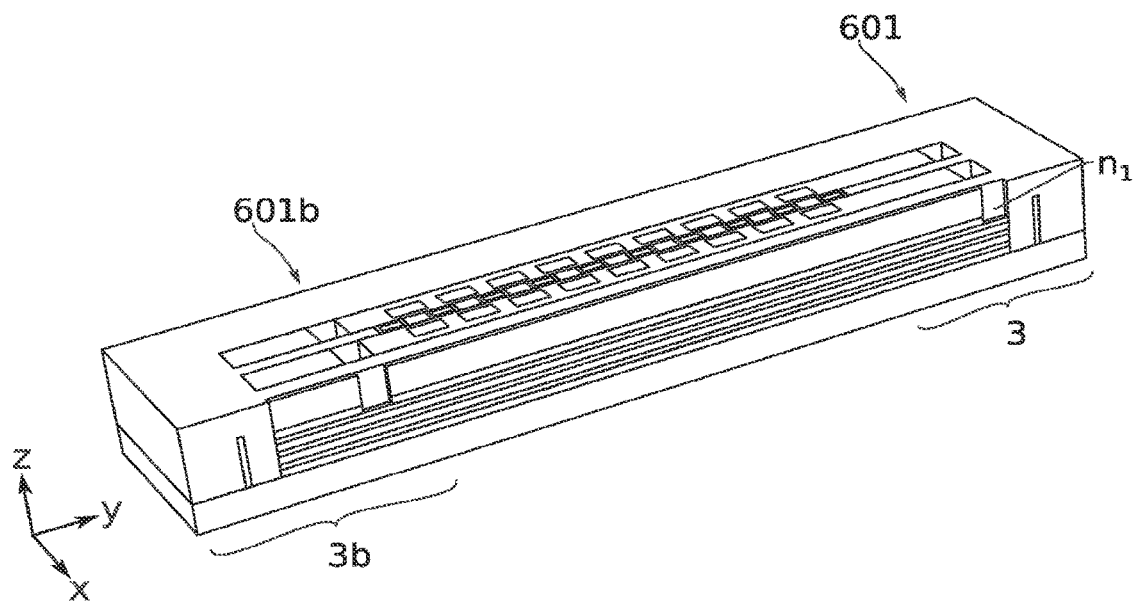

A first etching configured to reach and etch the first source level n1 is then carried out (FIG. 16B).

Figure 16C:
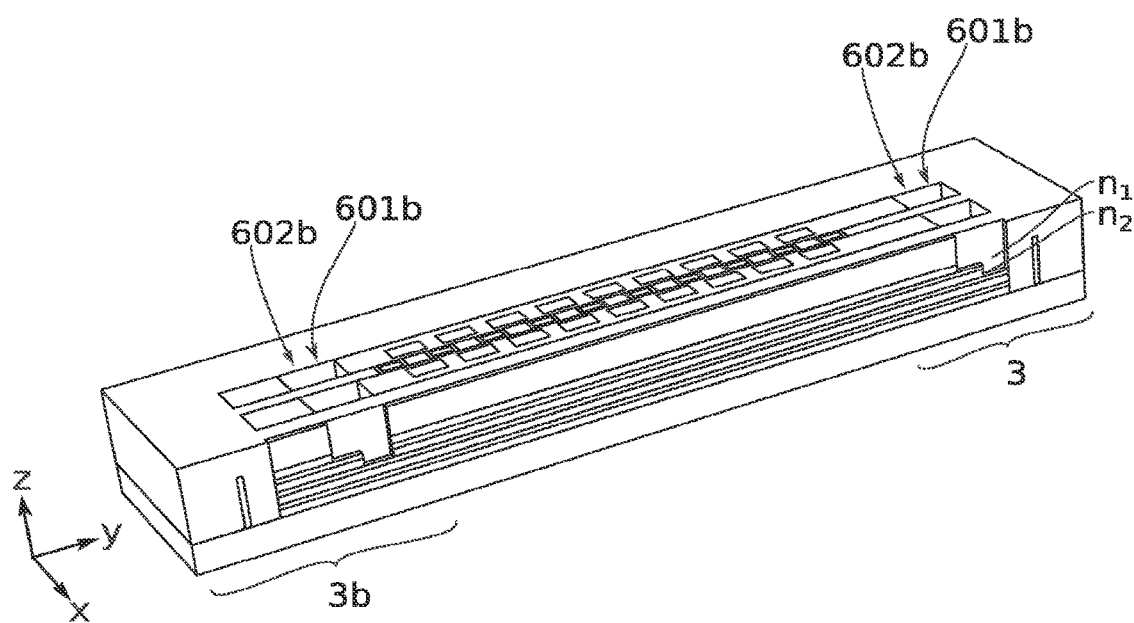

A second lithography can then allow to define a second line 602 of contact patterns, while keeping the first line 601 exposed. A second etching similar to the first etching is carried out. This allows to simultaneously reach and etch the first source level n1 at the second line 602 and the second source level n2 at the first line 601 (FIG. 16C).

A third lithography can then allow to define a third line 603 of contact patterns, while keeping the first and second lines 601, 602 exposed. A third etching similar to the first and second etchings is carried out. This allows to simultaneously reach and etch the first source level n1 at the third line 603, the second source level n2 at the second line 602 and the third source level n3 at the first line 601 (FIG. 16D).

Figure 16D:
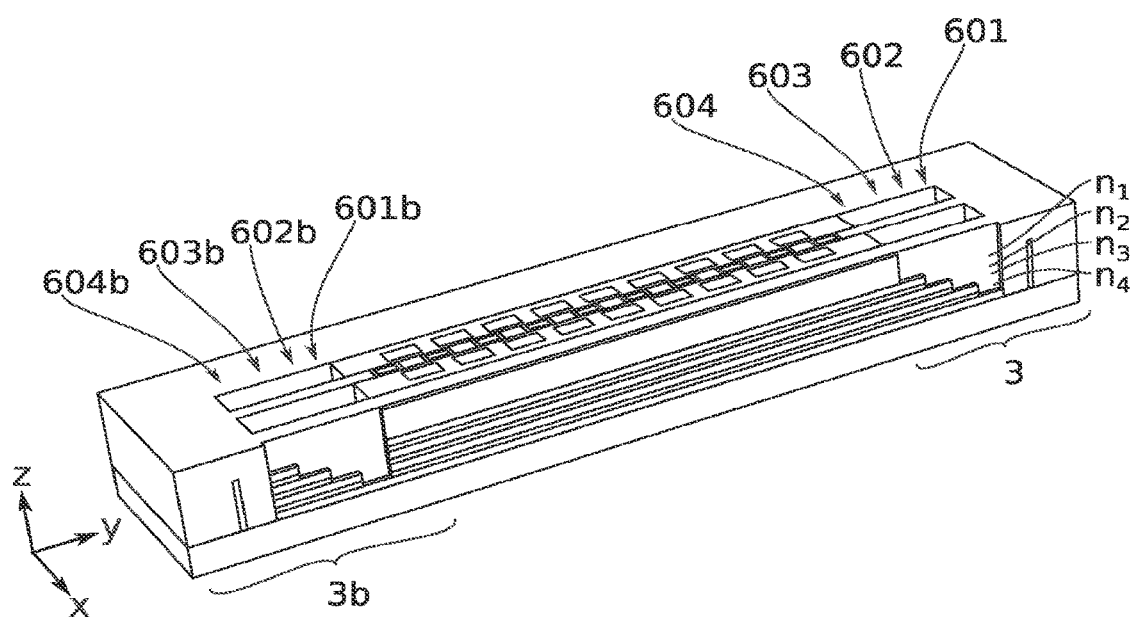

In the example illustrated here comprising 4 source levels n1, n2, n3, n4, a fourth and last lithography/etching allows to reach and expose the first source level n1 at a fourth line 604 (FIG. 16D).

The 4 source levels n1, n2, n3, n4 are thus respectively exposed in a stepped manner at the lines 604, 603, 602, 601. Then, this allows to form stepped contacts allowing to independently connect the various source levels.

The source levels n1, n2, n3, n4 can be exposed via lines 604, 603, 602, 601 in the sourceline area 3, and optionally via lines 604b, 603b, 602b, 601b in another sourceline area 3b as illustrated in FIGS. 16B to 16D.

According to one possibility, the reduction in dimension of the resin used during lithography/etching, conventionally called "trimming", can advantageously be used to reduce the number of lithography steps.

After having etched the various Si/SiN layers to access the source levels, a nitride layer 701 with a thickness comprised between 5 nm and 20 nm, for example around 10 nm, is deposited in the sourceline areas 3, 3b. A thick SiO2 oxide layer 702 is then deposited over the entire structure and planarised by CMP, as shown in FIG. 17A.

Figure 17A:
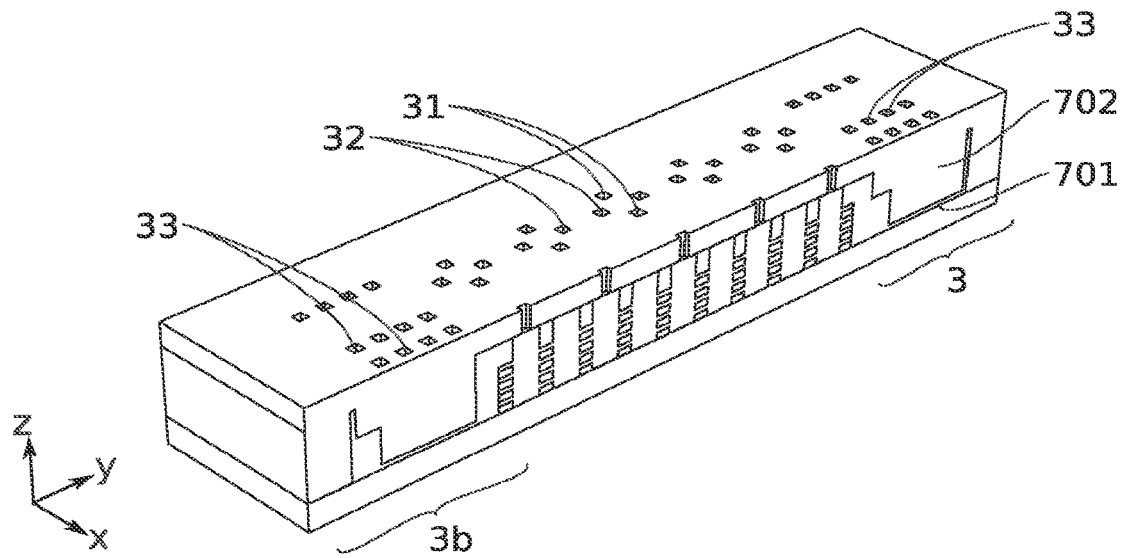
FIGS. 17A and 17B schematically illustrate steps of a method for manufacturing a microelectronic system according to a first embodiment of the present invention.

The contact holes 31, 32, 33 are then formed by lithography/etching through the oxide layer 702 (FIG. 17A). The contact holes 31 are dedicated to the connection of the wordlines with the gates of the selection transistors. The contact holes 32 are dedicated to the connection of the bitlines with the memory points. The contact holes 33 are dedicated to the connection of the sourcelines with the sources of the selection transistors.

The nitride layer 701 is used as a stop layer for the etching of the contact holes 33 in the sourceline areas 3, 3b. The tungsten layers of the functional gates and memory points are used as a stop layer for the etching of the contact holes 31, 32. The nitride layer 701 is then etched at the contact holes 33 to expose the silicon of the sources.

Figure 17B:
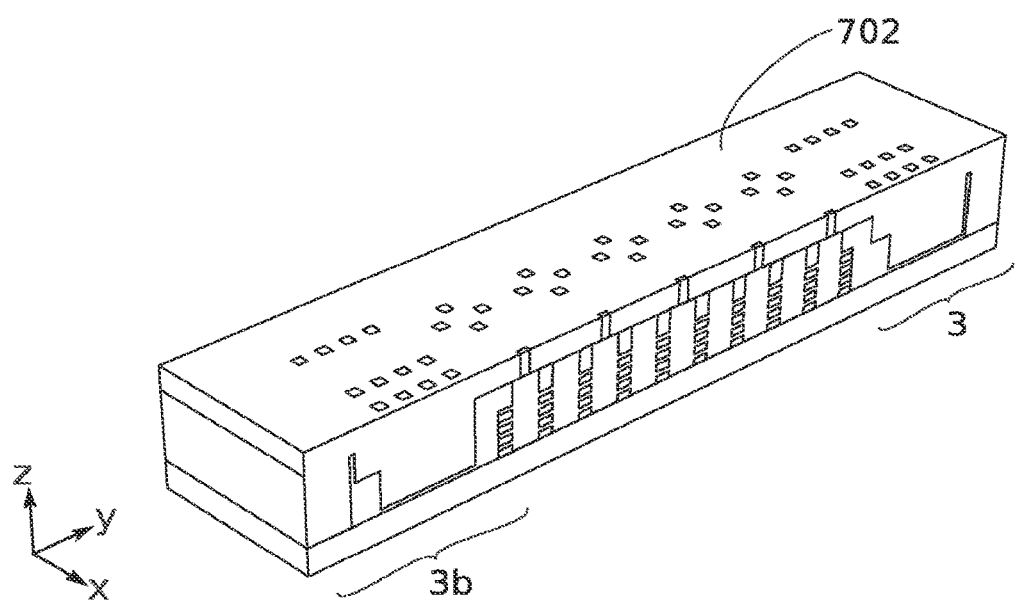

The contacts are then formed by filling the contact holes 31, 32, 33 by successive depositions of TiN which is approximately 7 nm thick and tungsten W which is approximately 200 nm thick. A planarisation by CMP with stopping on the oxide layer 702 allows to obtain a 3D array of integrable memory cells, as illustrated in FIG. 17B.

Figure 18:
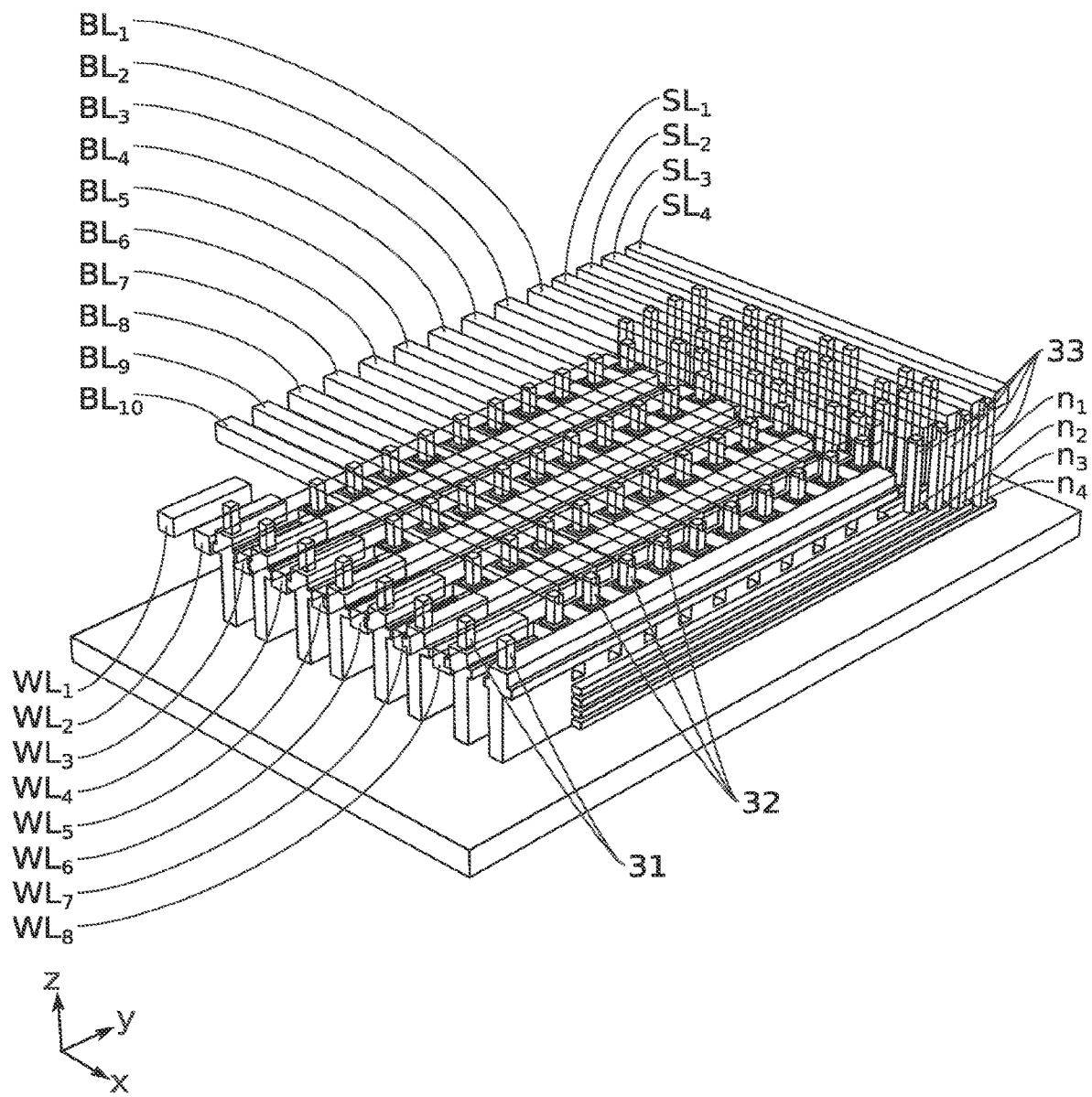
FIG. 18 schematically illustrates in three-quarter view a microelectronic system according to a first embodiment of the present invention.

FIG. 18 shows such a 3D array of memory cells without the layer 702, for greater clarity. The sourceline $SL_1$, $SL_2$, $S_3$, $S_4$, wordline $WL_1$, $WL_2$, $WL_3$, $WL_4$, $WL_5$, $WL_6$, $WL_7$, $WL_8$ and bitline $BL_1$, $BL_2$, $BL_3$, $BL_4$, $BL_5$, $BL_6$, $BL_7$, $BL_8$, $BL_9$, $BL_{10}$ contact lines are also visible in transparency in this FIG. 18. The contacts 31, 33 illustrated here correspond to another possibility of integrating the 3D array, slightly different from that illustrated by FIGS. 17A, 17B. Obviously, these contacts can be defined according to different organisational plans, depending on the integration constraints.

A second exemplary embodiment of an OxRAM type resistive memory will now be described with reference to FIGS. 19 to 57 in the following section. Only the distinct features of the first exemplary embodiment are described in detail below, the other features not described or partially described being deemed to be substantially identical to those of the first exemplary embodiment.

Example 2

In this example, some manufacturing steps are reversed relative to the sequence of steps of the first exemplary embodiment. This allows to reduce the total number of steps. This also allows to simplify the technical production of some parts of the 3D memory.

As before, thin SiGe 11 and Si 12 layers are alternately formed by epitaxy on an SOI substrate comprising a silicon support denoted BULK, a thin SiO2 oxide layer denoted BOX, and a thin Si layer denoted topSi.

Figure 19:
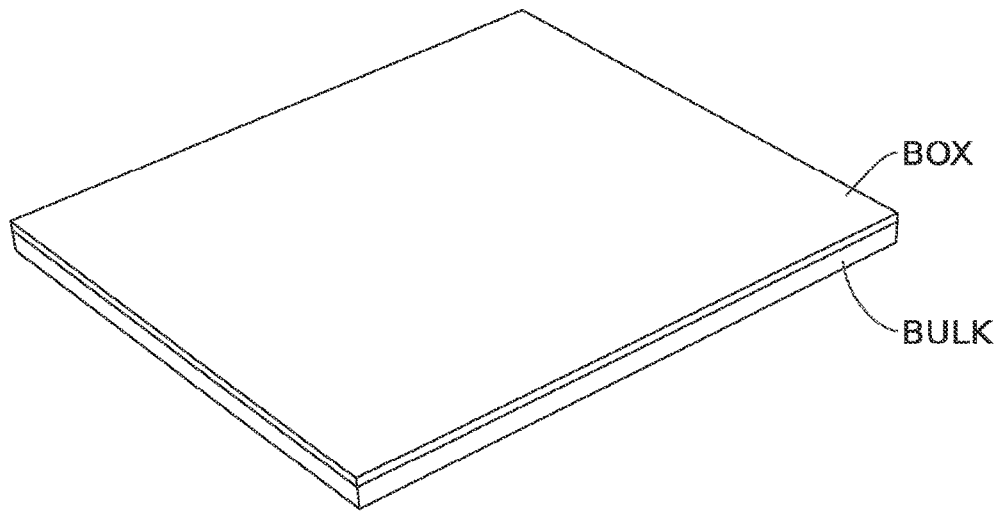
FIGS. 19 to 22 schematically illustrate in three-quarter view the steps of manufacturing a microelectronic system according to a second embodiment of the present invention.

FIG. 19 only illustrates the BULK and the BOX of the SOI substrate.

Figure 20:
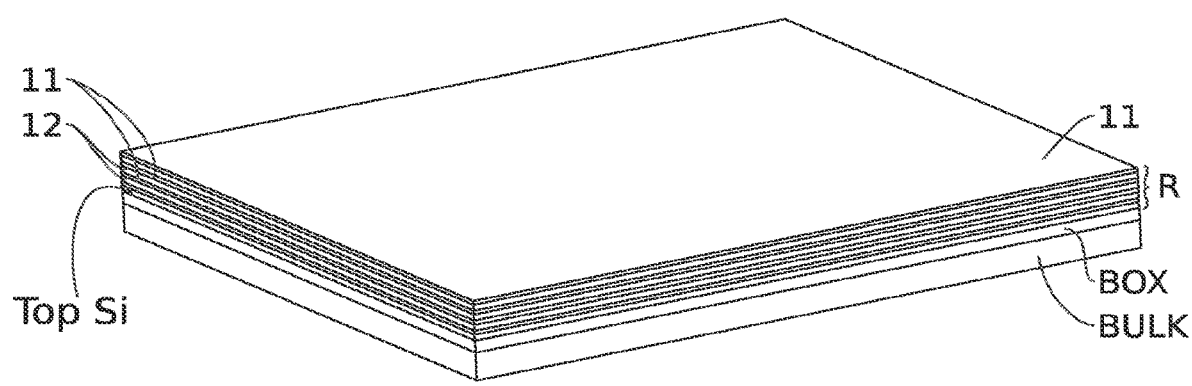

FIG. 20 illustrates the Si/SiGe super lattice denoted R comprising the topSi and the alternating SiGe 11 and Si 12 layers.

Figure 21:
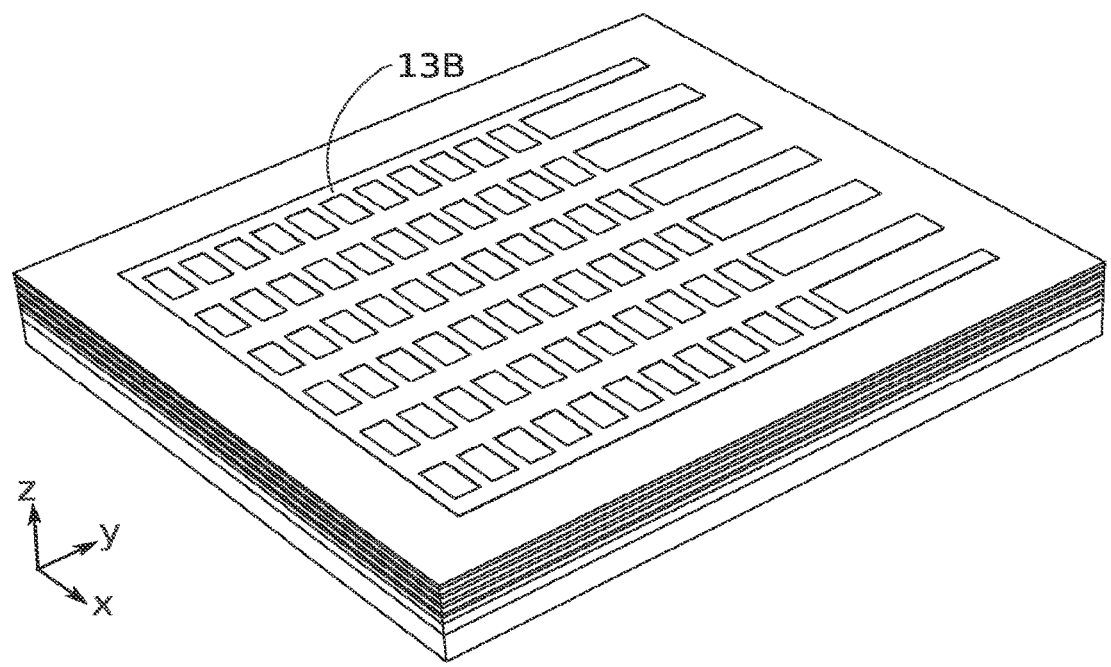

FIG. 21 illustrates a lithography step aiming at defining the various sourceline, wordline, bitline areas by a first mask 13B.

Figure 22:
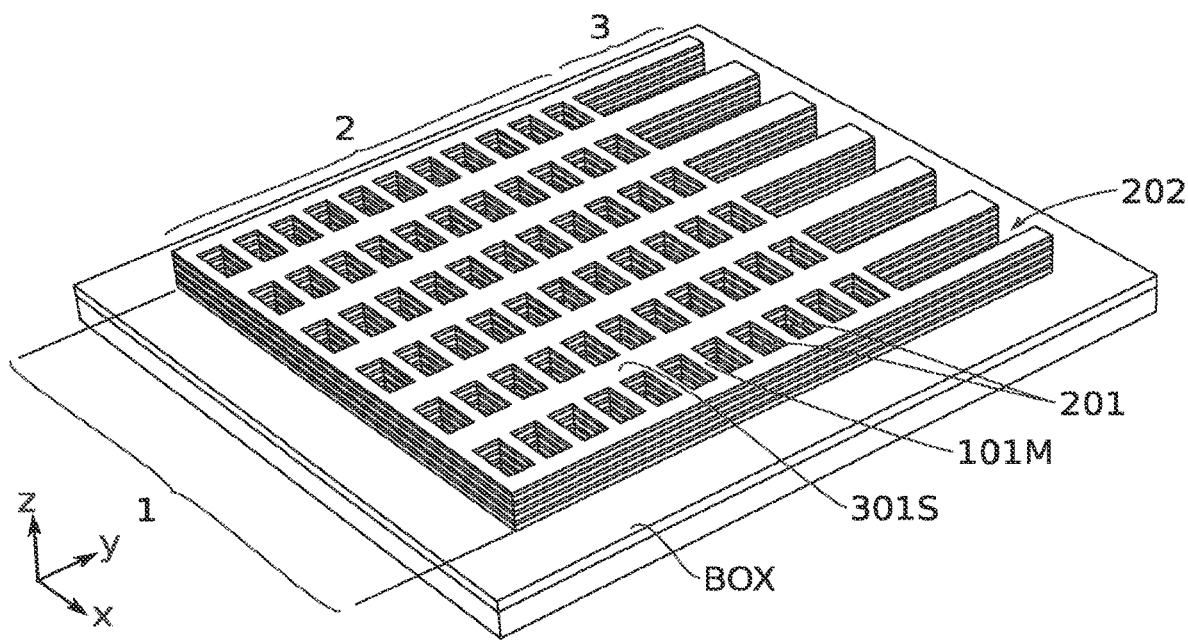

FIG. 22 illustrates the anisotropic etching along Z of stack E with stopping on the BOX. It can be carried out as above by plasma using a HBr/O2 etching chemistry. It allows to define the transistor patterns 101M, the source patterns 301S and the openings 201, 202. The openings 202 in the sourceline area 3 are significantly larger than the openings 201 of the array defined by the wordline 1 and bitline 2 areas. This allows to reserve sufficiently large locations for the formation of the sourceline contacts, in particular for the stepped sourceline contacts.

Formation of the Contacts

In this example, the formation of the stepped contacts is carried out prior to the other steps.

Figure 23:
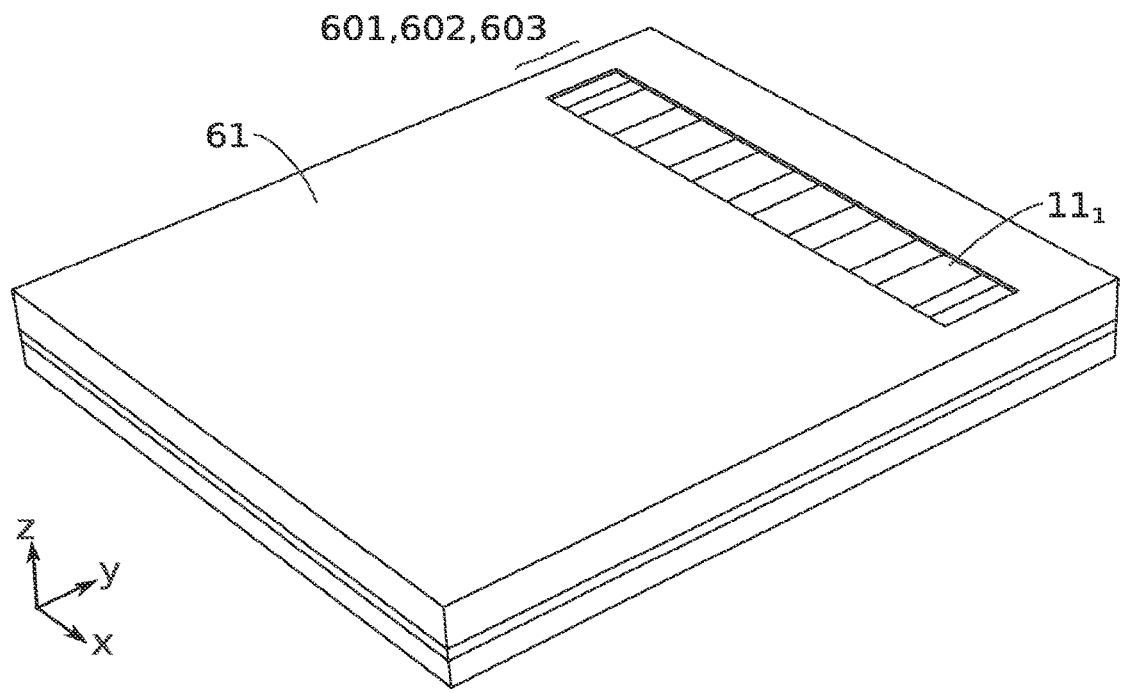
FIGS. 23 to 28 schematically illustrate steps of a method for manufacturing the source line area of a microelectronic system according to a second embodiment of the present invention, for producing stepped contacts.

FIG. 23 illustrates a lithography step aiming at forming contacts in the sourceline area 3 of the 3D array. The contacts to be formed in the sourceline area 3 are preferably stepped contacts. A sequence of lithography/etching steps then allows, in a known manner, to form such stepped contacts, on each of the source levels. Typically, a deposition of resin 61 is first carried out so as to cover all the previously structured sourceline 3, wordline 1 and bitline 2 areas. This allows to protect areas outside the area of interest for the formation of stepped contacts. A first opening in the sourceline area 3 allowing to expose the SiGe layer $11_1$ relating to the level n1, at the lines 601, 602, 603 of contact patterns, is defined by lithography (FIG. 23).

Figure 24:
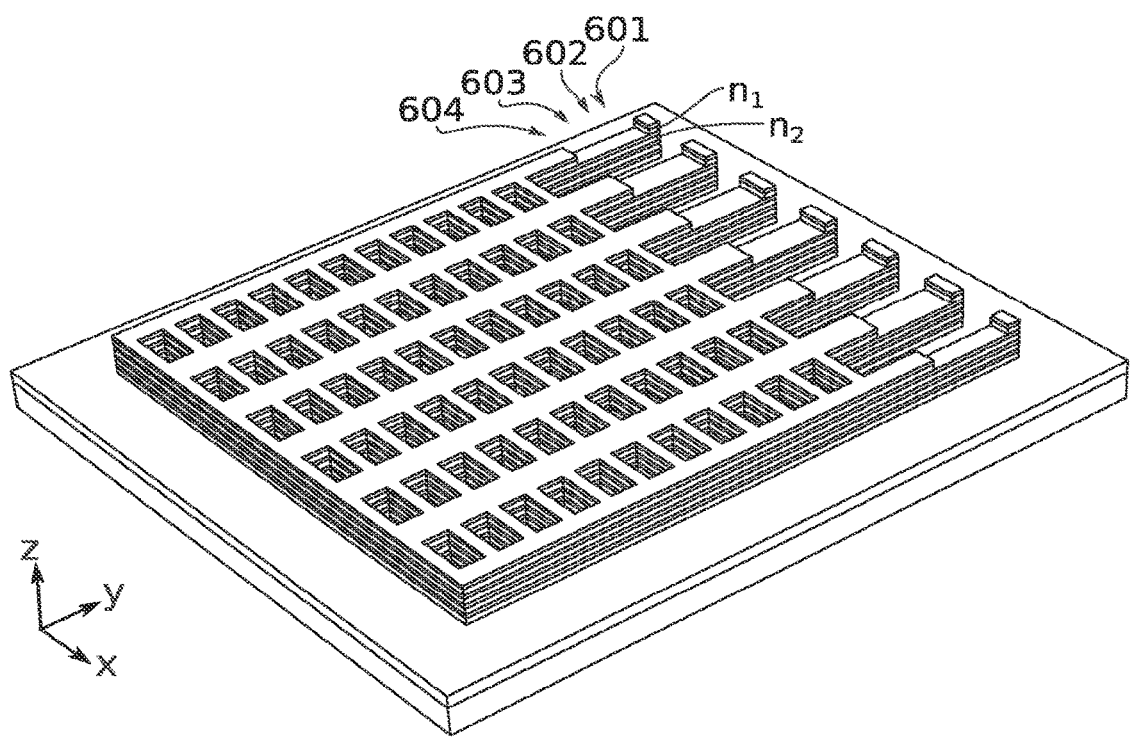
Figure 25:
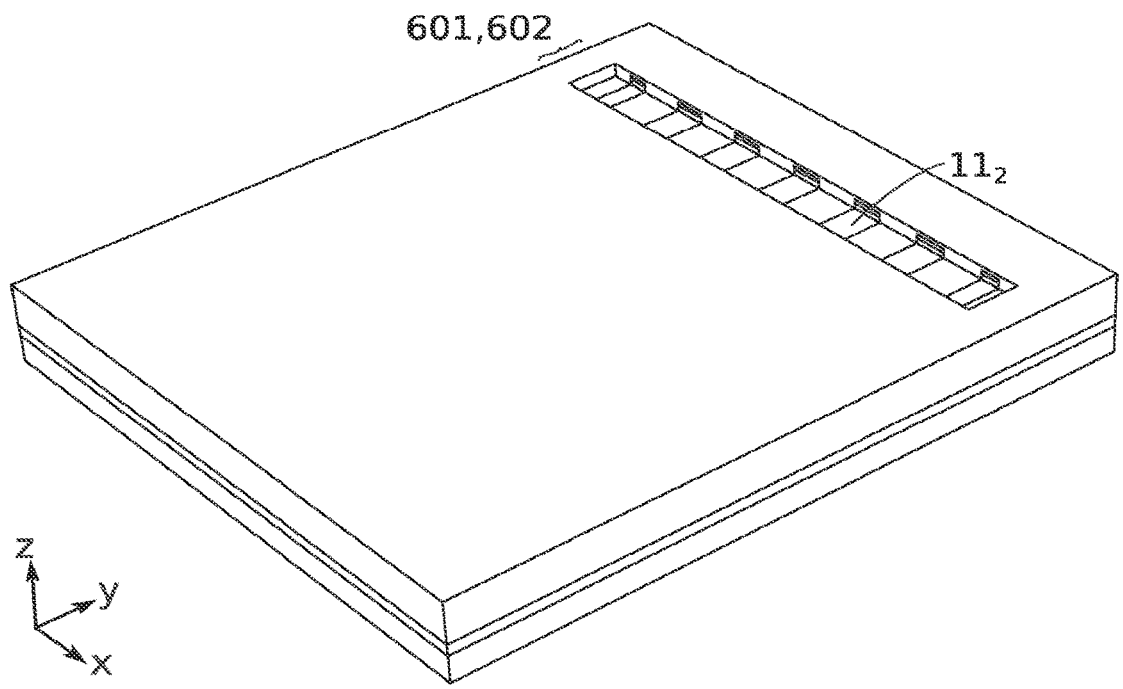

A first etching configured to reach and etch the first Si level n1 is then carried out (FIG. 24).

Figure 26:
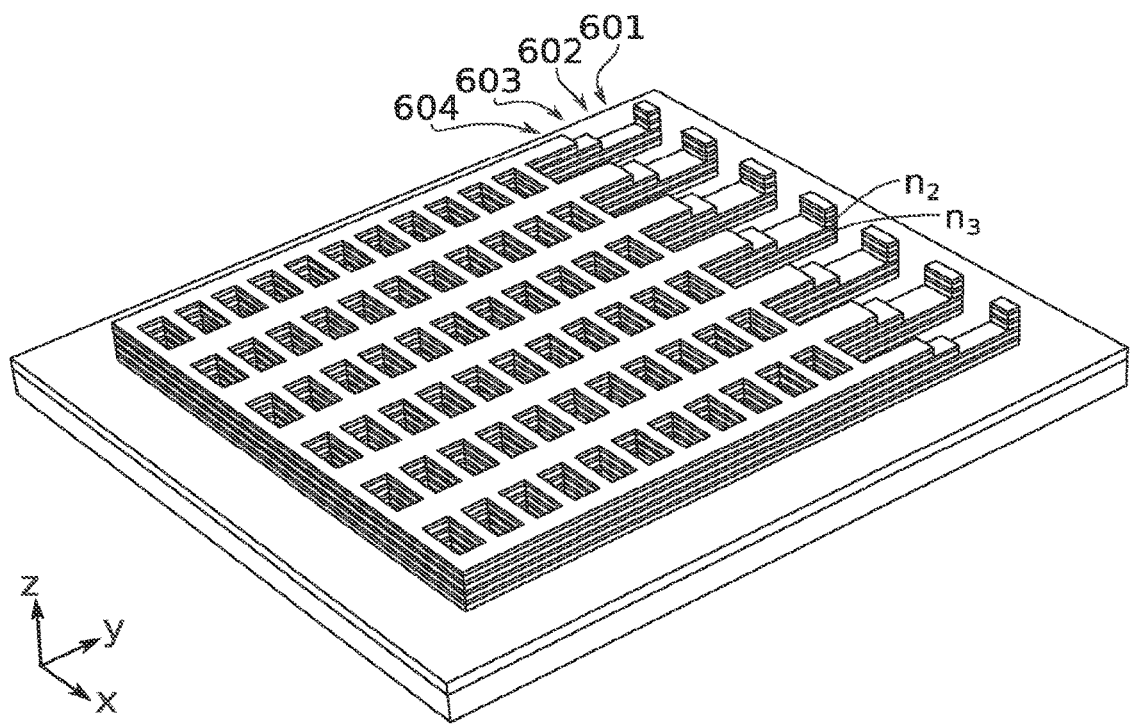
Figure 27:
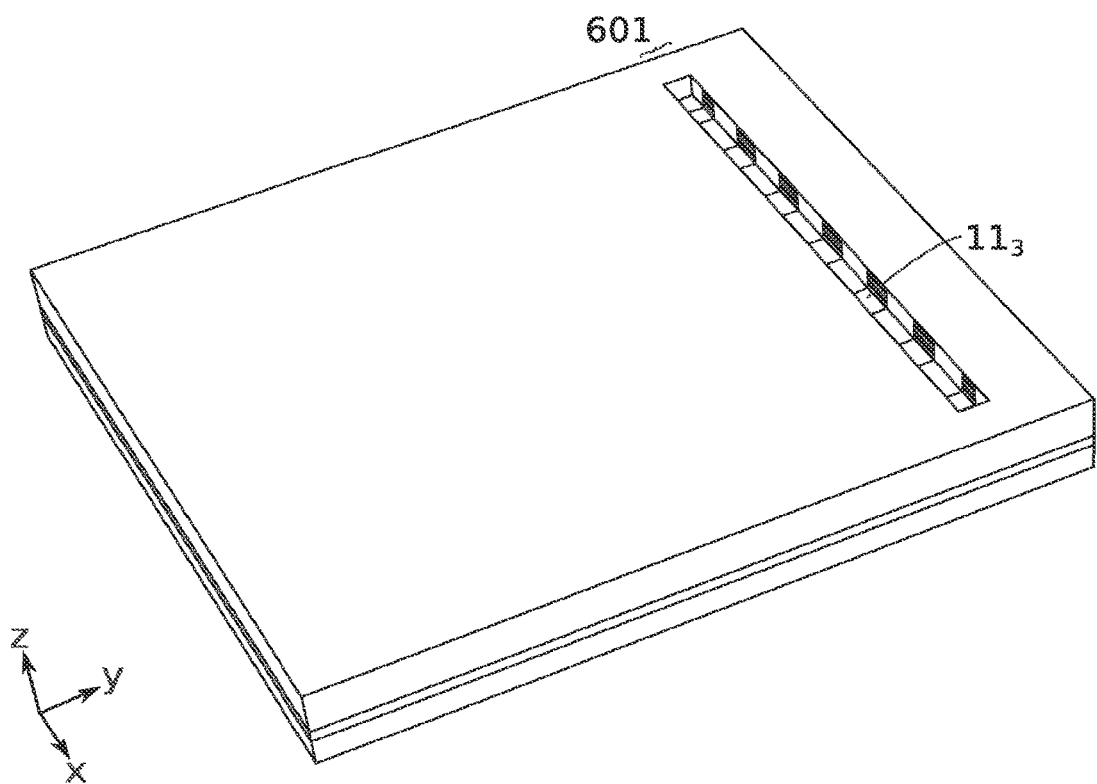

A second lithography (FIG. 25) can then define a second opening allowing to expose the SiGe layer $11_2$ relating to the level n2, at the lines 601, 602, of contact patterns. A second etching similar to the first etching is carried out. This allows to reach and etch the second Si level n2 at the lines 601, 602 (FIG. 26).

A third lithography (FIG. 27) can then define a third opening allowing to expose the SiGe layer $11_3$ relating to the level n3, at the line 601, of contact patterns. A third etching similar to the first and second etchings is carried out. This allows to reach and etch the third Si level n3 at the line 601 (FIG. 28).

Figure 28:
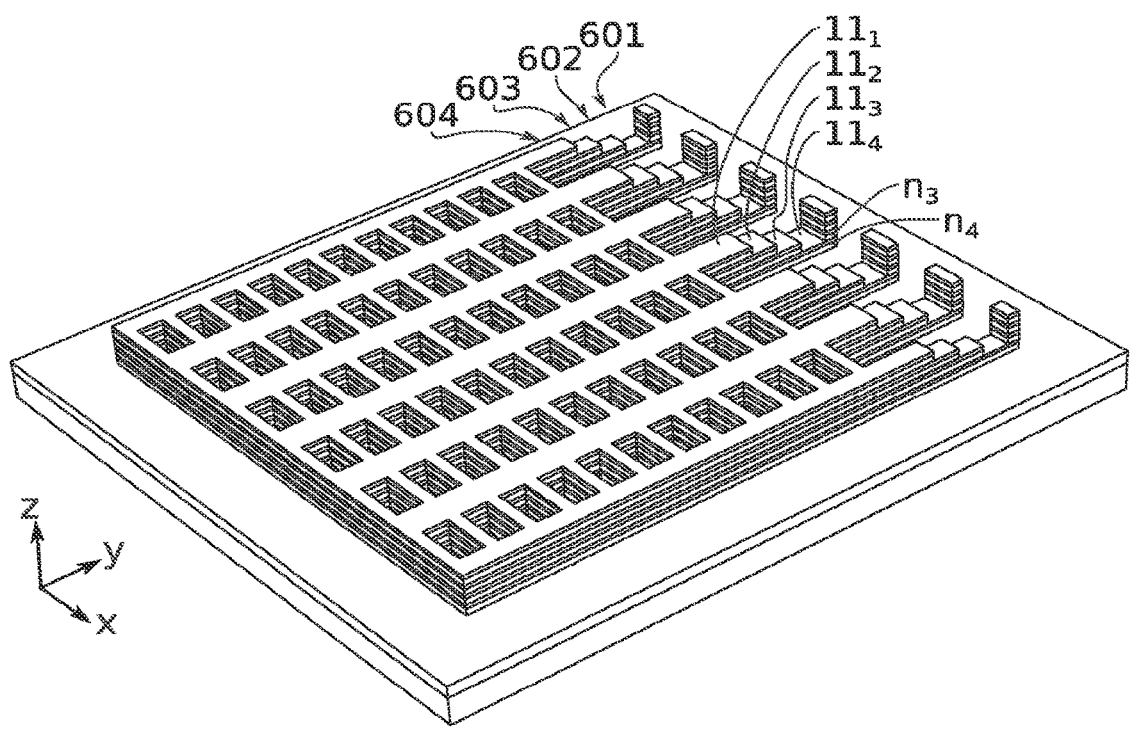

In the example illustrated here comprising 4 Si levels n1, n2, n3, n4, the SiGe layers $11_1$, $11_2$, $11_3$, $11_4$ are exposed in a stepped manner respectively at the lines 604, 603, 602, 601 of the sourceline area 3 (FIG. 28). A lithography/etching step is advantageously omitted in this second exemplary embodiment, compared with the first exemplary embodiment.

The resin 61 is not necessarily completely removed and/or redeposited between each lithography/etching.

Formation of Sacrificial Gates

FIGS. 29 to 33 illustrate steps in the formation of sacrificial gates.

Figure 29:
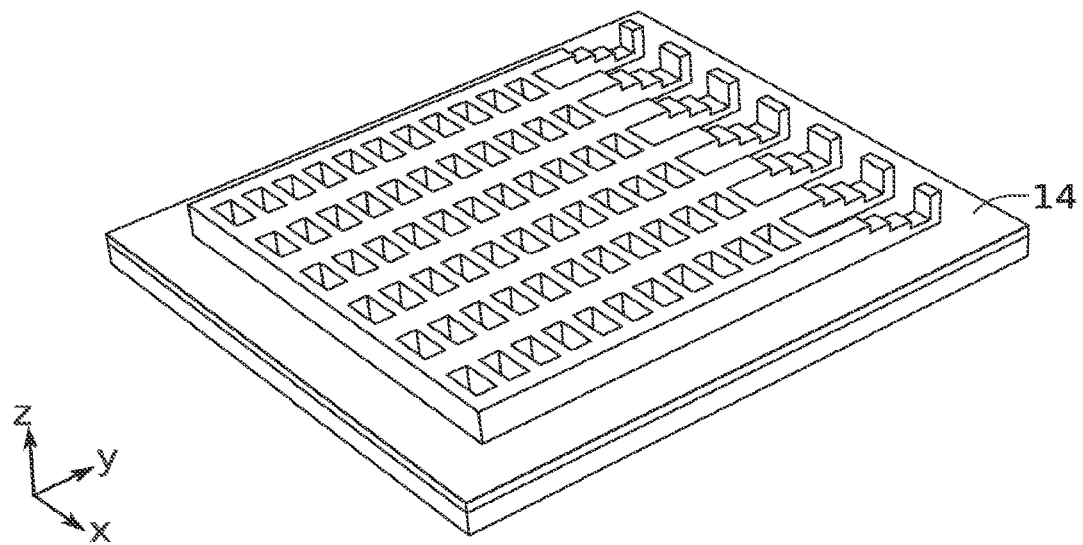
FIGS. 29 to 33 schematically illustrate in three-quarter view steps of manufacturing sacrificial gates of a microelectronic system according to a second embodiment of the present invention.
Figure 30:
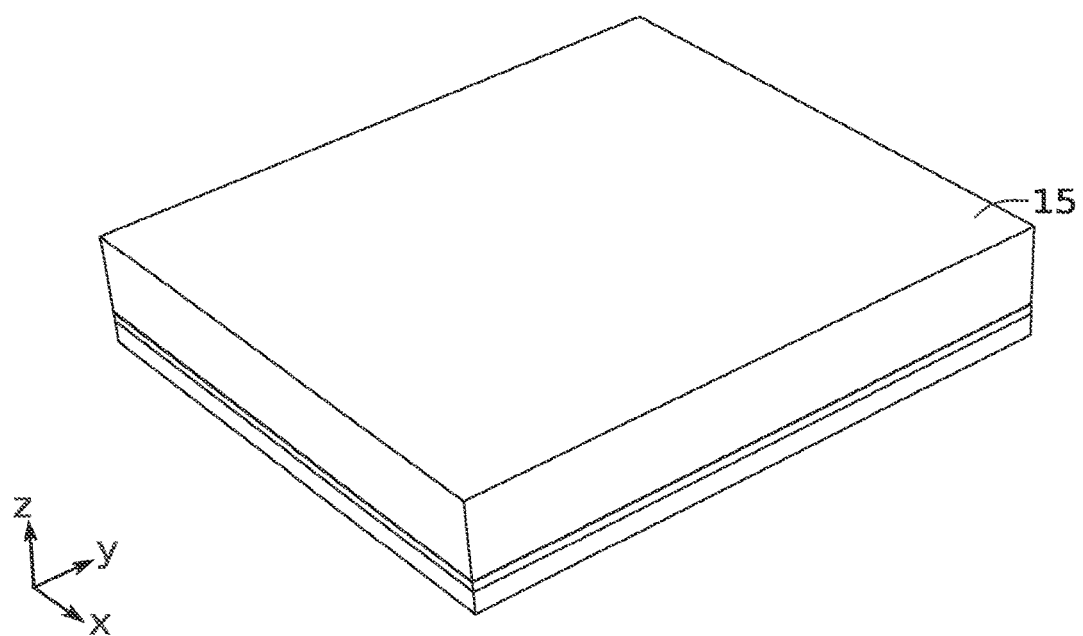

FIGS. 29 and 30 respectively illustrate steps of depositing a layer 14 of silicon oxide SiO2 and a layer 15 of polycrystalline silicon (polySi). The thickness of deposited SiO2 can typically be a few nanometres, for example 7 nm. The polySi is deposited so as to fill the openings 201, 202. The thickness of the deposited polySi can typically be a few hundred nanometres, for example 380 nm. These successive depositions form a SiO2/polySi stack similar to a conventional gate stack. The structuring of this stack allows to form the sacrificial gates.

Figure 31A:
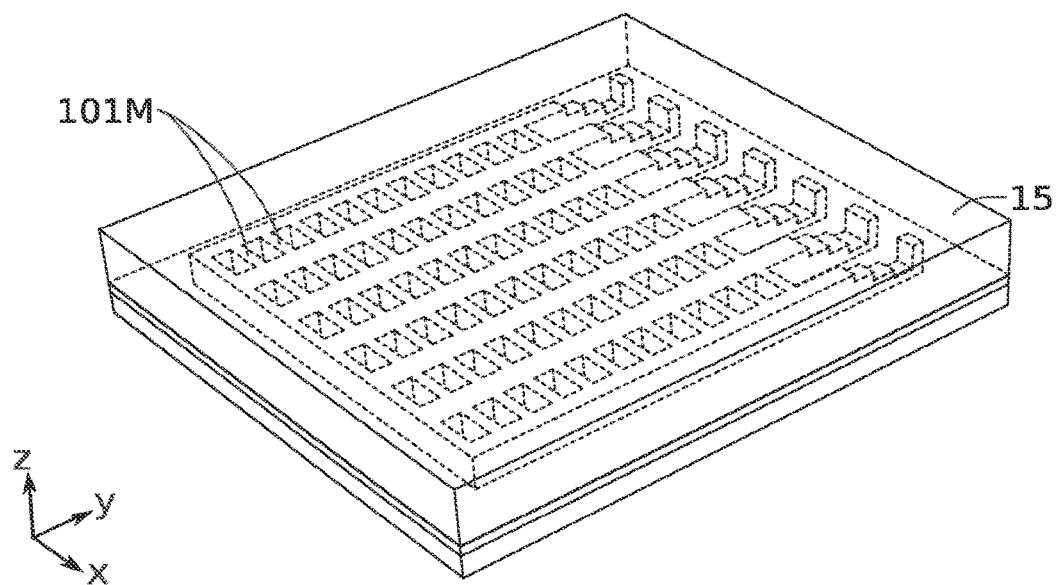

FIG. 31A illustrates a step of planarising the polySi 15, typically by chemical-mechanical polishing CMP. This CMP can be stopped in time, for example after a few tens of seconds. The patterns 101M, 301S of the wordline and bitline areas, as well as the contacts of the sourceline area which are structured in a stepped manner are visible in transparency through the planarised polySi layer 15.

Figure 31B:
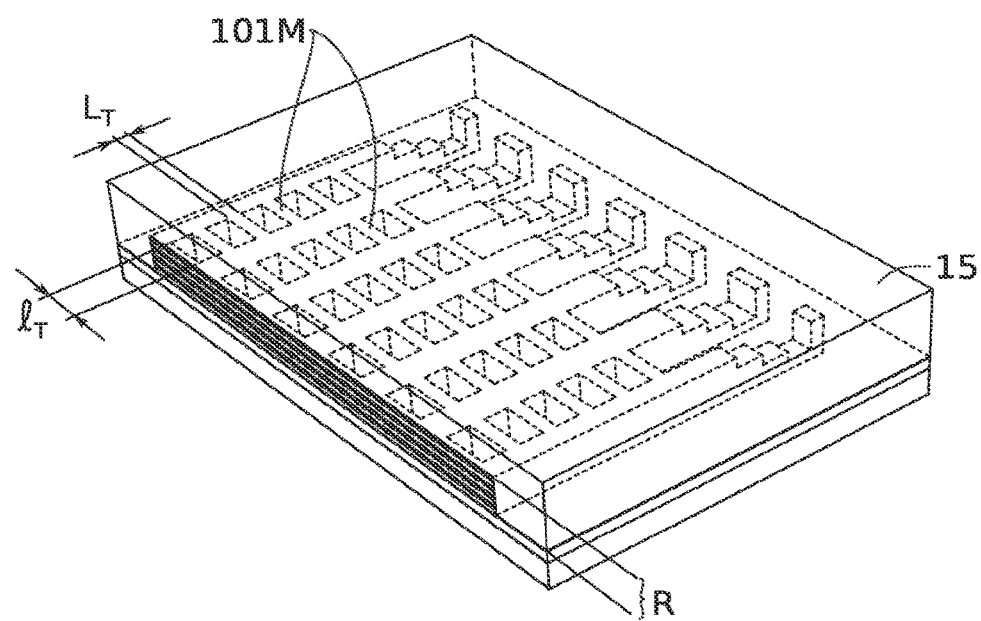

FIG. 31B is a cross-sectional view along XZ through patterns 101M, of the structure obtained at the end of the step illustrated in FIG. 31A. The patterns 101M of length $l_T$ and of width LT, formed in the super lattice R, are visible in this FIG. 31B.

Figure 32:
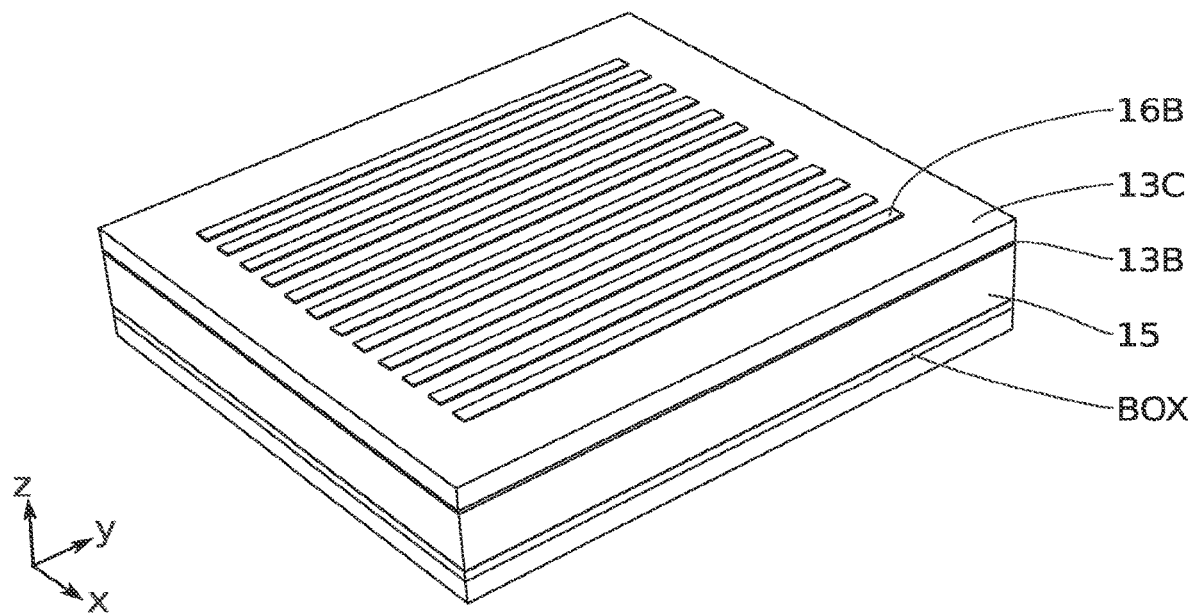

FIG. 32 illustrates a lithography step aiming at defining the sacrificial gates via a second mask 16B.

First, a nitride layer 13B and a SiO2 oxide layer 13C are successively deposited on the planarised polySi layer 15.

Figure 33:
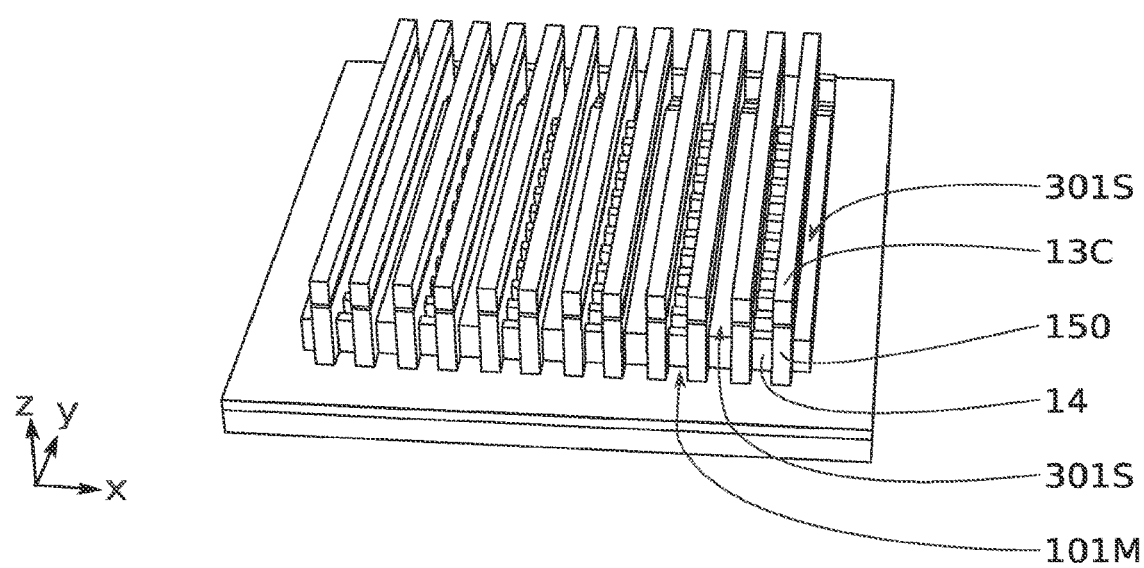

FIG. 33 illustrates the anisotropic etching along Z of the oxide 13C, of the nitride 13B and of the polySi 15. The TEOS layer 14 and the buried oxide (BOX) are advantageously used as a stop layer during the etching of Poly-Si. The sacrificial gates 150 are thus formed straddling the peripheral portions of the transistor patterns 101M. They extend mainly along Y and border the source patterns 301S along X, as before.

Figure 34:
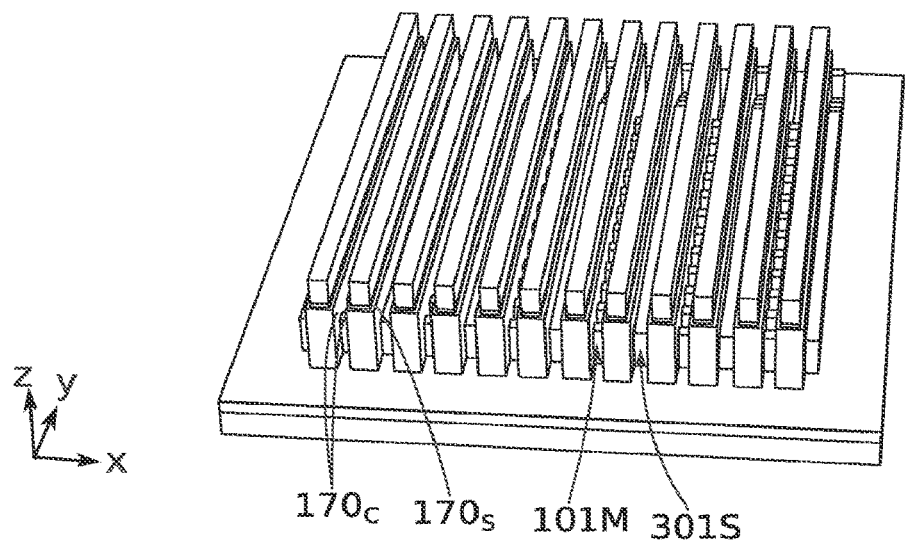
FIGS. 34 to 39 schematically illustrate in three-quarter view steps of manufacturing a microelectronic system aiming at insulating sources of transistors from each other, according to a second embodiment of the present invention.

FIG. 34 illustrates the formation of spacers $170_C$, $170_S$ on either side of the sacrificial gates 150. These spacers are typically formed from a deposition of a conformal SiN layer followed by anisotropic etching of this SiN layer, as before. The source patterns 301S are thus partially covered by the spacers $170_S$. The transistor patterns 101M are thus partly covered by the spacers $170_C$.

Figure 35:
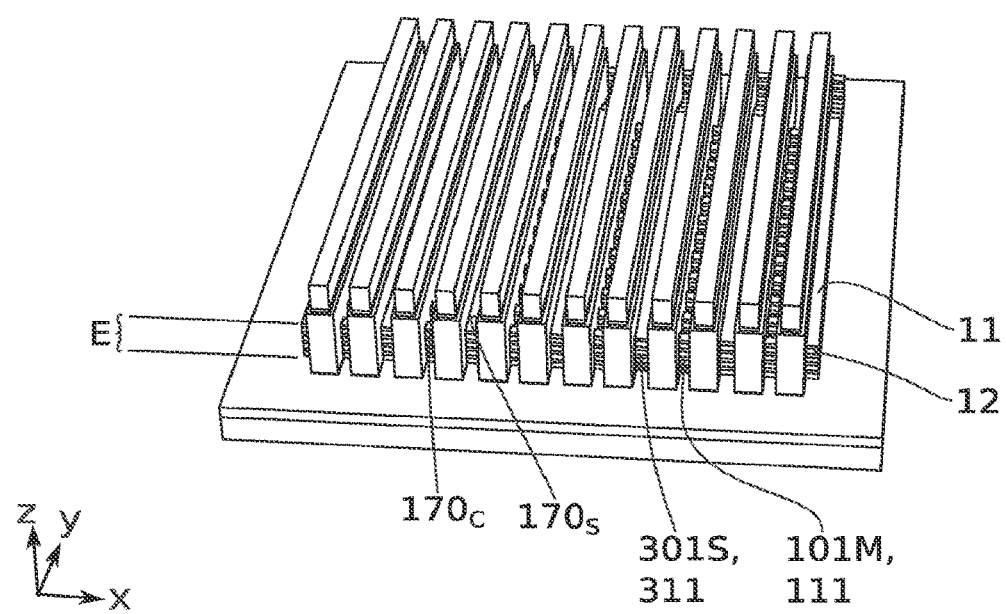

FIG. 35 illustrates the removal of the exposed portions of the TEOS oxide layer 14, after forming the spacers $170_C$, $170_S$. This removal allows to expose a central portion 111 of the transistor patterns 101M, between the spacers $170_C$, and a central portion 311 of the source patterns 301S between the spacers $170_S$.

Figure 36:
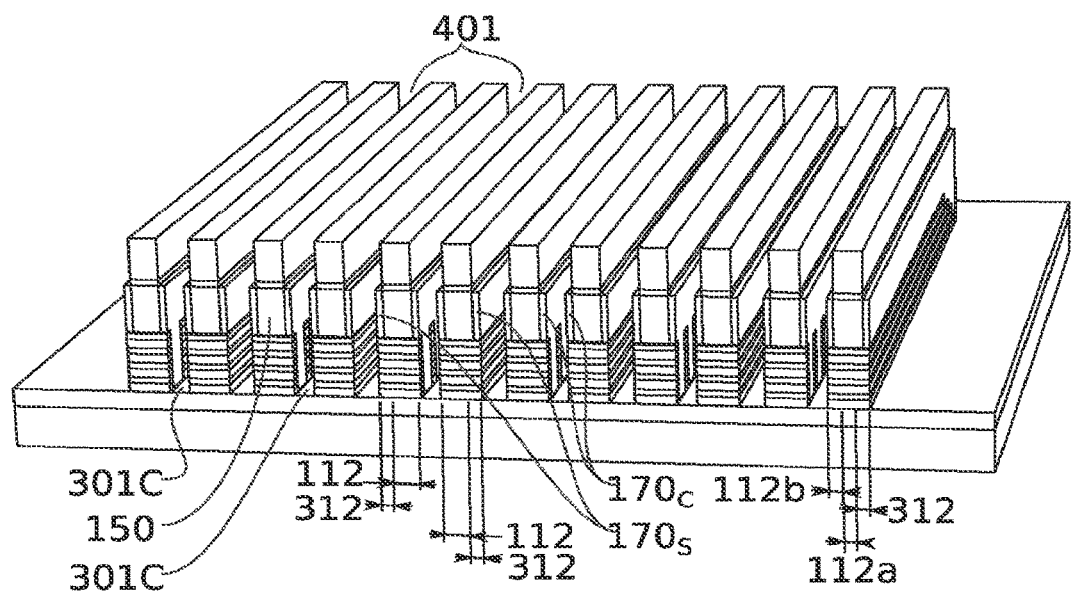

The central portions 111 and 311 are then etched anisotropically along Z, to the BOX, as illustrated in FIG. 36. This allows to structure the Si/SiGe stack in the shape of a comb.

Peripheral portions 312 of the source patterns 301S are preserved at the end of this etching, under the spacers $170_S$. These peripheral portions 312 are continuous along the axis Y. They form the body of the comb. A first side of these peripheral portions 312 opens onto the openings 401. A second side of these peripheral portions 312 is attached to the sacrificial gates 150. Preferably, the Si layers of these peripheral portions 312 will subsequently form the sources of the transistors.

Peripheral portions 112 of the transistor patterns 101M are also preserved at the end of this etching, under the sacrificial gates 150 and the spacers $170_C$. These peripheral portions 112 extend along X and open onto the openings 301c. The peripheral portions 112 form the teeth of the comb. They are connected to each other by the peripheral portions 312. Preferably, the Si layers of these peripheral portions 112 will subsequently form the channels and the drains of the transistors.

Insulation of the Source

As before, in order to be able to independently address each of the transistors of the 3D array, it is necessary to insulate the Si layers of the different levels n1, n2, n3, n4 from each other. The SiGe layers are therefore preferably removed and replaced by electrically insulating layers.

Figure 37:
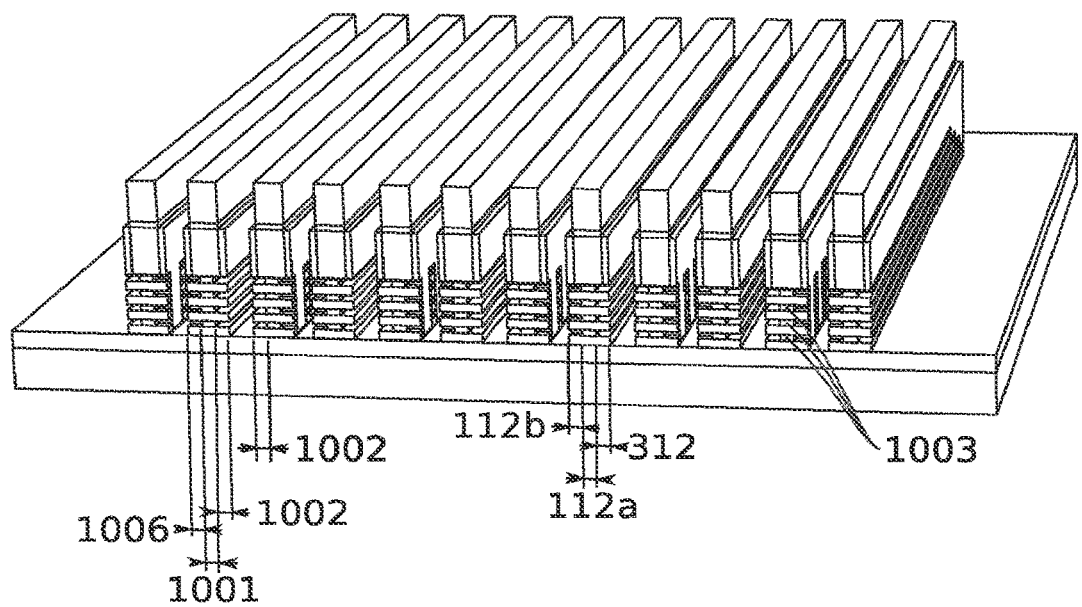

As illustrated in FIG. 37, the sources 1002 of the transistors correspond to the Si layers of the peripheral portions 312 of the source patterns 301S. To insulate these sources 1002 from each other, portions of the SiGe layers of the stack are etched from the openings 401, 301c, as before.

The etching is configured such that the SiGe layers of the peripheral portions 312 are etched through the openings 401. The stopping of the etch front can be controlled over time, preferably substantially in vertical alignment with the sacrificial gates 150. The sources 1002 are therefore suspended.

Etching the SiGe layers is preferably also carried out through the openings 301c. The selective etching of the SiGe layers is thus carried out on either side of the stack, at the transistor patterns, as illustrated in FIG. 37. Si layer parts 1006 of the peripheral portions 112b of the transistor patterns 101M are therefore suspended. These parts 1006 are in the shape of wires and correspond substantially to the drains of the transistors.

The etching is preferably stopped before the SiGe layers are completely removed. SiGe portions 1003 are thus preserved between the Si layers of the peripheral portions 112a of the transistor patterns 101M. This allows both to define the channels 1001 and/or the drains 1006 made of Si, and to avoid a risk of collapse of the Si layers. These portions 1003 are subsequently removed so as to form the gates-all-around of the GAA transistors.

The poly-Si sacrificial gates allow in particular to maintain the Si layers during SiGe etching. They form a structure of anchor pillars for the Si layers.

Figure 38:
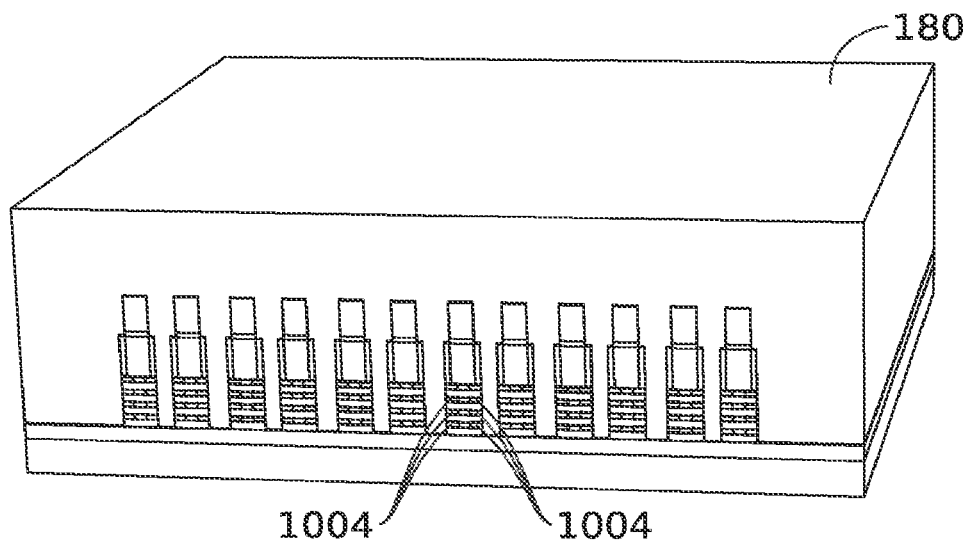

FIG. 38 illustrates the formation of dielectric plugs 1004, for example made of SiN, at the cavities formed by the removal of the SiGe, as above. The sources 1002 are thus electrically insulated from each other. The drains 1006 are also electrically insulated from each other.

Figure 39:
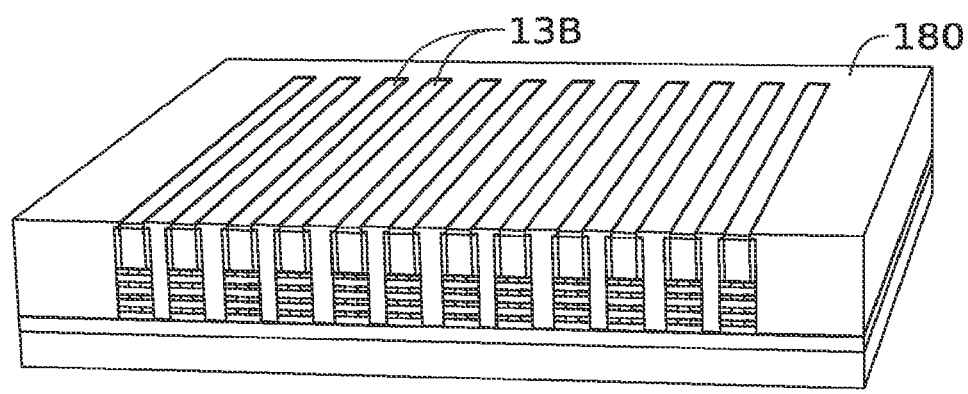

An oxide layer 180 is then deposited so as to fill the openings 401, 301c (FIG. 38). This oxide layer 180 is then planarised by CMP with stopping on the hard SiN mask parts 13B, as illustrated in FIG. 39.

Figure 40:
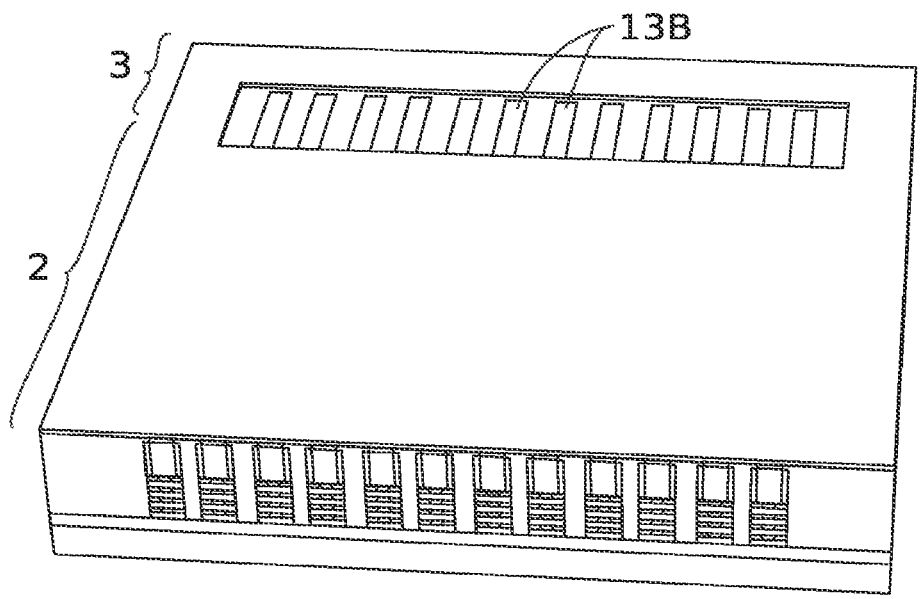
FIGS. 40 to 45 schematically illustrate steps of a method for manufacturing the source line area of a microelectronic system according to a second embodiment of the present invention.
Figure 41:
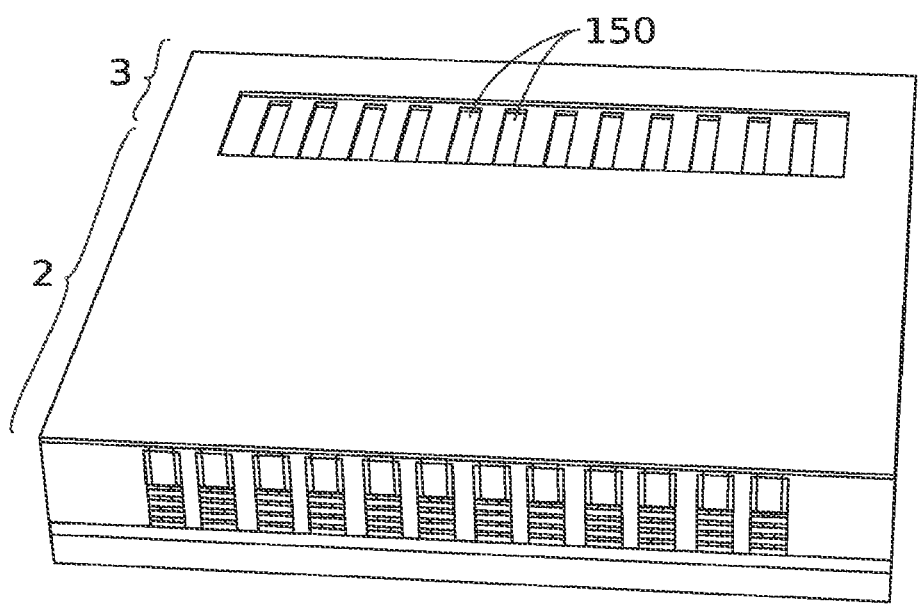

A lithography step is carried out so as to protect the bitline area 2 and to expose the sourceline area 3 (FIG. 40). The hard mask 13B is removed in this sourceline area 3, so as to expose the sacrificial gates 150 at the sourceline area 3 (FIG. 41).

Figure 42:
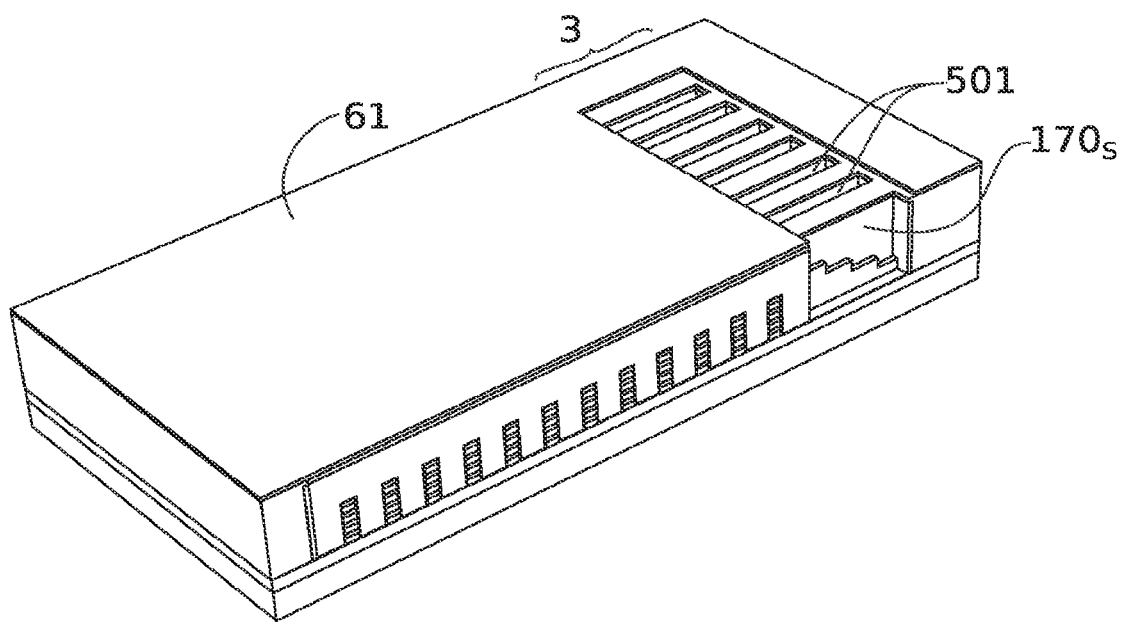

The sacrificial gates 150 of the sourceline area 3 are then removed, as illustrated in FIG. 42. The polySi of the sacrificial gates can be etched using a TMAH or TEAH solution, or by anisotropic plasma etching, for example based on $CH_2F_2/SF_6/N_2/He$ and $HBr/O_2/He$ chemistries, as above. In the example illustrated in FIG. 42, the removal of the sacrificial gates 150 forms openings 501. These openings 501 open onto the stepped contacts connected to the sources 1002 (not visible). The openings 501 are bordered by the spacers $170_C$, $170_S$.

Figure 43:
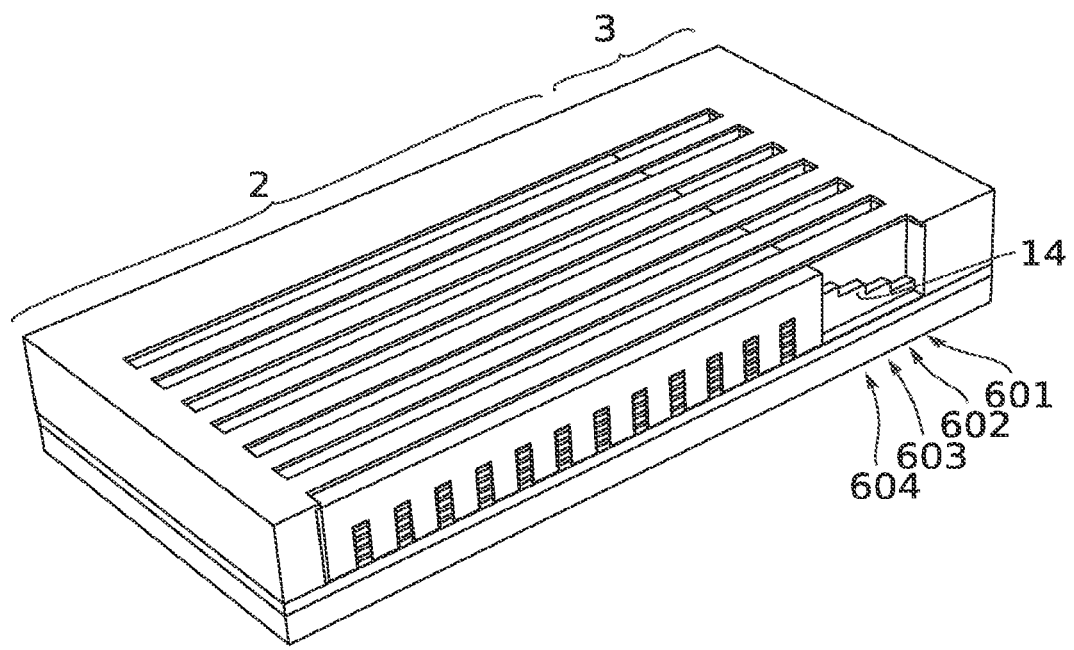
Figure 44:
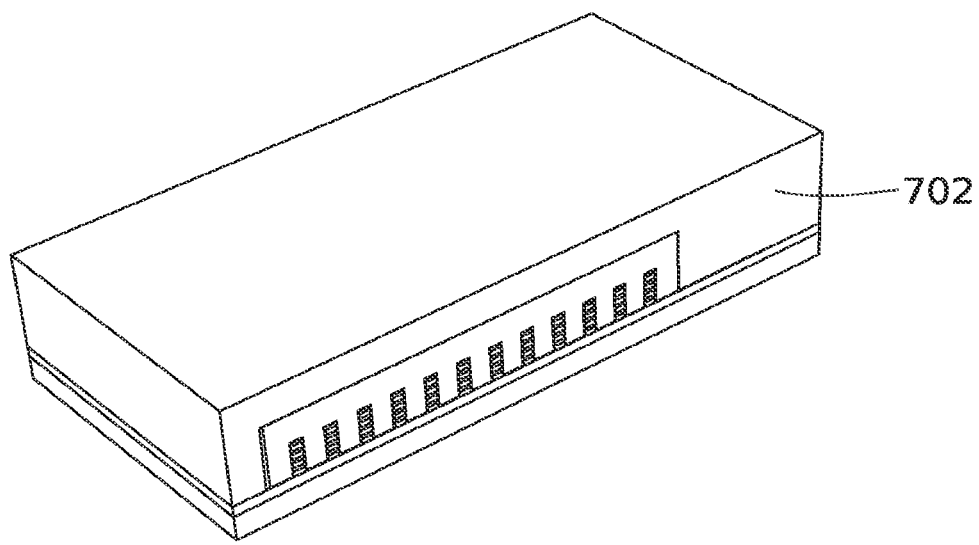

The resin 61 is then removed so as to expose the bitline area 2. The nitride of the hard mask 13B in the bitline area 2 and of the spacers $170_C$, $170_S$ in the sourceline area 3 is then etched, as illustrated in FIG. 43. This allows to free the sources 1002 structured in a stepped manner and covered with the oxide 14 in the sourceline area 2. The lines 604, 603, 602, 601 of contact patterns, each corresponding to a step of the stepped contacts, are also shown in FIG. 43.

Figure 45:
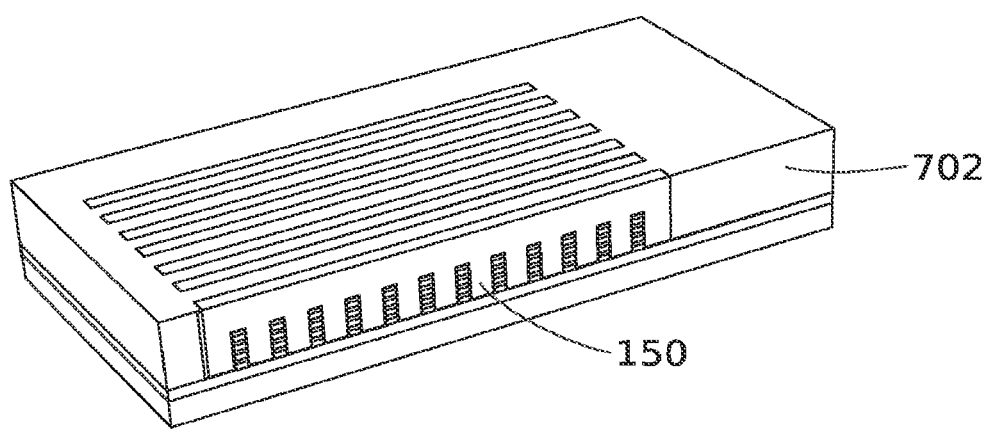

A thick SiO2 oxide layer 702 is then deposited over the entire structure (FIG. 44) and planarised by CMP with stopping on the tops of the sacrificial gates 150 (FIG. 45).

Structuring of the Wordline Area

Figure 46:
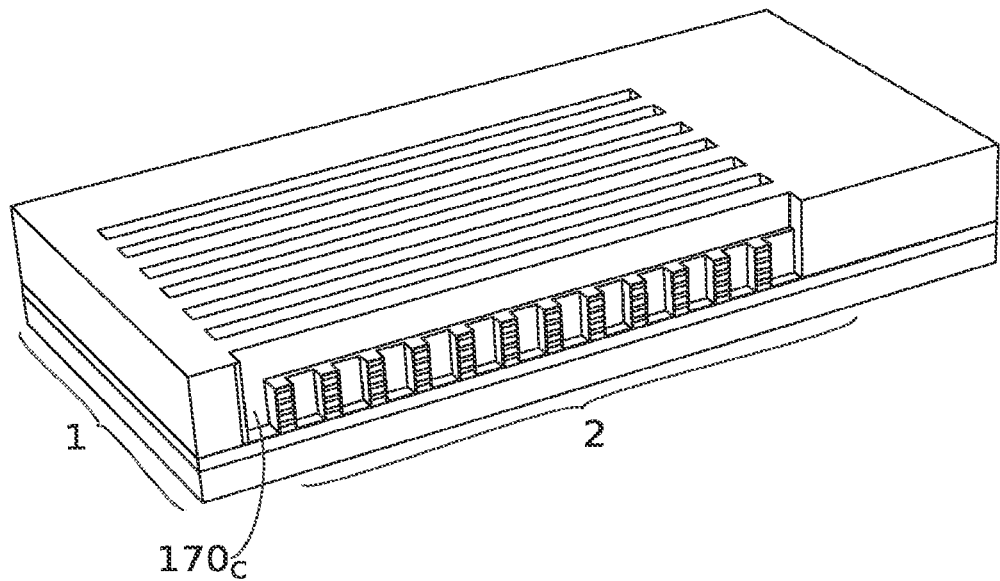
FIGS. 46 to 49 schematically illustrate steps of a method for manufacturing the wordline area of a microelectronic system according to a second embodiment of the present invention.
Figure 47:
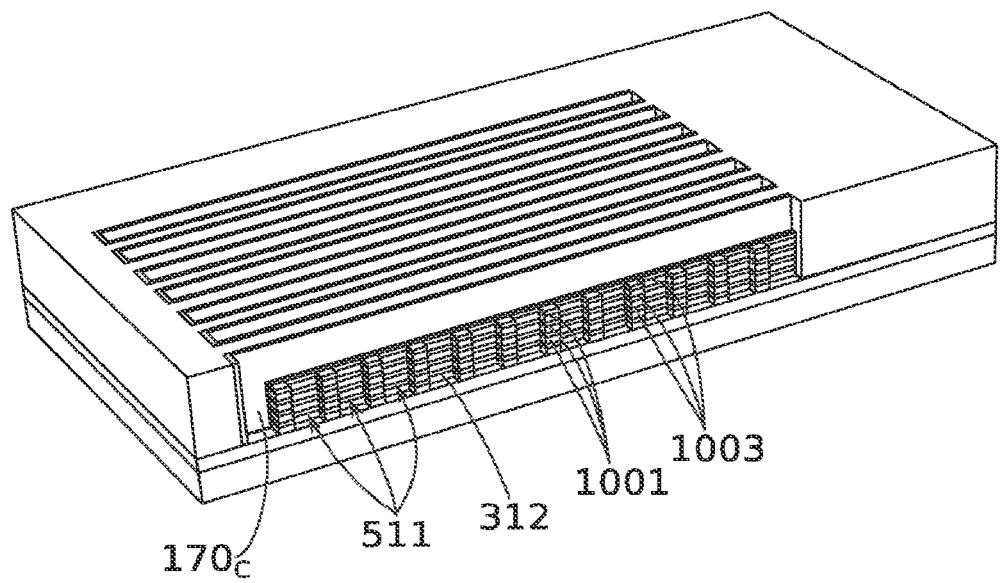

FIGS. 46 and 47 illustrate the removal of the sacrificial gates 150 from the wordline area 1, as before. The polySi (FIG. 46) then the TEOS (FIG. 47) are successively removed.

In the example illustrated in FIG. 47, the removal of the sacrificial gates 150 forms openings 511. These openings 511 are bordered along XZ by stacks formed by the Si channels 1001 and the SiGe portions 1003. These openings 511 are bordered along YZ by the peripheral portions 312 comprising the stack of the sources 1002 insulated from each other, and by the spacers $170_C$ (not visible) facing said peripheral portions 312.

Figure 48:
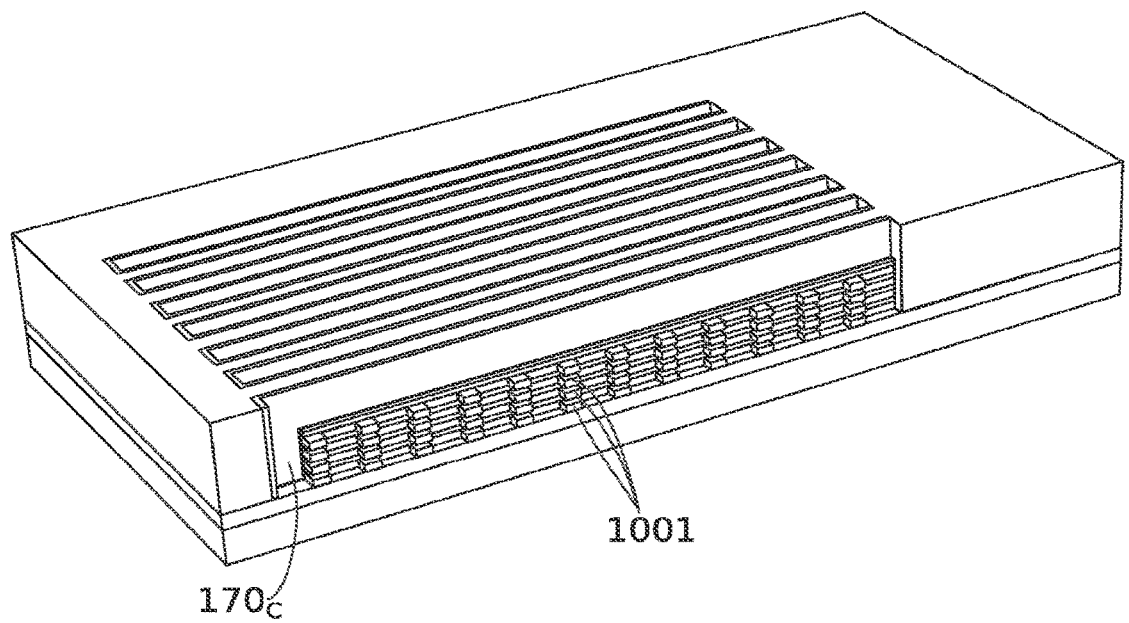

FIG. 48 illustrates the selective etching of the SiGe portions 1003, as before. This etching allows to etch the SiGe while preserving the channels 1001 in the shape of Si nanowires and the parts of the sources 1002 exposed at the peripheral portions 312. At the end of the etching, the channels 1001 of the Si transistors are suspended between the openings 511 of the same wordline $WL_x$.

Figure 49:
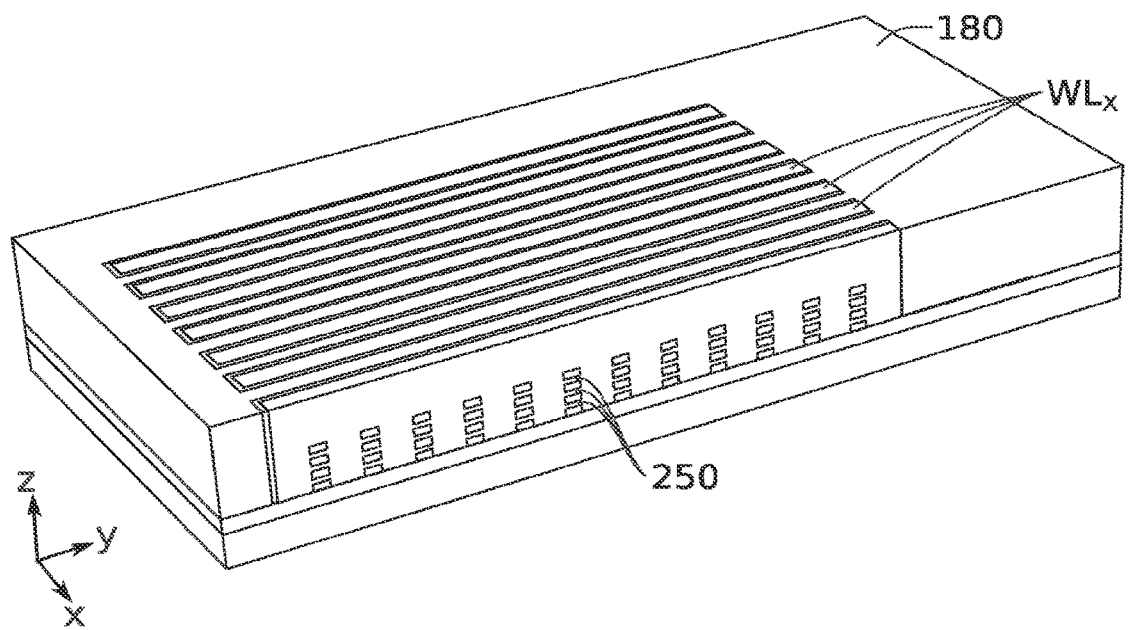

FIG. 49 illustrates the formation of the functional gates in the place of the sacrificial gates. Successive depositions of materials used for the formation of functional gates allow to form the functional gates 250 around each channel 1001, as before. These functional gates can be formed from a deposition of material with a high dielectric constant called high-k, for example HfO2 over a thickness of 2 nm, followed by a deposition of TiN over a thickness of 3 nm, followed with a deposition of tungsten W aiming at filling the openings 511 and the wordlines $WL_x$ delimited by the TEOS oxide 180. A planarisation by CMP with stopping on the TEOS oxide 180 allows, if necessary, to remove the excess metal layers. The wordlines $WL_x$ are thus defined. The transistors of the 3D array are MOS transistors with a gate-all-around based on stacked Si nanowires.

Figure 50:
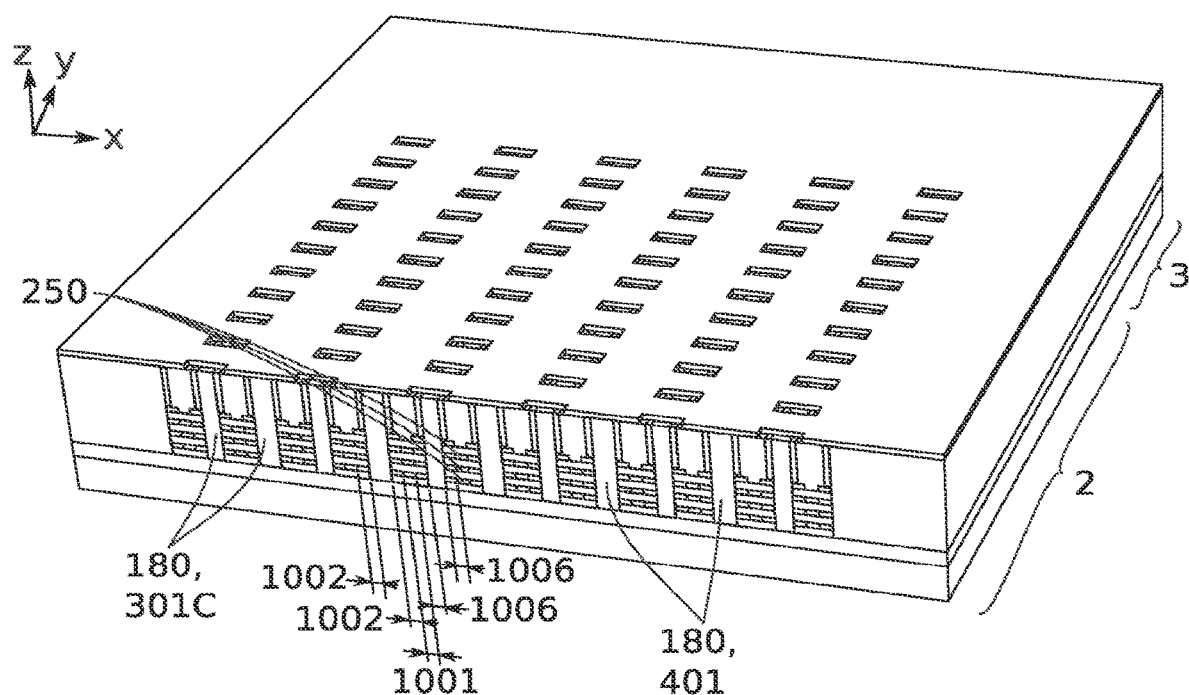
FIGS. 50 to 55 schematically illustrate steps of a method for manufacturing the data line area of a microelectronic system according to a second embodiment of the present invention.

FIG. 50 allows to distinguish in section along XZ the sources 1002 of the transistors, the channels 1001 surrounded by the gates-all-around 250, and parts of the nanowire forming the drains 1006 of the transistors. The sources 1002 extend along Y into the sourceline area 3. The drains 1006 extend along X to the opening areas 301c filled with oxide 180.

Structuring of the Bitline Area

The next step consists in partially removing the oxide 180 from the opening areas 301c, so as to access the drains 1006 of the transistors in the bitline area 2.

Figure 51:
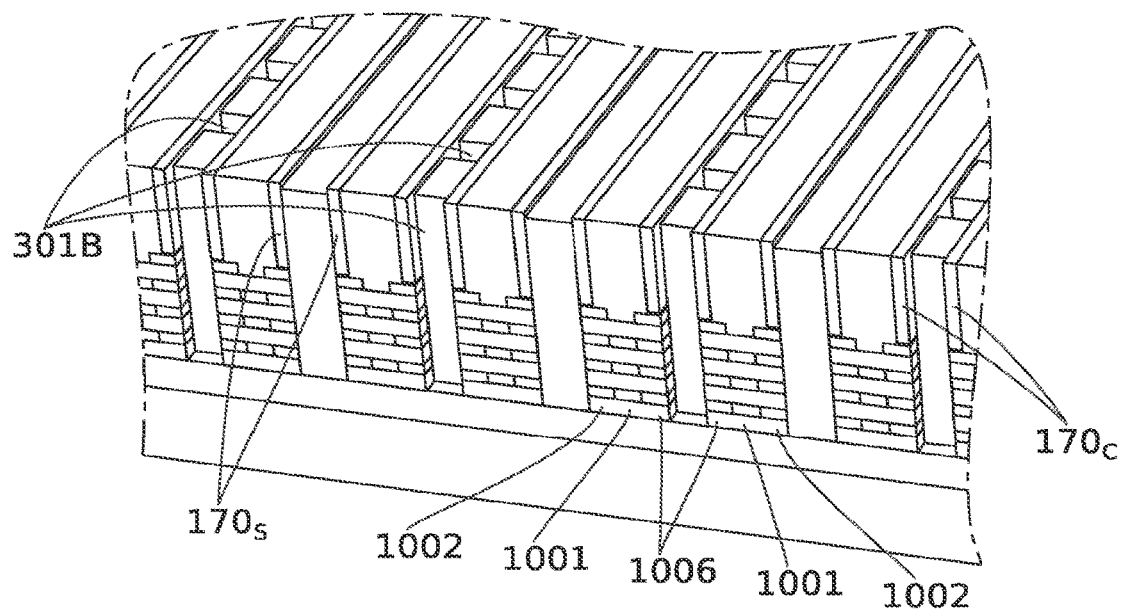

FIG. 50 illustrates a lithography step prior to the etching of the oxide 180 at the opening areas 301c. The selective etching of the oxide 180 forms openings 301B exposing one end of the Si drains 1006, as illustrated in FIG. 51.

Figure 52:
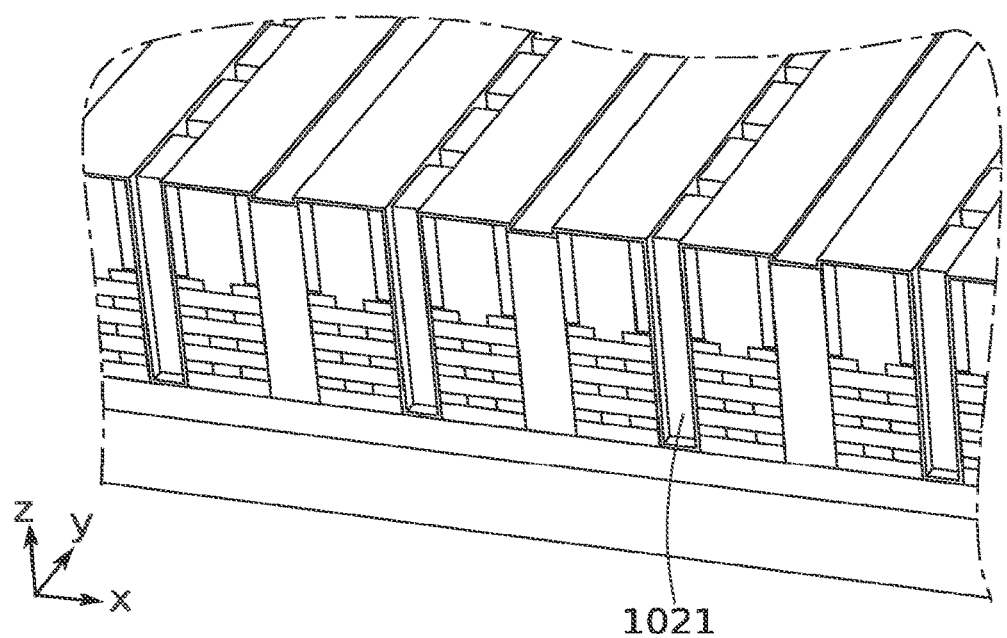
Figure 53:
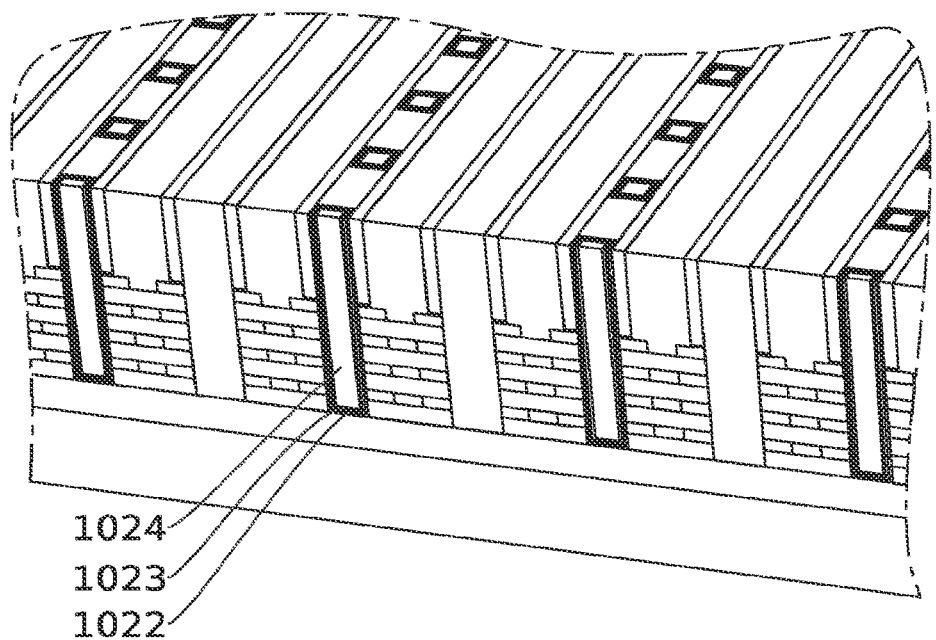

These openings 301B are filled by successive depositions so as to form the memory points, as illustrated in FIGS. 52 and 53. The memory points thus formed are directly in contact with the drains 1006 of the selection transistors. The drains 1006 can be silicided beforehand. In the case of an OxRAM type resistive memory, these memory points can be based on HfO2. For example, these memory points can be produced by depositing a 5 nm thick HfO2 layer 1021, followed by depositing a 5 nm thick Ti layer 1022, followed by depositing a TiN layer 1023 with a thickness greater than 5 nm followed by depositing a W layer 1024 with a thickness of 300 nm. The W layer 1024 can typically extend outside the openings 301c. It is then planarised by CMP with stopping on the oxide layer 180.

Figure 54:
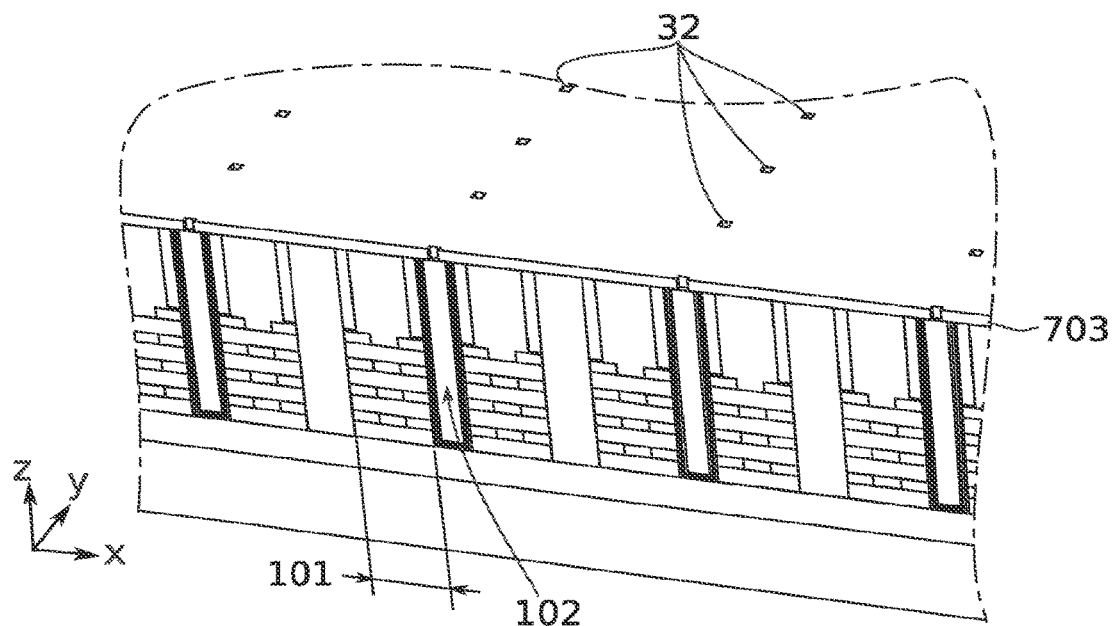
Figure 55:
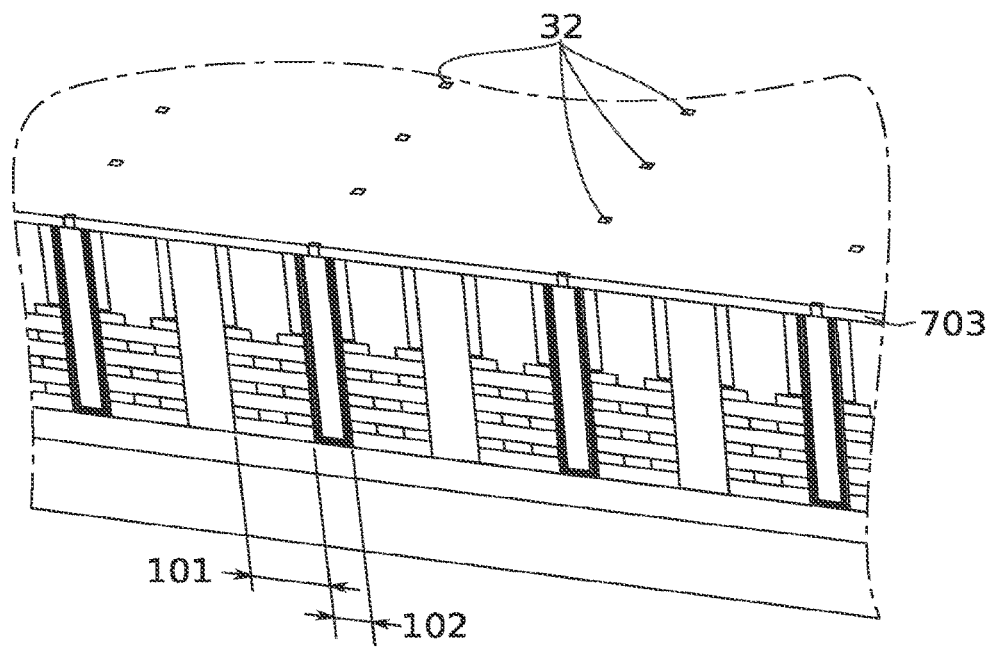

An oxide layer 703 is preferably deposited on the 3D array thus formed. The contact holes 32 are then formed by lithography/etching through the oxide layer 703, as shown in FIGS. 54 and 55. Contact holes 32 are dedicated to connecting bitlines with the memory points. The contact holes dedicated to the connection of the wordlines with the gates of the selection transistors and the contact holes 33 dedicated to the connection of the sourcelines with the sources of the selection transistors are also formed by lithography/etching through oxide layers 703, 702.

Figure 56:
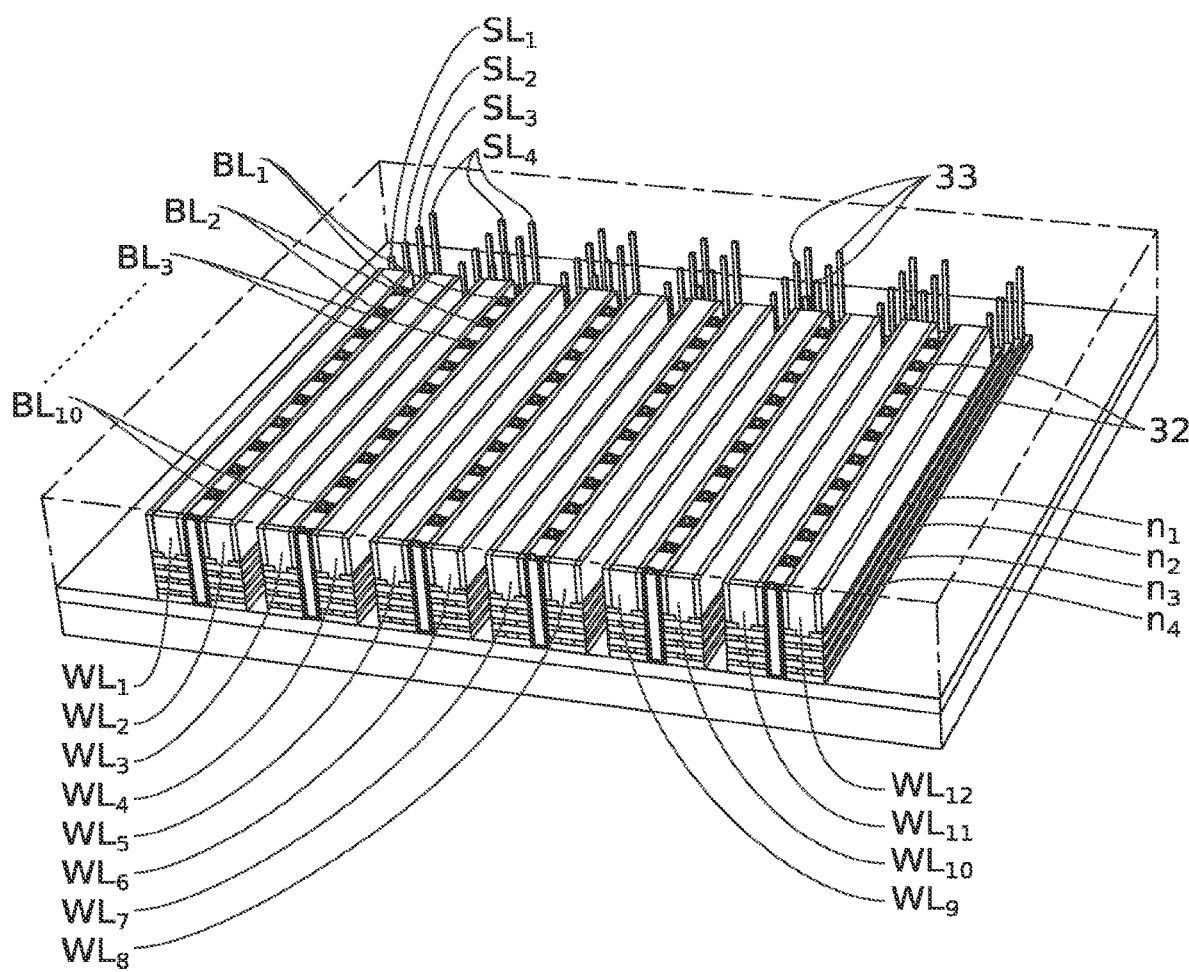
FIGS. 56 and 57 schematically illustrate a microelectronic system according to a second embodiment of the present invention, respectively in a cross section XZ and in a longitudinal section YZ.
Figure 57:
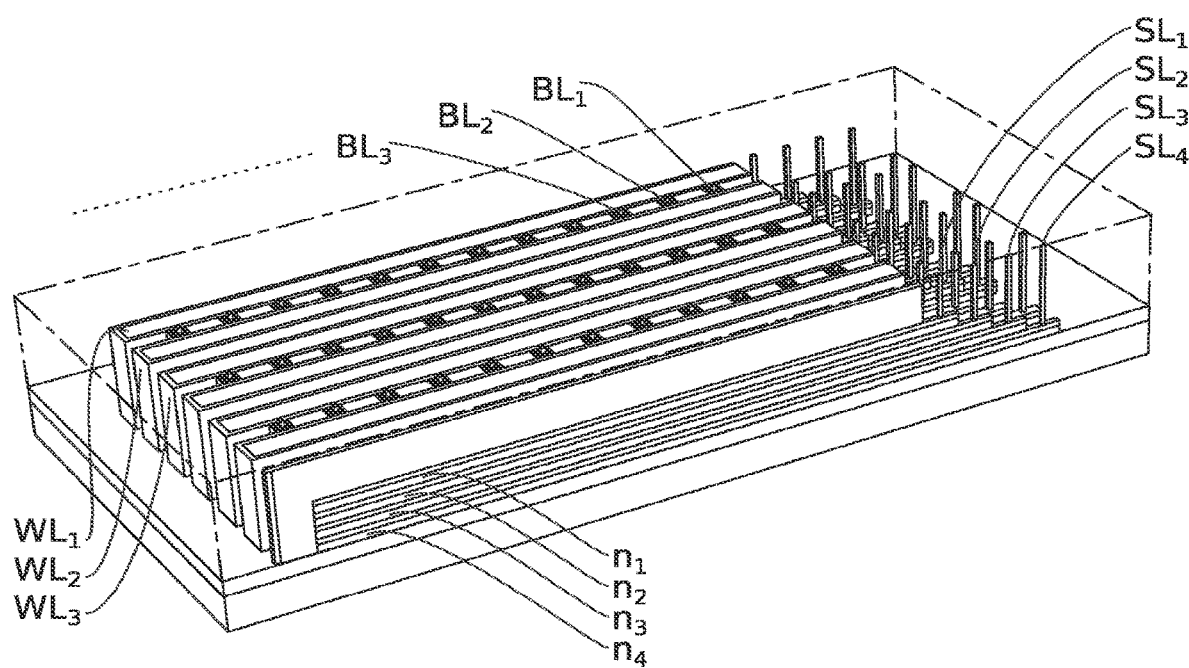
Figure 58A:
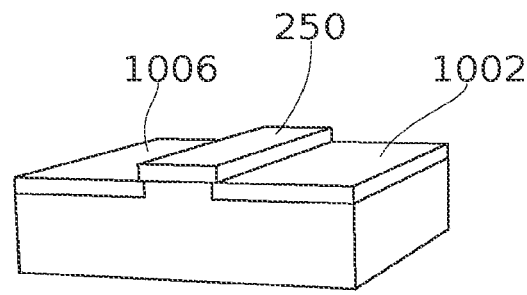
FIGS. 58A to 58C schematically illustrate various architectures of transistors according to the prior art.
Figure 58B:
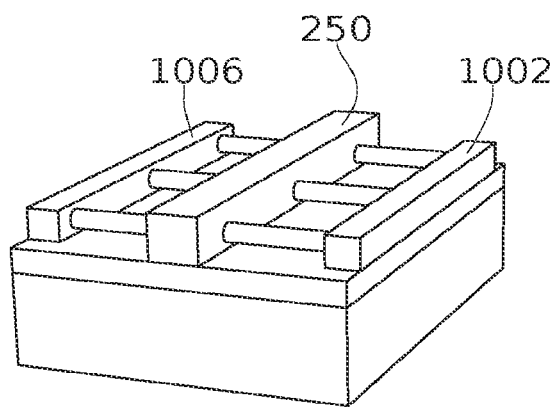
Figure 58C:
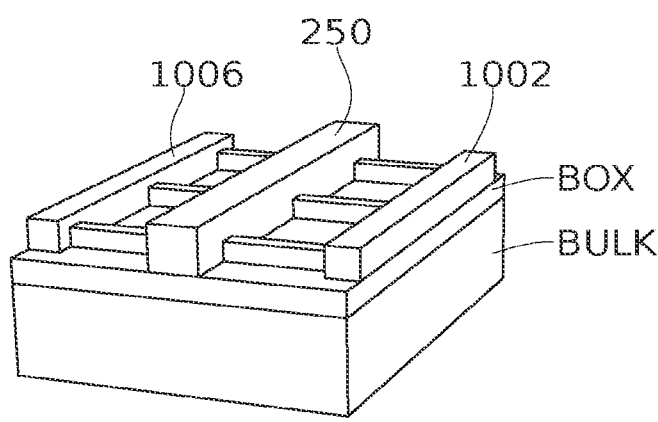

FIGS. 56 and 57 show a 3D resistive memory obtained by this second embodiment, respectively in a cross section along XZ and in a longitudinal section along YZ.

The sourceline contact lines $SL_1$, $SL_2$, $SL_3$, $SL_4$ independently connecting each of the levels n1, n2, n3, n4 of the array, the wordlines $WL_1$, $WL_2$, $WL_3$, $WL_4$, $WL_5$, $WL_6$, $WL_7$, $WL_8$, $WL_9$, $WL_{10}$, $WL_{11}$, $WL_{12}$ and the bitlines $BL_1$, $BL_2$, $BL_3$, $BL_4$, $BL_5$, $BL_6$, $BL_7$, $BL_8$, $BL_9$, $BL_{10}$ are visible in transparency in these FIGS. 56 and 57. The contacts 32, 33 are also illustrated in these FIGS. 56 and 57.

The present invention also relates to a microelectronic device comprising at least two transistors stacked along z. Each of these transistors comprises a channel in the shape of a wire extending mainly in the first direction x, a gate surrounding said channel, a source and a drain. Thus, the length of each channel extends in the first direction x. For each transistor, the channel, the source and the drain extend only over a level $n_z$ (z=1 ... 4) of given altitude in the third direction z. A level $n_z$ of given altitude corresponds to a portion of space delimited by two planes $P1n_z$, $P2n_z$ perpendicular to the third direction z and passing respectively through an upper face $251n_z$ of the channel of the transistor associated with the level $n_z$, and a lower face $252n_z$ of the channel of the transistor associated with the level $n_z$. The source 1002, and the drain 1006 connected to said channel are entirely contained in this portion of space. According to the invention, two levels $n_z$ of different altitudes are separated from each other by a spacer called horizontal spacer, preferably made of a dielectric material. Two levels $n_z$ of given altitude means two levels having two different altitudes.

Such a device is advantageously manufactured by the method according to the invention. The use of sacrificial gates and sacrificial layers allows in particular to form these transistors on different levels $n_z$ (z=1 ... 4) and to insulate these different levels $n_z$ (z=1 ... 4) from each other. In particular, the plugs formed in the manufacturing method advantageously correspond to the horizontal spacers of the device.

Examples of devices are described and illustrated below. These devices preferably comprise at least one horizontal spacer 1004 separating the source 1002 of a level nz from the source 1002 of a level n−1z or n+1z adjacent to this level nz. Likewise, these devices preferably comprise at least one horizontal spacer 1004 separating the drain 1006 of a level nz, from the drain 1006 of a level n−1z or n+1z adjacent to this level nz. Thus, the source 1002 and the drain 1006 of a transistor occupying a level nz are located only on this level nz, between horizontal spacers 1004. Typically, a first horizontal spacer separates the levels nz and n−1z and a second horizontal spacer separates the levels nz and n+1z. These first and second horizontal spacers may be distinct from each other, at least along a section of the device taken along the plane zx. Different stacks of sources S and drains D can be considered. According to one example, the sources S are stacked along z one above the other and form a stack S/S/S/S/S/S. Likewise, the drains D can be stacked along z one above the other so as to form a stack D/D/D/D/D/D. Other stacks alternating sources and drains can also be considered, for example S/D/S/D/S/D or S/D/D/S/S/D. The sources and/or the drains of different levels nz are separated from each other by horizontal spacers.

According to the invention, an area forming a source 1002 or a drain 1006 does not extend over several levels of transistors.

Thus, the source 1002 and/or the drain 1006 associated with the channel 1001 of a level $n_z$ of given altitude are arranged at a distance from a source and/or a drain associated with a channel of level n−1z or n+1z adjacent to the level $n_z$.

Figure 59A:
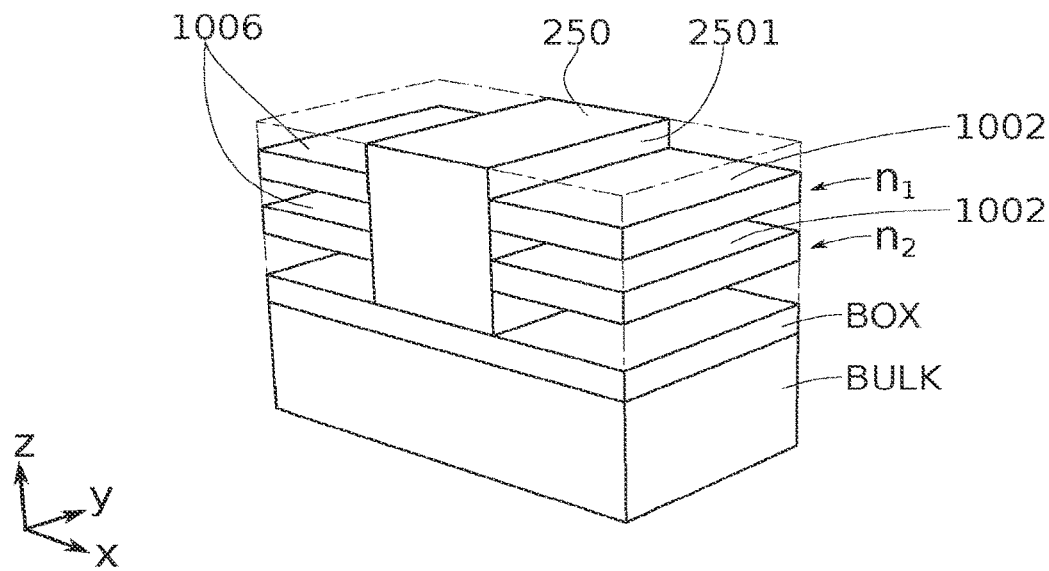
FIGS. 59A to 59C schematically illustrate an architecture of a microelectronic device based on GAA transistors according to one embodiment of the present invention.
Figure 59B:
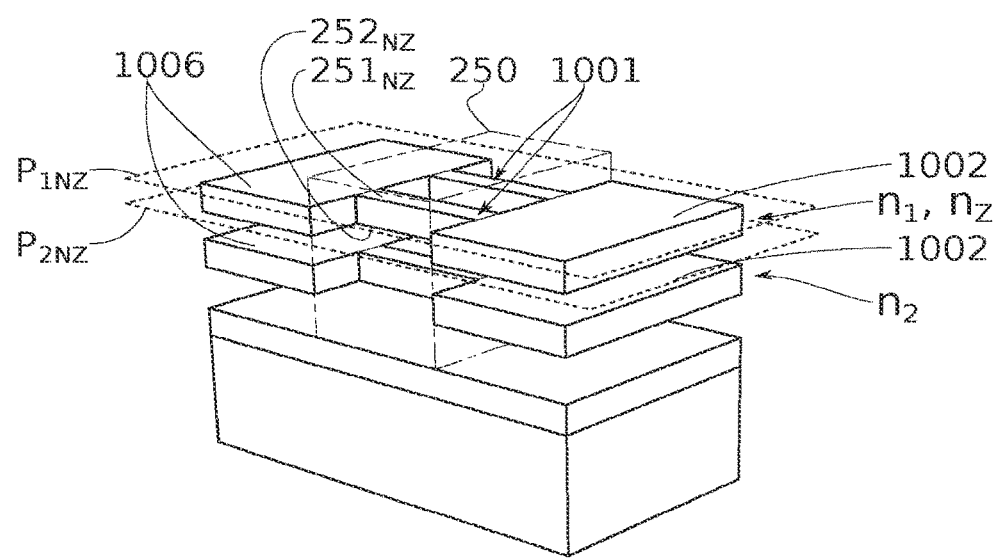
Figure 59C:
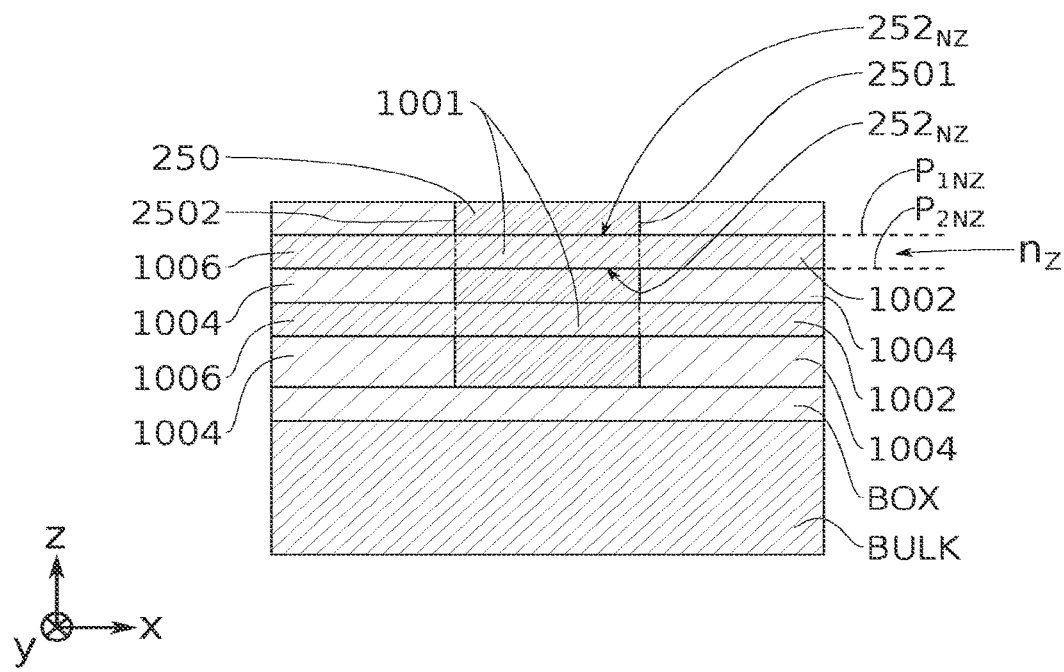

FIGS. 59A to 59C show a first example of a device comprising two levels n1, n2 and four transistors distributed over these two levels, for the sake of clarity. The number of levels illustrated is not limiting of the invention. Three, four or more levels, for example ten, are perfectly conceivable within the scope of the invention.

In this example, each level n1, n2 comprises a source 1002 extending mainly along y and a drain 1006 extending mainly along y (FIG. 59A). The source and drain 1002, 1006 of the level n1 are connected to each other by two channels 1001 in the shape of wires extending along x. The source and drain 1002, 1006 of the level n2 are also connected to each other by two channels 1001 in the shape of wires extending along x (FIG. 59B).

The source and drain 1002, 1006 of the level n1 are separated from the source and drain 1002, 1006 of the level n2 by plugs 1004, also called horizontal spacers. These horizontal spacers are, for example, made of silicon nitride or silicon dioxide. They allow to insulate the source and drain 1002, 1006 of given level nz, for example n1, from lower levels nz+1, for example n2, and/or from higher levels nz−1.

The gate-all-around 250 completely surrounds the channels 1001 and here has a first side 2501 flush with sources 1002 and horizontal spacers 1004, and a second side 2502 flush with drains 1006 and horizontal spacers 1004 (FIG. 59C). According to one possibility, a first fine gate oxide can be interposed between the horizontal spacers 1004 and the first side 2501 and/or the second side 2502 (not illustrated). The first side 2501 of the gate-all-around 250 is preferably directly in contact with the sources 1002. The second side 2502 of the gate-all-around 250 is preferably directly in contact with the drains 1006.

Figure 60:
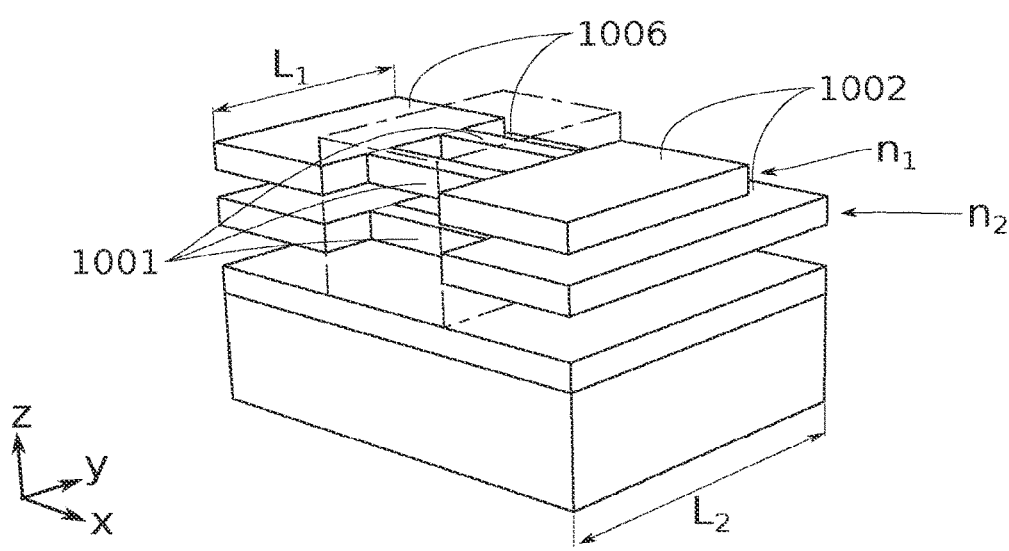
FIG. 60 schematically illustrates an architecture of a microelectronic device based on GAA transistors according to another embodiment of the present invention.

According to an example illustrated in FIG. 60, the source(s) 1002 of a level nz, for example n1, can each have a length along y, for example L1, different from the lengths along y, for example L2, of the source(s) 1002 of another level nz, for example n2. Similarly, the drain(s) 1006 of a level nz, for example n1, can each have a length along y, for example L1, different from the lengths along y, for example L2, of the drain(s) 1006 of another level nz, for example n2. This allows to facilitate the resumption of electrical contacts on different sources and/or different drains of different levels. This allows, for example, to form stepped contacts on the various sources and/or drains.

Figure 61A:
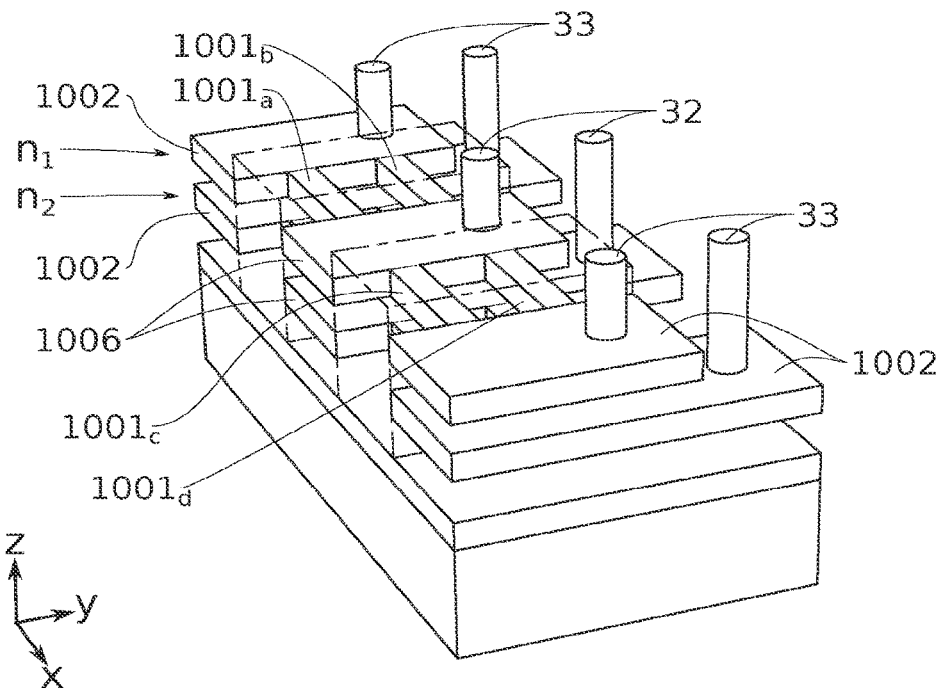
FIGS. 61A and 61B schematically illustrate an architecture of a system based on GAA transistors according to one embodiment of the present invention.
Figure 61B:
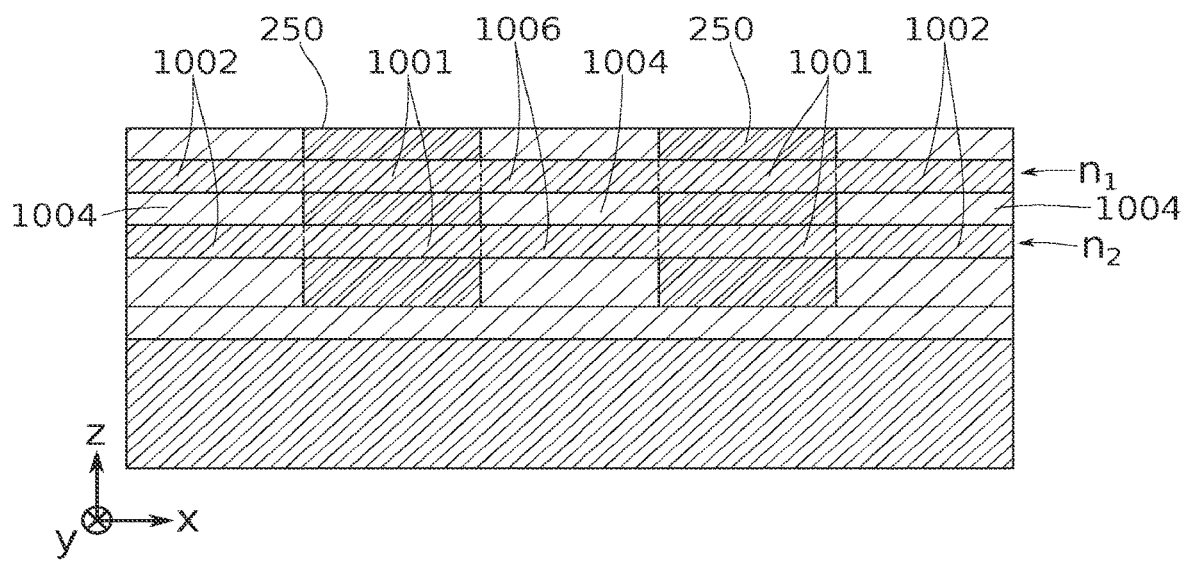

According to an example illustrated in FIGS. 61A, 61B, stepped contacts 33 are formed at one end of the sources 1002. The sources 1002 can be common to several transistors of the same level nz. According to this example, stepped contacts 32 are formed at one end of the drains 1006. The drains 1006 can be common to several transistors of the same level nz. In this example, the drain 1006 of the level n1 is connected to four channels 1001a, 1001b, 1001c, 1001d belonging respectively to four separate transistors of the level n1. This allows to densify the number of transistors on the same level nz. A compact array of GAA transistors is thus advantageously formed. FIG. 61B illustrates in section the system of FIG. 61A. The sources 1002 and drain 1006 of the level n1 are insulated from the sources 1002 and from the drain 1006 of the level n2 by the horizontal spacers 1004.

Figure 62A:
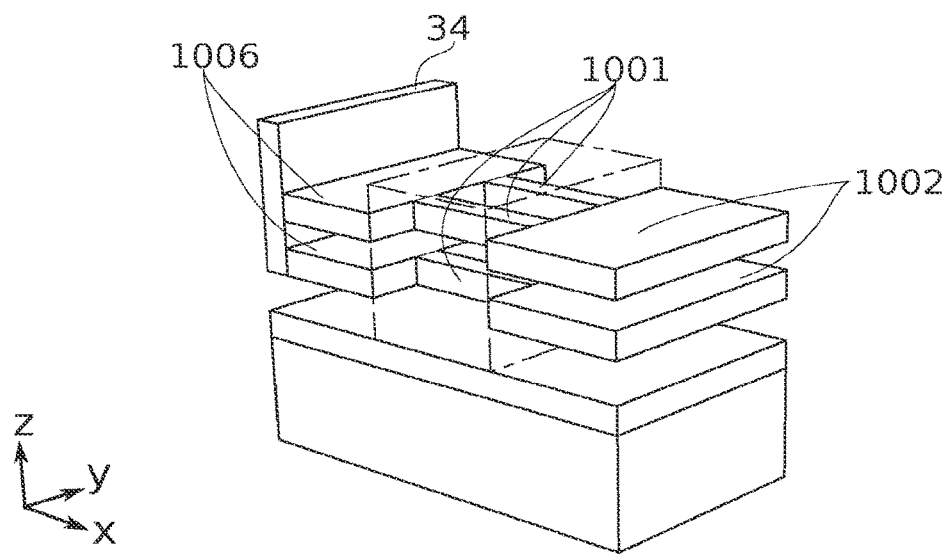
FIGS. 62A and 62B schematically illustrate an architecture of a microelectronic device based on GAA transistors according to another embodiment of the present invention.
Figure 62B:
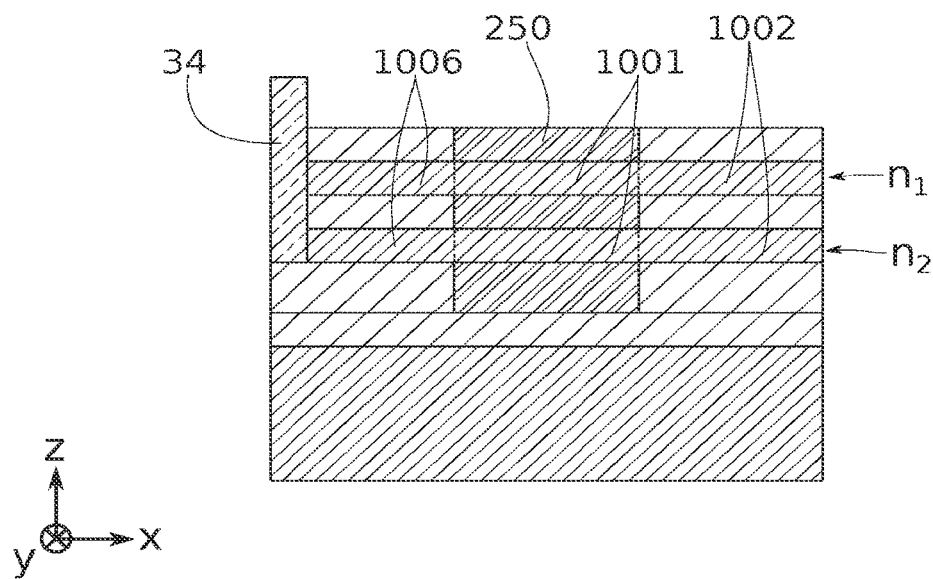

According to another example illustrated in FIGS. 62A and 62B, a contact 34 can extend on a sidewall of the drains 1006 and/or the sources 1002 (not illustrated) of different levels nz, so as to electrically connect said drains 1006 and/or sources 1002 in common.

Figure 63:
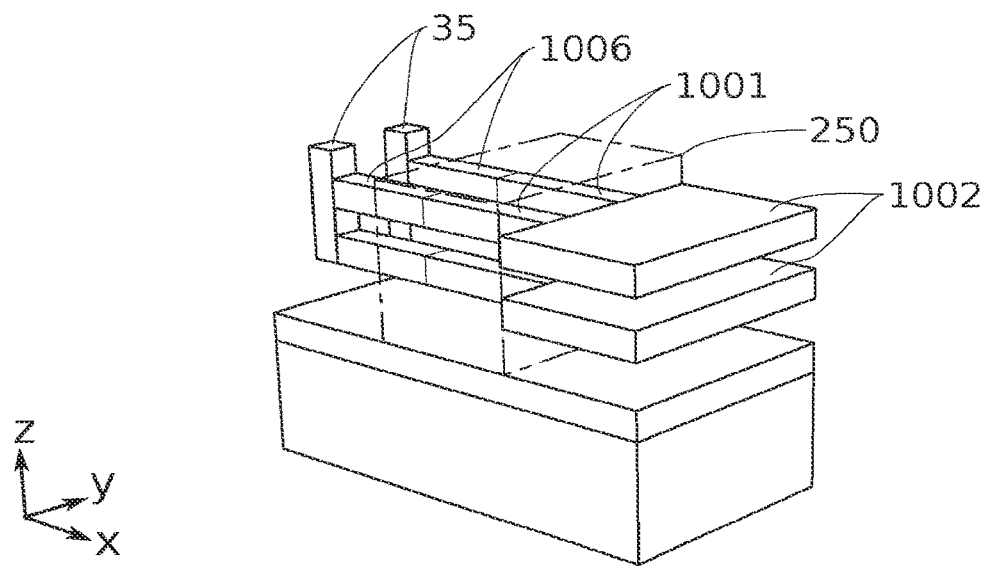
FIG. 63 schematically illustrates an architecture of a microelectronic device based on GAA transistors according to another embodiment of the present invention.

According to another example illustrated in FIG. 63, the drains 1006 extend in the shape of wires along x, in the continuation of the channels 1001. In this case, vertical contacts in the shape of through vias 35 may extend over a sidewall of said drains 1006 in the shape of wires, along different levels nz. This allows at least part of the drains 1006 to be contacted separately in the shape of wires.

Figure 64:
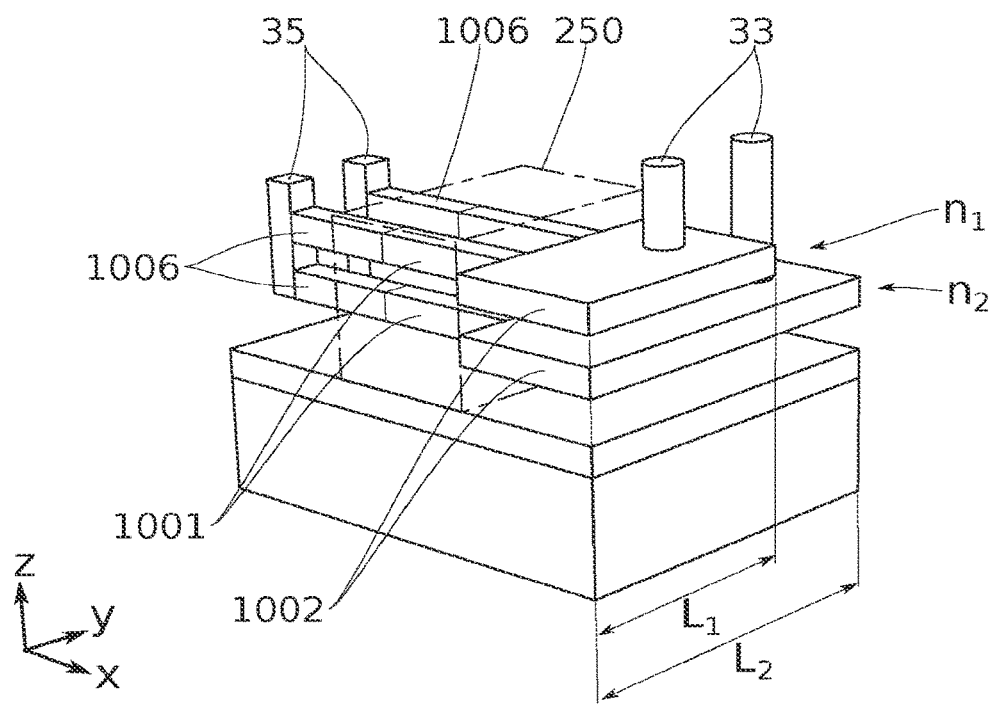
FIG. 64 schematically illustrates an architecture of a microelectronic device based on GAA transistors according to another embodiment of the present invention.

According to another example illustrated in FIG. 64, the drains 1006 extend in the shape of wires along x, as an extension of the channels 1001 and, as before, vertical contacts in the shape of through vias 35 extend over a sidewall of said drains 1006 in the shape of wires, along the different levels nz. In this example, the sources 1002 mainly extend along y and have different lengths for different levels nz. For example, the source 1002 of the level n1 has a length L1 less than the length L2 of the source 1002 of the level n2. This allows to contact the sources 1002 by stepped contacts 33. The different transistors of the different levels nz can thus be controlled independently of each other.

The features of the various embodiments of the microelectronic device and/or of the system described and illustrated through FIGS. 59A to 64 can be combined so as to other embodiments of the microelectronic device and/or of the system according to the invention.

In general, the invention is not limited to the embodiments described but extends to any embodiment falling within the scope of independent claims 1 and 11. In particular, the present invention covers methods for producing microelectronic devices not including memory cells. The drains and sources of the transistors can be interchanged, independently of each other.]

The invention claimed is:

1. A microelectronic system comprising a plurality of microelectronic devices, wherein each of the devices comprises at least two transistors each comprising a channel in the shape of a wire extending mainly in a first direction x, a gate surrounding said channel, a source and a drain associated with the channel, said transistors being stacked in a third direction z so that the channels of said transistors each occupy a level $n_z$ (z=1 ... 4) of given altitude in the third direction z, wherein, for each channel of level $n_z$ of given altitude, the source and the drain associated with said channel are located only at said level $n_z$, and the gate is bordered by longitudinal spacers, said longitudinal spacers extending on either side of the gate mainly in a second direction v normal to the first and third directions x, z, said longitudinal spacers covering an upper surface of the source and the drain of each transistor;

said devices are adjacent along a normal plane comprising the third direction z; and the sources and/or the drains of a level $n_z$ of given altitude of two adjacent devices are shared between said two adjacent devices.

2. The microelectronic device according to claim 1, wherein the sources of the transistors are separated from each other in the third direction z by at least one spacer and/or the drains of the transistors are separated from each other in the third direction z by at least one other spacer.

3. The microelectronic device according to claim 1, wherein the sources or the drains of different levels $n_z$ are electrically contacted with each other by at least one common contact extending in the third direction z, at the border of said sources or drains.

4. The microelectronic device according to claim 1, wherein the sources and/or the drains of different levels $n_z$ are electrically contacted independently of each other by stepped contacts.

5. The microelectronic system according to claim 1, wherein the sources and/or the drains of a level $n_z$ of given altitude are separated from the sources and/or drains of a level $n_z-1$ and/or a level $n_z+1$ by at least one spacer.

6. The microelectronic system according to claim 1, wherein the sources and/or the drains of a level $n_z$ of given altitude extend mainly in the second direction y, and are electrically contacted to the sources and/or to the drains of another level $n_z$ by a common contact located at one end along said second direction y.

7. The microelectronic system according to claim 1, wherein said longitudinal spacers are formed directly over the source and the drain of each transistor.

* * * * *